(12) United States Patent
Lipton et al.

(10) Patent No.: US 8,842,355 B2
(45) Date of Patent: Sep. 23, 2014

(54) LENS SHUTTER AND APERTURE CONTROL DEVICES

(75) Inventors: Michael Gabriel Lipton, Aptos, CA (US); Ilya Polyakov, San Francisco, CA (US); Jonathan R. Heim, Pacifica, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 1692 days.

(21) Appl. No.: 11/953,789

(22) Filed: Dec. 10, 2007

(65) Prior Publication Data

US 2009/0147340 A1    Jun. 11, 2009

(51) Int. Cl.
*G02B 26/02* (2006.01)
*G03B 9/06* (2006.01)
*G02B 7/08* (2006.01)

(52) U.S. Cl.
CPC ... *G02B 7/08* (2013.01); *G03B 9/06* (2013.01)
USPC .......................................... 359/233

(58) Field of Classification Search
USPC ................................................. 359/233–236
See application file for complete search history.

(56) References Cited

U.S. PATENT DOCUMENTS

2004/0218246 A1* 11/2004 Onuki et al. .................. 359/234

OTHER PUBLICATIONS

Chang Liu & Y. Bar-Cohen, Scaling Law of Microactuators and Potential Applications of Electroactive Polymers in MEMS, SPIE Conference on Electroactive Polymer Actuators and Devices, Newport Beach, CA, Mar. 1999.*

* cited by examiner

*Primary Examiner* — Jennifer L. Doak
(74) *Attorney, Agent, or Firm* — K&L Gates LLP

(57) ABSTRACT

The present invention provides optical systems, devices and methods which utilize one or more electroactive polymer actuators to provide shutter and/or aperture control.

6 Claims, 39 Drawing Sheets

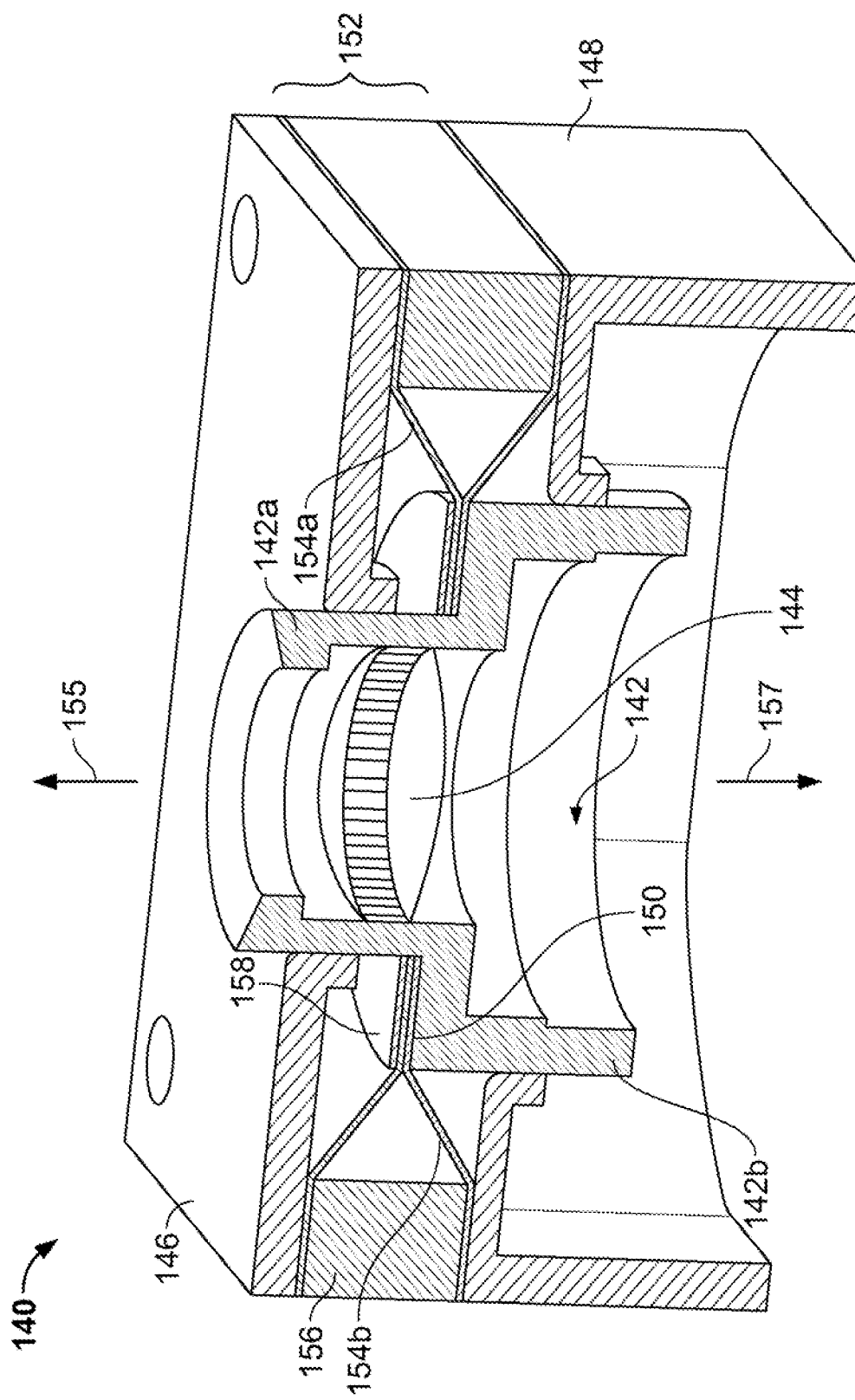

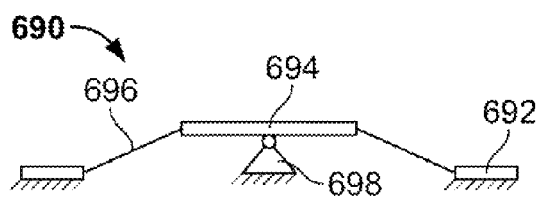
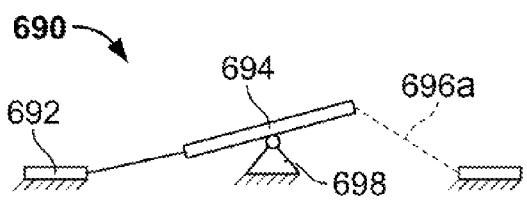
FIG. 26A　　　　　　　　　　FIG. 26B
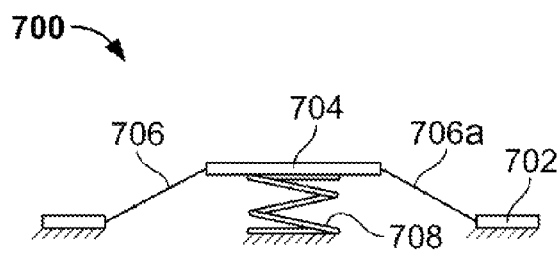
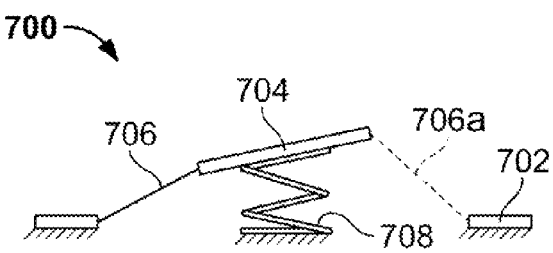
FIG. 27A　　　　　　　　　　FIG. 27B
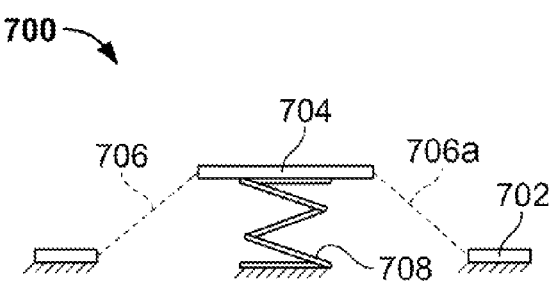
FIG. 27C

LENS SHUTTER AND APERTURE CONTROL DEVICES

FIELD OF THE INVENTION

The present invention relates to optical lens systems and, in particular, relates to such systems employing electroactive polymer transducers to adjust the lens to provide auto-focusing, zoom, image stabilization and/or shutter/aperture capabilities.

BACKGROUND

In conventional optical systems, such as in digital cameras, motors and solenoids are used as sources of power to displace gears and cams which act upon optical elements, e.g., lenses, to provide focusing, zoom, and image stabilization (also referred to as shake prevention). There are many disadvantages to such conventional systems—power consumption is high, response times are long, accuracy is limited and space requirements are high.

Advancements in miniaturized technologies have led to high-quality, highly-functioning, light-weight portable devices, and an ever-increasing consumer demand for even further improvements. An example of this is the development of cellular telephones to include a camera, often referred to as camera phones. While the majority of such camera phones employ an all-mechanical lens module having a small form factor lens, this approach does not offer variable or auto-focusing, zoom and image stabilization capabilities due to the significant number of moving parts required. For example, zoom capability requires a combination of lens elements, a motor, and a cam mechanism for transmitting the rotational movement of the motor to linear movement in order to adjust the relative positions of the lenses and an associated image sensor in order to obtain the desired magnification. In addition to the motor and cam mechanism, a plurality of reduction gears are is used to accurately control the relative positioning of the lenses.

Electromagnetic type actuators which include a coil generating a magnetic force where the magnet has a length longer than that of the coil in the optical axis direction (commonly referred to as "voice coils") are commonly employed to perform many of the auto-focus and zoom actuator functions within digital still cameras and, to some extent, in camera phones. This voice coil technology has been widely accepted as it enables small and lighter optical lens systems. However, a downside to lighter and smaller cameras, particularly those with capabilities for longer exposure times and having higher resolution sensors, is the greater effect that camera shake, due primarily to hand jitter, has on the quality of photographs, i.e., causing blurring. To compensate for camera shake, gyroscopes are often used for image stabilization. A gyroscope measures pitch and yaw, however, it is not capable of measuring roll, i.e., rotation about the axis defined by the lens barrel. Conventionally, two single-axis piezoelectric or quartz gyroscopes have been used with many external components to achieve the full-scale range of image stabilization. InvenSense, Inc. provides an integrated dual-axis gyroscope using MEMS technology for image stabilization which offers smaller sizing.

While variable focusing, zoom and image stabilization features are possible within a camera phone and other optical systems having a relatively small form factor, these features add substantially to the overall mass of these devices. Further, due to the necessity of an extensive number of moving components, power consumption is significantly high and manufacturing costs are increased.

Accordingly, it would be advantageous to provide an optical lens system which overcomes the limitations of the prior art. It would be particularly advantageous to provide such a system whereby the arrangement of and the mechanical interface between a lens and its actuator structure were highly integrated so as to reduce the form factor as much as possible. It would be greatly beneficial if such an optical system involved a minimal number of mechanical components, thereby reducing the complexity and fabrication costs of the system.

SUMMARY OF THE INVENTION

The present invention includes optical lens systems and devices and methods for using them. The systems and devices include one or more electroactive polymer-based (EAP) actuators integrated therein to adjust a parameter of the device/system. For example, the one or more EAP actuators may be configured to automatically adjust the focal length of the lens (auto-focusing), magnify the image being focused on by the lens (zoom), and/or adjust for any unwanted motion undergone by the lens system (image stabilization or shake prevention).

The one or more EAP actuators include one or more EAP transducers and one or more output members are integrated with one or more of a lens portion, a sensor portion and a shutter/aperture portion of the subject lens systems/devices. The lens portion (i.e., the lens stack or barrel) includes at least one lens. In certain embodiments, the lens portion typically includes a focusing lens component as well as an afocal lens component. The sensor portion includes an image sensor which receives the image from the lens portion of the device for digital processing by image processing electronics. Activation of the EAP actuators(s), i.e., by the application of a voltage to the EAP transducer, adjusts the relative position of a lens and/or sensor component to effect or modify an optical parameter of the lens system.

In one variation, an actuator assembly (including at least one EAP actuator) may be used to adjust the position of a portion of the lens stack along its longitudinal axis (Z-axis) relative to the sensor portion in order to change the focal length of the lens stack. In another variation, the same or different actuator may be used to adjust the position of one or more lenses within the stack relative to each other along the longitudinal axis (Z-axis) to adjust the magnification of the lens system. Still yet, in another variation, an actuator may be used to move the sensor portion of the system portion within a planar direction (X-axis and/or Y-axis) relative to the lens portion, or visa-versa, in order to compensate for unwanted motion imposed on the system, i.e., to stabilize the image imposed on the image sensor. Other features of the present invention include the use of an EAP actuator to control the aperture size of a lens system and/or control the opening and closing of a shutter mechanism. An EAP actuator may provide only a single function (e.g., shutter control or image stabilization) or a combination of functions (e.g., auto-focus and zoom).

The present invention also includes methods for using the subject devices and systems to focus and/or magnify an image, or to cancel out unwanted movement of the devices/systems. Other methods include methods of fabricating the subject devices and systems.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings, where variation of the invention from that shown in the figures is contemplated. To facilitate understanding of the invention description, the same reference numerals have been used (where practical) to designate similar elements that are common to the drawings. Included in the drawings are the following figures:

FIG. 3 is a sectional perspective view of another optical lens system of the present invention employing another type of electroactive polymer actuator for focus control;

FIGS. 26A and 26B are cross-sectional views of inactive and active states of lens image stabilization system of the present invention;

FIGS. 27A-27C are cross-sectional views of another lens image stabilization system of the present invention in various activation states;

DETAILED DESCRIPTION OF THE INVENTION

Before the devices, systems and methods of the present invention are described, it is to be understood that this invention is not limited to a particular form fit or applications as such may vary. Thus, while the present invention is primarily described in the context of a variable focus camera lens, the subject optical systems may be used in microscopes, binoculars, telescopes, camcorders, projectors, eyeglasses as well as other types of optical applications. It is also to be understood that the terminology used herein is for the purpose of describing particular embodiments only, and is not intended to be limiting, since the scope of the present invention will be limited only by the appended claims.

Figure 1A:
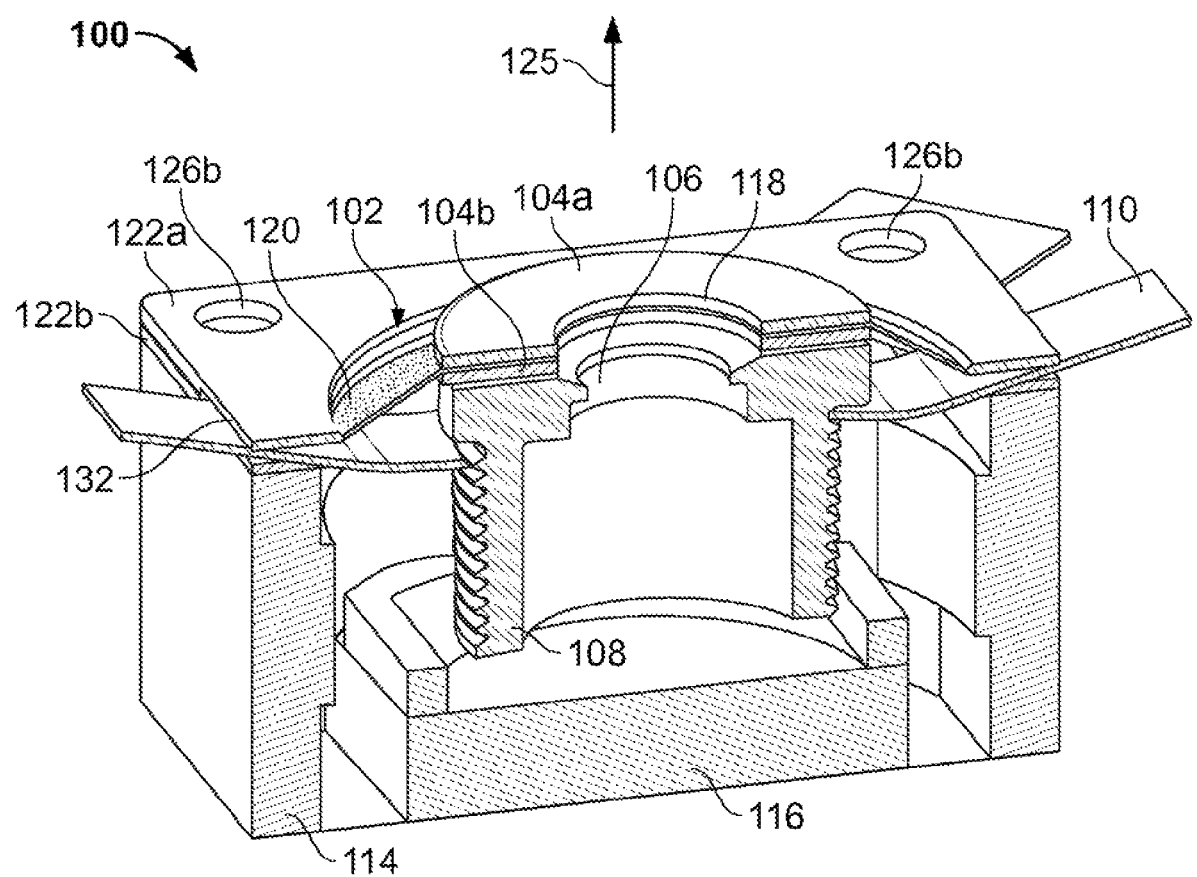
FIGS. 1A and 1B are a sectional perspective and exploded assembly views, respectively, of an optical lens system of the present invention employing an electroactive polymer actuator configured to provide auto-focusing.
Figure 1B:
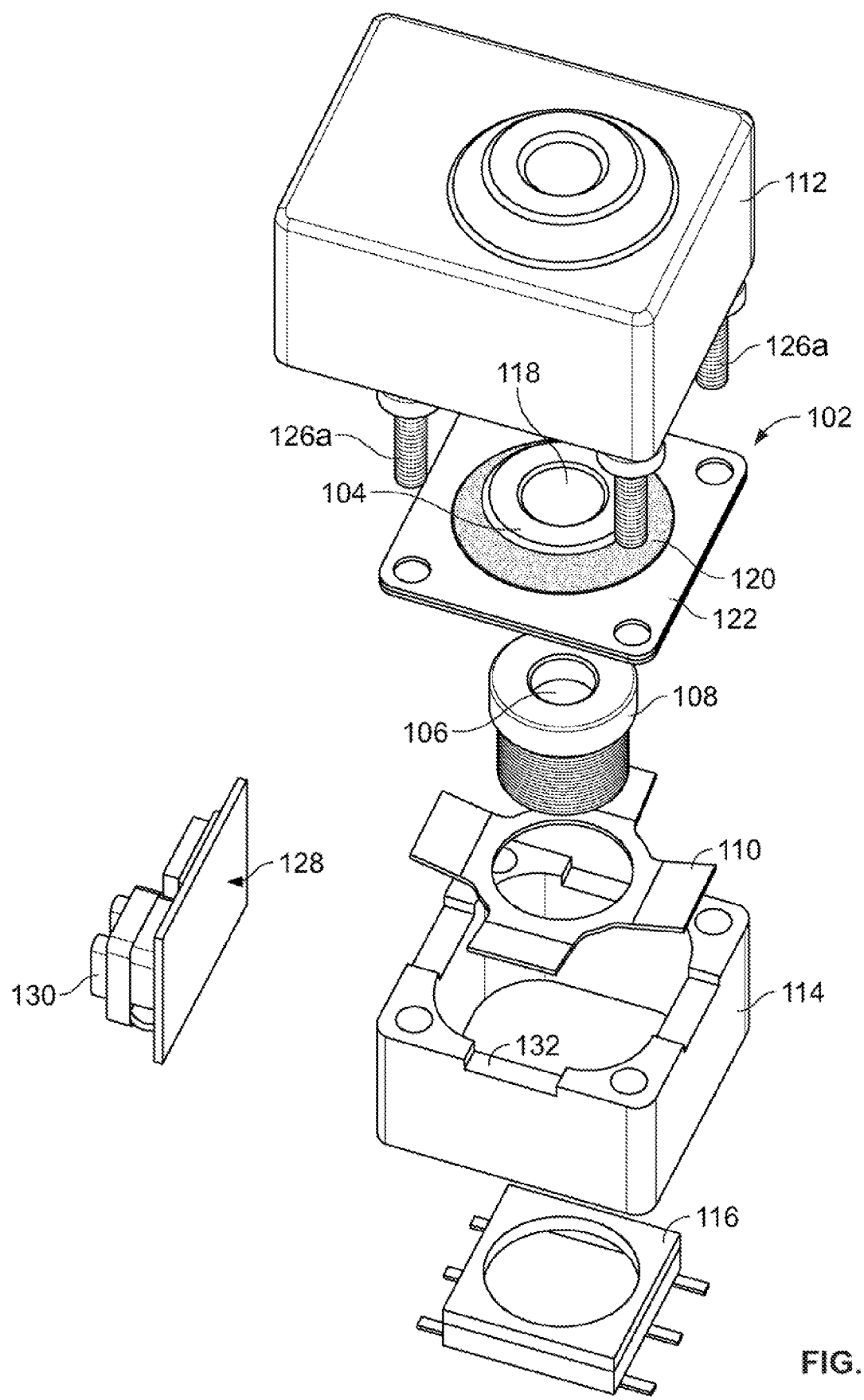

Referring now to the drawings, FIGS. 1A and 1B illustrate an optical lens system of the present invention having auto-focus capabilities. The figures detail a lens module 100 having a lens barrel 108 holding one or more lenses (not shown). An aperture 106 is provided at a distal or front end of lens barrel 108. Positioned distally of aperture 106 is an electroactive polymer (EAP) actuator 102 having an electroactive polymer film 120. Film 120 sandwiched about its periphery by frame sides 122*a*, 122*b* and centrally by disc sides 104*a*, 104*b*, leaving an exposed annular section of film 120. The structure and function of the electroactive films are now discussed in greater detail with reference to FIGS. 2A and 2B.

Figure 2A:
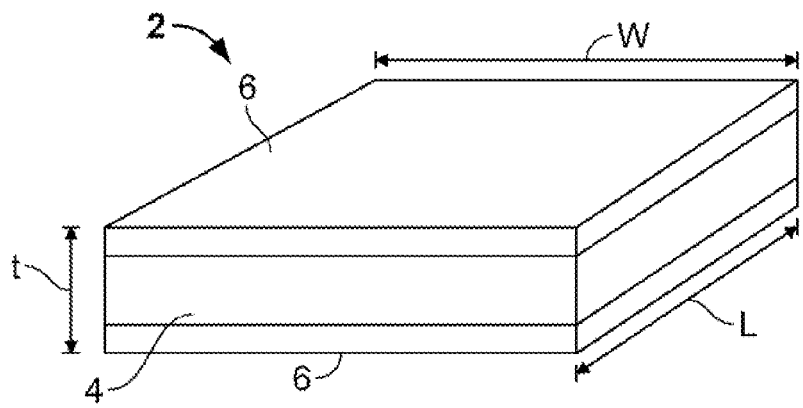
FIGS. 2A and 2B provide schematic illustrations of an electroactive polymer film for use with the optical systems of the present invention before and after application of a voltage.
Figure 2B:
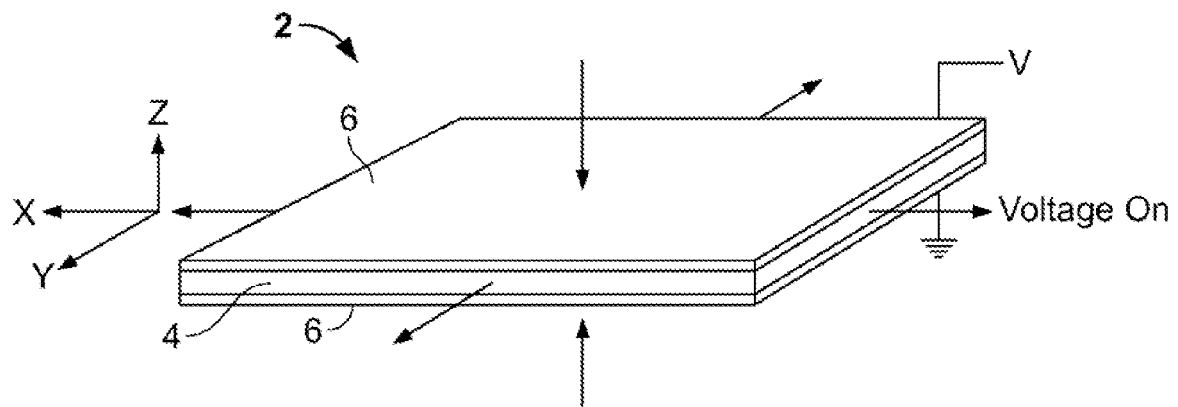

As illustrated in the schematic drawings of FIGS. 2A and 2B, electroactive film 2 comprises a composite of materials which includes a thin polymeric dielectric layer 4 sandwiched between compliant electrode plates or layers 6, thereby forming a capacitive structure. As seen in FIG. 2B, when a voltage is applied across the electrodes, the unlike charges in the two electrodes 6 are attracted to each other and these electrostatic attractive forces compress the dielectric layer 4 (along the Z-axis). Additionally, the repulsive forces between like charges in each electrode tend to stretch the dielectric in plane (along the X- and Y-axes), thereby reducing the thickness of the film. The dielectric layer 4 is thereby caused to deflect with a change in electric field. As electrodes 6 are compliant, they change shape with dielectric layer 4. Generally speaking, deflection refers to any displacement, expansion, contraction, torsion, linear or area strain, or any other deformation of a portion of dielectric layer 4. Depending on the form fit architecture, e.g., the frame in which capacitive structure is employed, this deflection maybe used to produce mechanical work. The electroactive film 2 may be pre-strained within the frame to improve conversion between electrical and mechanical energy, i.e., the pre-strain allows the film to deflect more and provide greater mechanical work.

With a voltage applied, the electroactive film 2 continues to deflect until mechanical forces balance the electrostatic forces driving the deflection. The mechanical forces include elastic restoring forces of the dielectric layer 4, the compliance of the electrodes 6 and any external resistance provided by a device and/or load coupled to film 2. The resultant deflection of the film as a result of the applied voltage may also depend on a number of other factors such as the dielectric constant of the elastomeric material and its size and stiffness. Removal of the voltage difference and the induced charge causes the reverse effects, with a return to the inactive state as illustrated in FIG. 2A.

The length L and width W of electroactive polymer film 2 are much greater than its thickness t. Typically, the dielectric layer 4 has a thickness in range from about 1 µm to about 100 µm and is likely thicker than each of the electrodes. It is desirable to select the elastic modulus and thickness of electrodes 6 such that the additional stiffness they contribute to the actuator is generally less than the stiffness of the dielectric layer, which has a relatively low modulus of elasticity, i.e., less than about 100 MPa.

Classes of electroactive polymer materials suitable for use with the subject optical systems include but are not limited to dielectric elastomers, electrostrictive polymers, electronic electroactive polymers, and ionic electroactive polymers, and some copolymers. Suitable dielectric materials include but are not limited to silicone, acrylic, polyurethane, flourosilicone, etc. Electrostrictive polymers are characterized by the non-linear reaction of electroactive polymers. Electronic electroactive polymers typically change shape or dimensions due to migration of electrons in response to electric field (usually dry). Ionic electroactive polymers are polymers that change shape or dimensions due to migration of ions in response to electric field (usually wet and contains electrolyte). Suitable electrode materials include carbon, gold, platinum, aluminum, etc. Suitable films and materials for use with the diaphragm cartridges of the present invention are disclosed in the following U.S. Pat. Nos. 6,376,971, 6,583,533, 6,664,718, which are herein incorporated by reference.

Figure 7A:
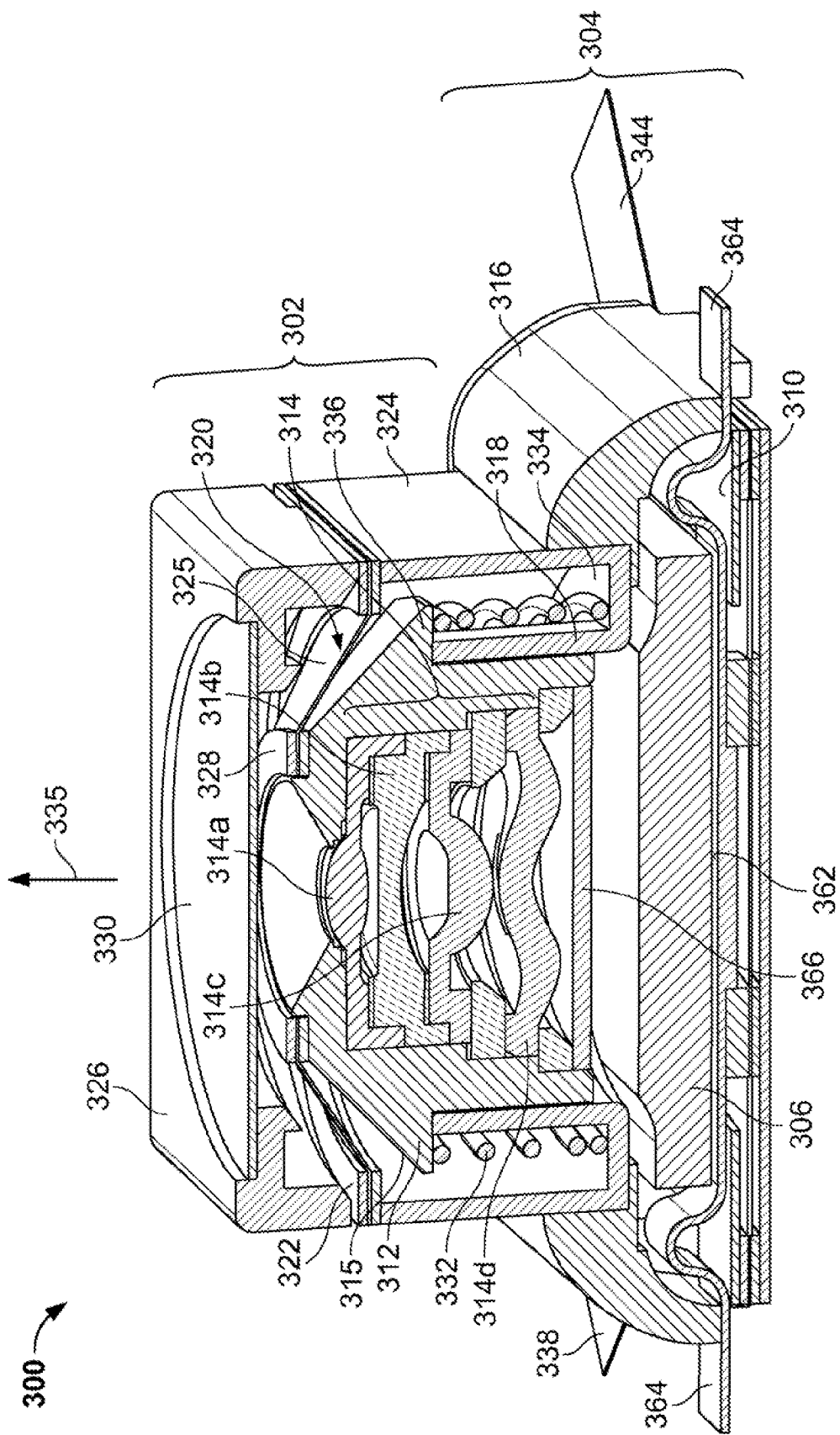
FIGS. 7A and 7B are sectional perspective and exploded assembly views, respectively, of another optical lens system of the present invention configured to provide auto-focusing and image stabilization capabilities.

With reference again to FIGS. 1A and 1B, the operative engagement of EAP actuator 102 with lens barrel and stack 108 enables auto-focusing of the lens assembly. Frame 122 is affixed to a distal end of a housing 114 by means of bolts 126*a* which are received in holes 126*b*, while disc or cap portion 104 of the EAP actuator 102 is positioned or mounted against the distal end of lens barrel 108, whereby an aperture 118 within cap 104 is axially aligned with aperture 106 to allow for the passage of light to the lens assembly. A biasing member in the form of leaf spring mechanism 110 is operatively engaged between lens barrel 108 and frame 122 to pre-load or bias disc 104 in the direction of arrow 125 to provide a frustum-shaped architecture. Such frustum-type actuators are described in detail in U.S. patent application Ser. Nos. 11/085,798, 11/085,804 and 11/618,577, each incorporated by reference in its entirety. Pre-loading or biasing insures that actuator 102 actuates in the desired direction rather than simply wrinkle upon electrode activation. With the illustrated leaf spring mechanism 110, housing 114 may be provide with wall recesses 132 or the like to accommodate and operatively position one or more leaf springs relative to the actuator 102. Other biasing means such as simple positive rate springs (e.g., coil spring) as shown in FIG. 7A may alternatively be used.

On the proximal or back side of lens assembly or stack 108 is an image sensor/detector 116 (such as a charge-couple device (CCD)) which receives the image for digital processing by control electronics 128 (shown in FIG. 1B only). The focal length of lens stack 108 is adjustable by the selective actuation of EAP actuator 102 (where the axial position of one or more lenses is adjusted relative to the other lenses). Sensor 116 as well as actuator 102 may be powered via electrical coupling to power supply 130.

As shown in FIG. 1B, a completed camera assembly will include at least a shroud or cover 112. Other components, such an infrared (IR) filter (not shown), commonly used with conventional lens systems, may also be operatively incorporated into system 100.

FIG. 3 illustrates another lens module 140 of the present invention. Cylindrically-shaped lens barrel 142, having one or more lenses 144, is movably held within outer and inner housing members 146, 148 with a distal portion 142a slidably positioned through an opening in outer housing 146 and a proximal portion 142b slidably positioned through an opening in inner housing 148. The juncture between distal and proximal barrel portions 142a, 142b defines an annular shoulder 150 to which an annular inner frame member 158 of EAP actuator 152 is mounted. Actuator 152 has a double-frustum architecture with each frustum defined by a film 154a, 154b held in a stretched condition between inner frame member 158, with the peripheral portion of distal film 154a held between outer housing 146 and frame block or spacer 156, and a peripheral portion of proximal film 154b held between inner housing 148 and frame block 156. Instead of being biased by a leaf spring mechanism, the distal film 154a of the double frustum structure provides the preload for actuator 152 in the direction of arrow 155, thereby moving lens barrel 142 in the same direction to adjust the focal lens 144. While the unbiased film 154b is an EAP film, the biased film 154a need not be, and may simply be an elastomeric webbing. Should film 154a comprise an electroactive polymer material, however, it may be employed for sensing position by capacitance change or may, collectively with film 154b, provide a two-phase actuator. In the latter case, when film 154b is activated, it causes lens barrel 142 to move in the direction of arrow 157, thereby adjusting the focal length of lens 144 in the opposite direction.

Figure 4A:
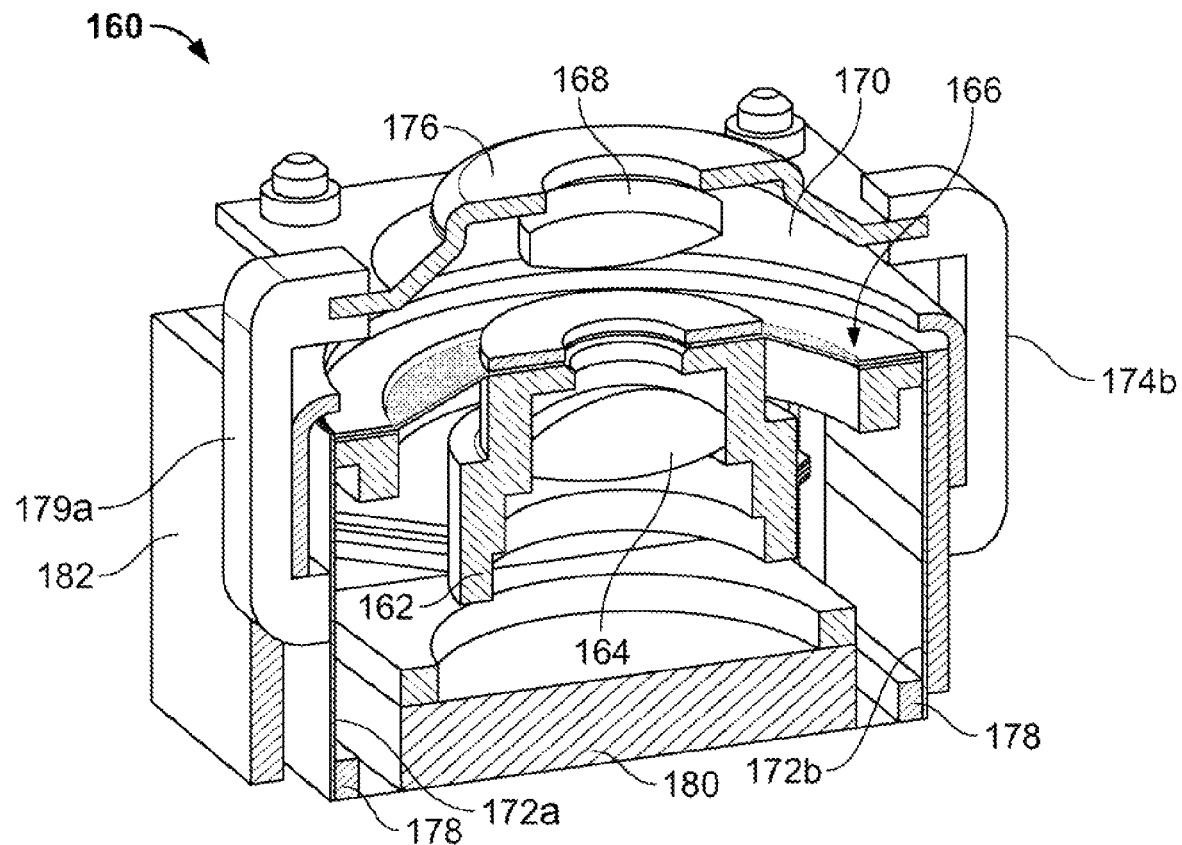
FIGS. 4A and 4B are sectional perspective and exploded assembly views, respectively, of another optical lens system employing an actuator combination to control each of zoom and auto-focus.
Figure 4B:
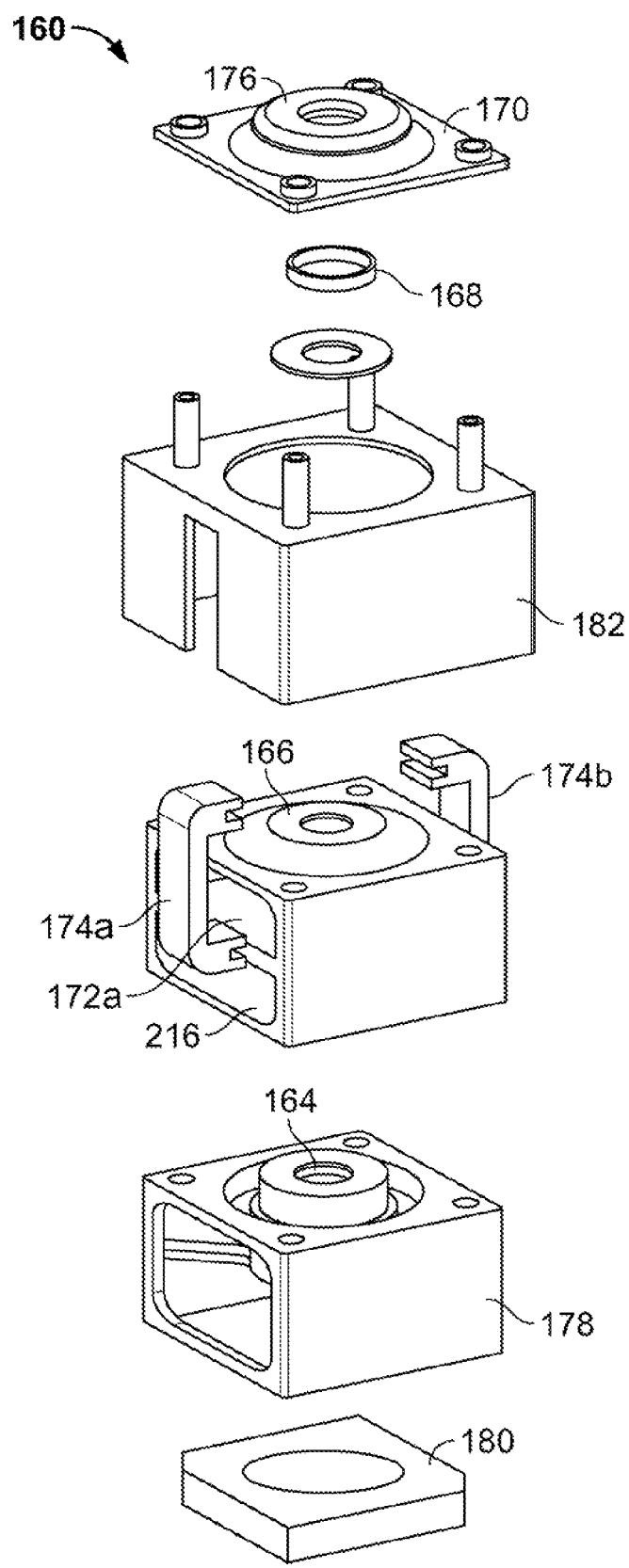

In another variation of the invention, FIGS. 4A and 4B show an optical system 160 employing an actuator combination to control each of focus and zoom. The system has a focus stage housed within housing 182 and includes focusing lens 164 held within lens barrel 162 and driven by a diaphragm actuator 166. Focusing is adjusted by varying the distance between lens 164 and image sensor 180 in a manner similar to that described with respect to FIGS. 1A and 1B. System 160 also provides a zoom stage which includes a zoom lens 168 held within lens fixture 170 and under lens cover 176 which is mechanically coupled to a pair of planar actuators 172a, 172b by way of armatures 174a, 174b, respectively. Each of these actuators 172a, 172b is formed by stretching EAP film over or upon a common frame element 178 affixed to the armatures. Zoom function is accomplished by varying the distance between lens 164 and lens 168. Generally focus adjustment requires between about 0.1 and 2.0 mm of movement; while zoom often requires about 5 to 10 times that amount of stroke. Though not shown, it also is contemplated that multiple faces of a combined frame may carry diaphragm actuators alone or planar actuators alone. Still further, non-orthogonal frame geometry may be employed.

Figure 5A:
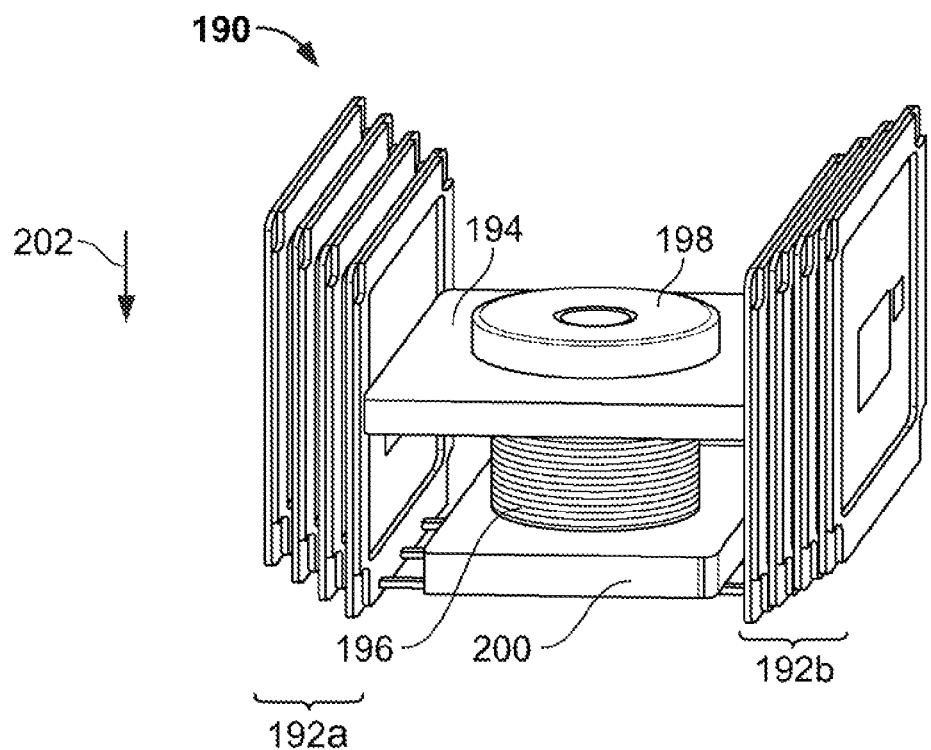
FIGS. 5A and 5B are perspective views showing an alternative means of controlling zoom.
Figure 5B:
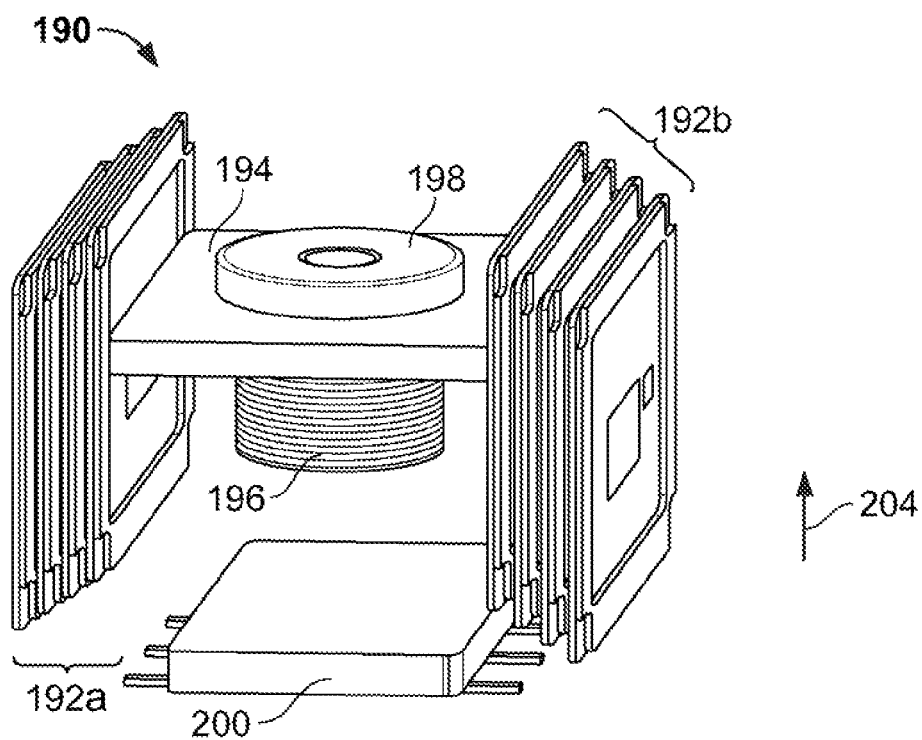

In cases where there is more available space, it may be desirable to provide an EPAM zoom/focus engine suitable for longer zoom travel to increase the operating range of the device. FIGS. 5A and 5B are perspective views showing an alternative lens system 190 in which a telescopic arrangement of paired sets of planar actuators 192a, 192b, where one of each pair is positioned on opposite sides of a lens carriage 194 which is fixed to lens barrel 196 which carries zoom lens 198. When actuated, the planar actuator arrangement translates lens barrel 196 and zoom lens 198 along the focal axis relative to an image sensor 200 in the directions of arrows 202 and 204, where FIGS. 5A and 5B show minimum and maximum zoom positions, respectively.

Figure 6C:
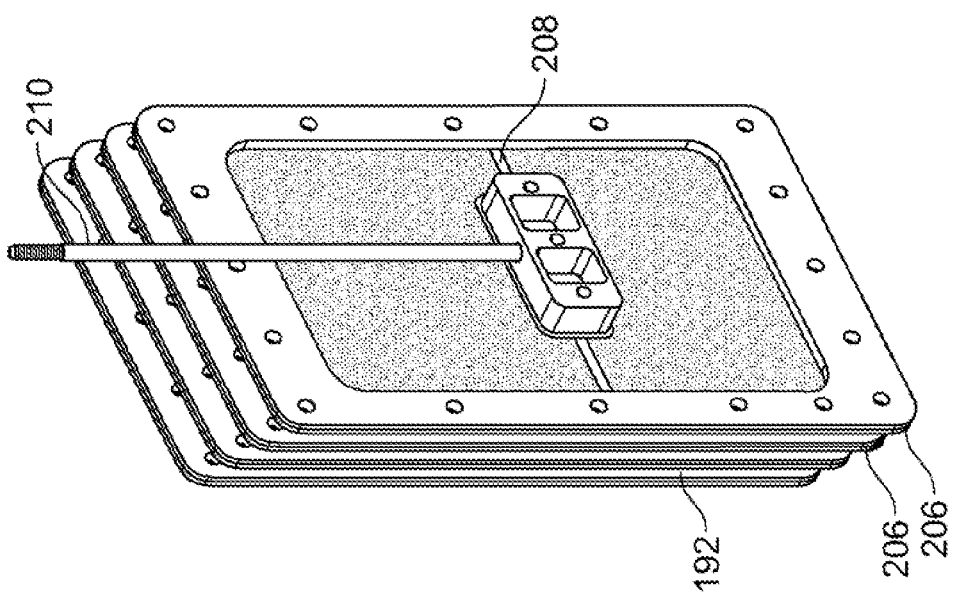
FIGS. 6A-6C are perspective views showing progressive stages of actuation of the transducer arrangement in FIGS. 5A and 5B.
Figure 6B:
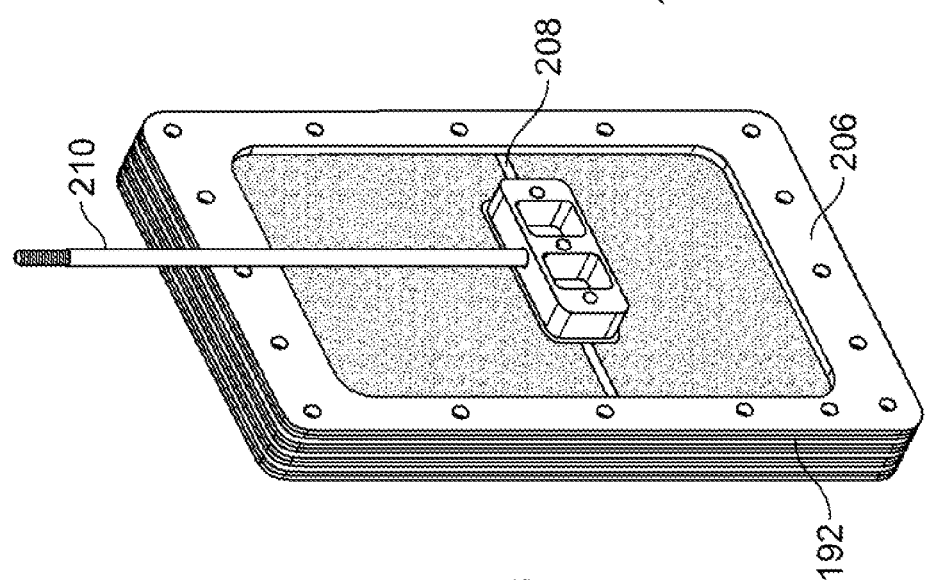
Figure 6A:
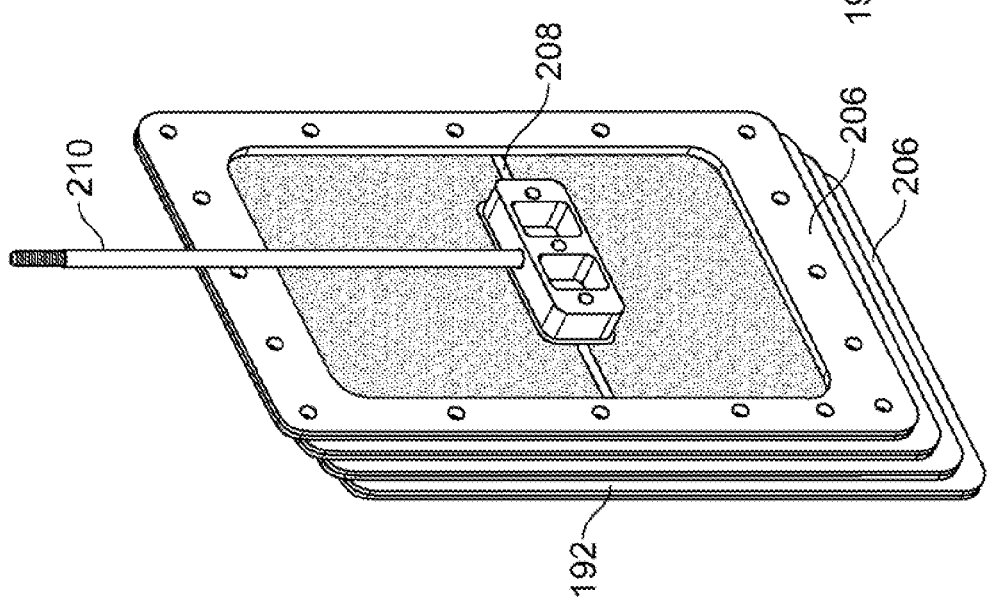

The manner in which the actuators are connected and operate is clarified by the enlarged section views of FIGS. 6A-6C which illustrate various actuation stages of an actuator stack of FIGS. 5A and 5B. The progressive motion is achieve by connection of successive output bars 208 to actuator frame sections 206 with the innermost output bar attached to a rod 210 to drive zoom components.

Figure 7B:
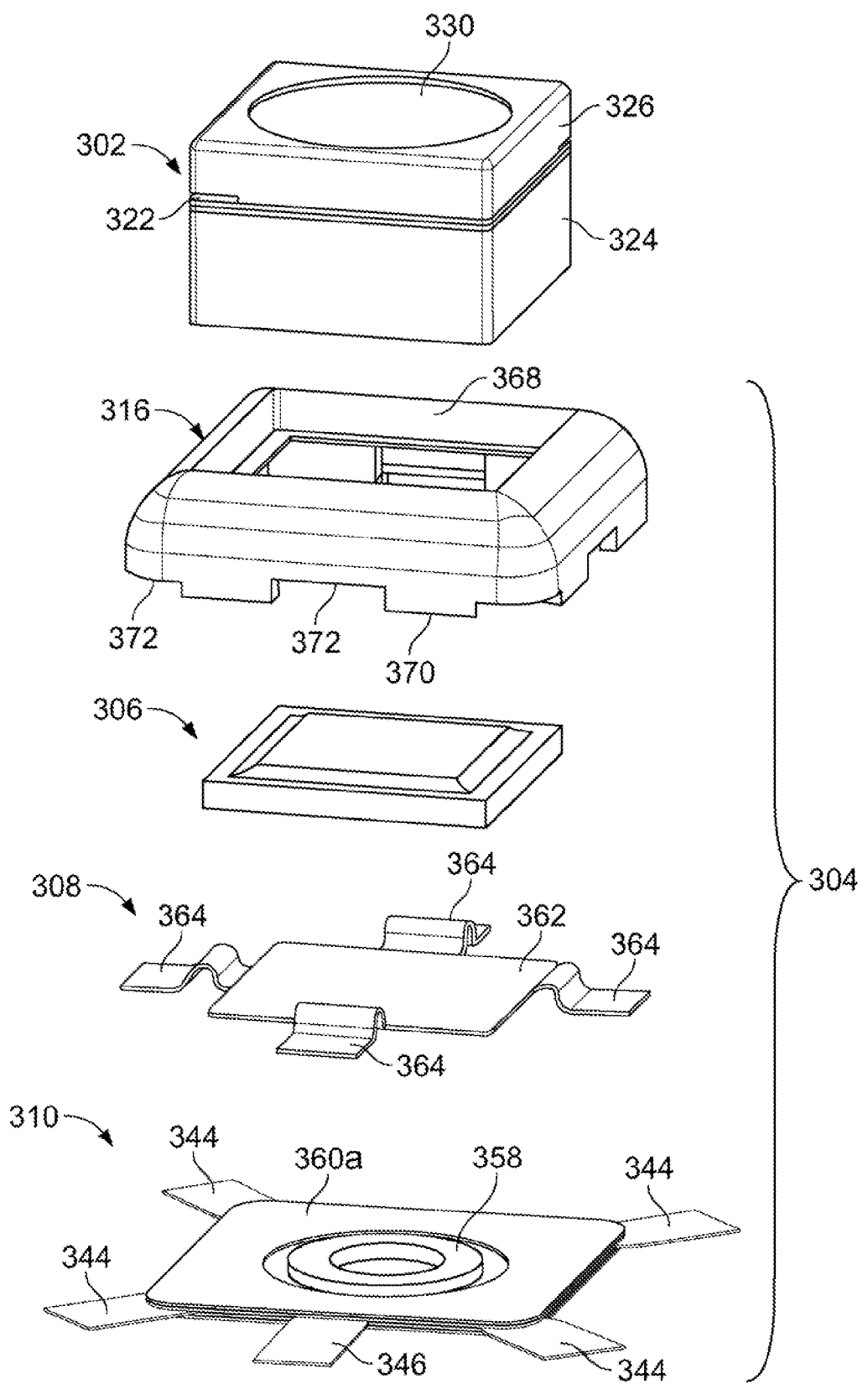

Turning now to FIGS. 7A and 7B, there is shown another optical lens system 300 of the present invention which provides image stabilization capabilities in addition to auto-focusing. Lens module 302 includes a lens barrel 312 which holds one or more lenses and, here, is shown to have four lenses 314a, 314b, 314c and 314d, but fewer or more lenses may be employed. Lens assembly 314 is displaced by an EAP actuator 320 having an EAP film 325 extending between an outer frame 322 and an inner disc or cap member 328. Outer frame 322 is fixed between bottom housing 324 and top housing 326. A biasing member in the form of coil spring 332 is positioned about lens barrel 312 and operatively engaged between the back end 334 of bottom housing 324 and a shoulder or flange 336 of lens barrel 312, thereby pre-loading or biasing cap or disc 328 in the direction of arrow 335 to provide a frustum-shape to EAP actuator 320.

Figure 11A:
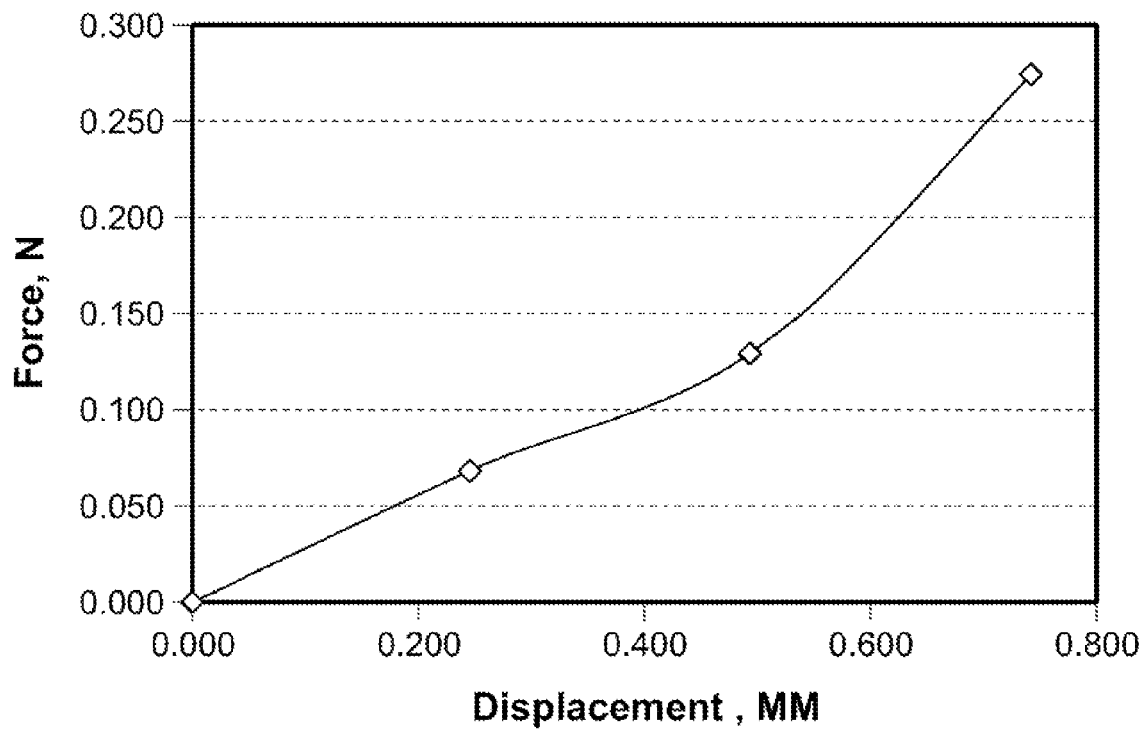
FIGS. 11A and 11B show the passive stiffness and load response, respectively, of the lens system of FIGS. 7A and 7B.
Figure 11B:
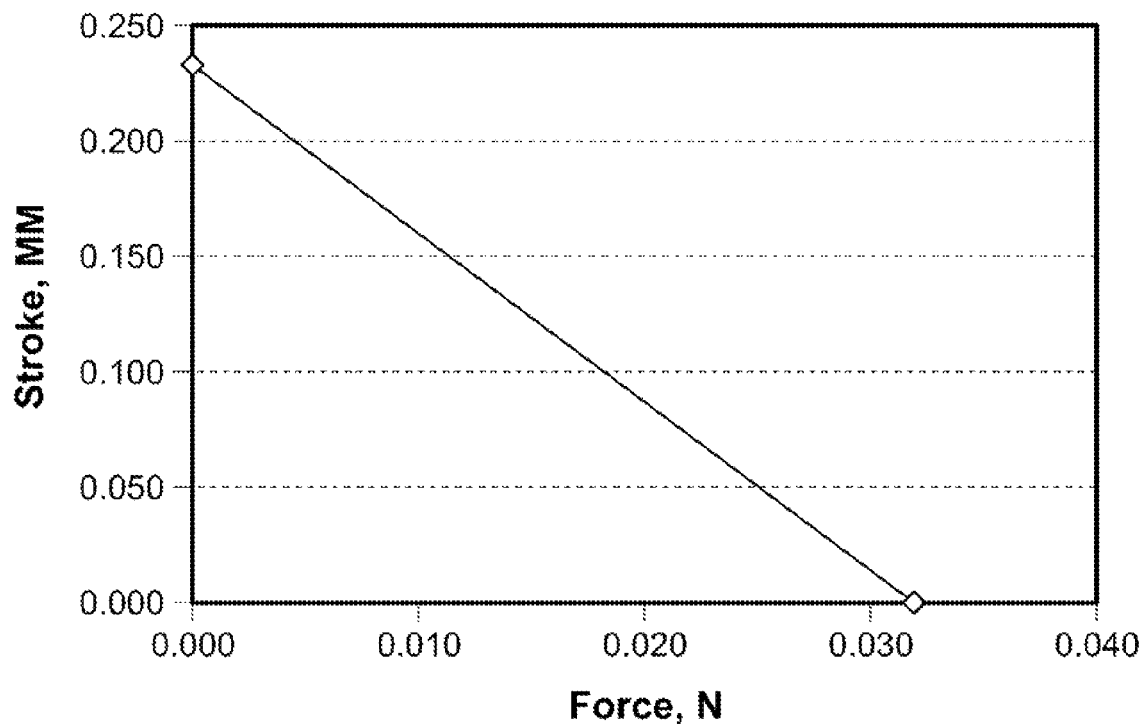

The radial rigidity of the actuator's disc member 328 and the counter-force/bias (opposite that of arrow 335) imposed on the distal end of lens barrel 312 assist in maintaining the concentricity of the barrel within the lens module 302. Moreover, the overall structure of the biased EAP actuator effectively suspends the lens barrel, making it unaffected by gravity, as evidenced by the graph of FIG. 11A which shows the passive stiffness of such a lens positioning system. FIG. 11B, on the other hand, illustrates the normal load response of the system after initiation of travel from the hard stop position.

A bushing wall 318 extends upward from the back end 334 of housing 324 and is seated between coil spring 332 and the outer surface of lens barrel 312. Bushing 318 acts as a linear guide for lens barrel 312 and, together with flange 336, provides a travel stop at a maximum "macro" (near) focus position. Having a built-in travel or hard stop is also useful upon initial calibration of the barrel's position during manufacturing assembly of system 300. The rigidity of bushing wall 318 also provides added crush protection to the lens assembly during normal use. Additionally, the overall structure of the EAP actuator 320 provides some shock absorbency for the lens barrel. Collectively, the EAP actuator, the bias spring, the bushing and the overall barrel design provide a uniform radial alignment for optimal performance of the lens system.

Figure 12A:
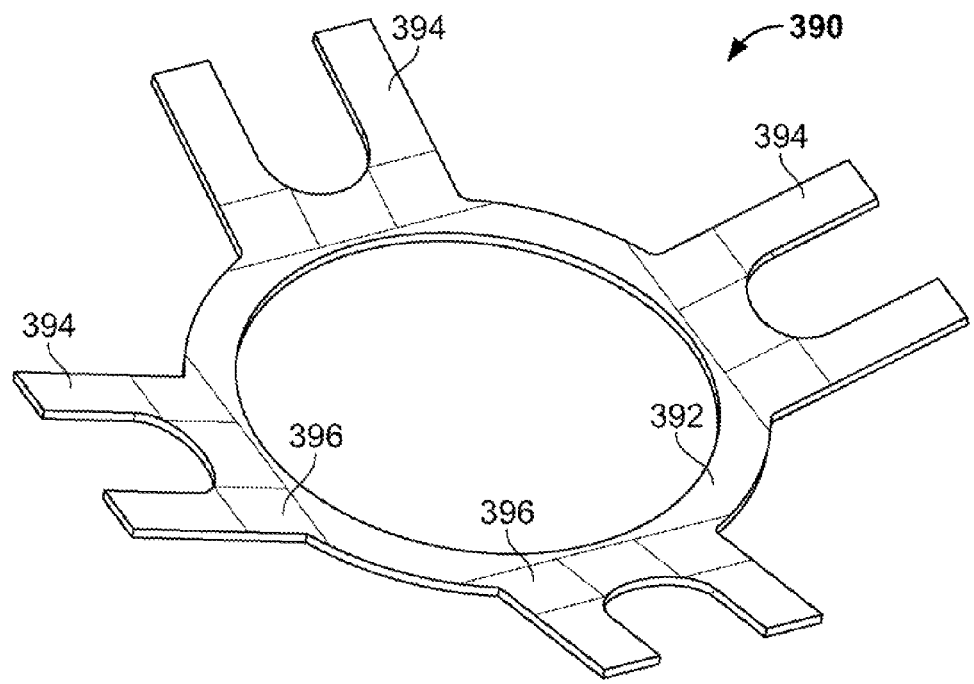
FIG. 12A is a perspective view of a leaf spring biasing member usable for biasing an EAP auto-focus actuator of the present invention.
Figure 12B:
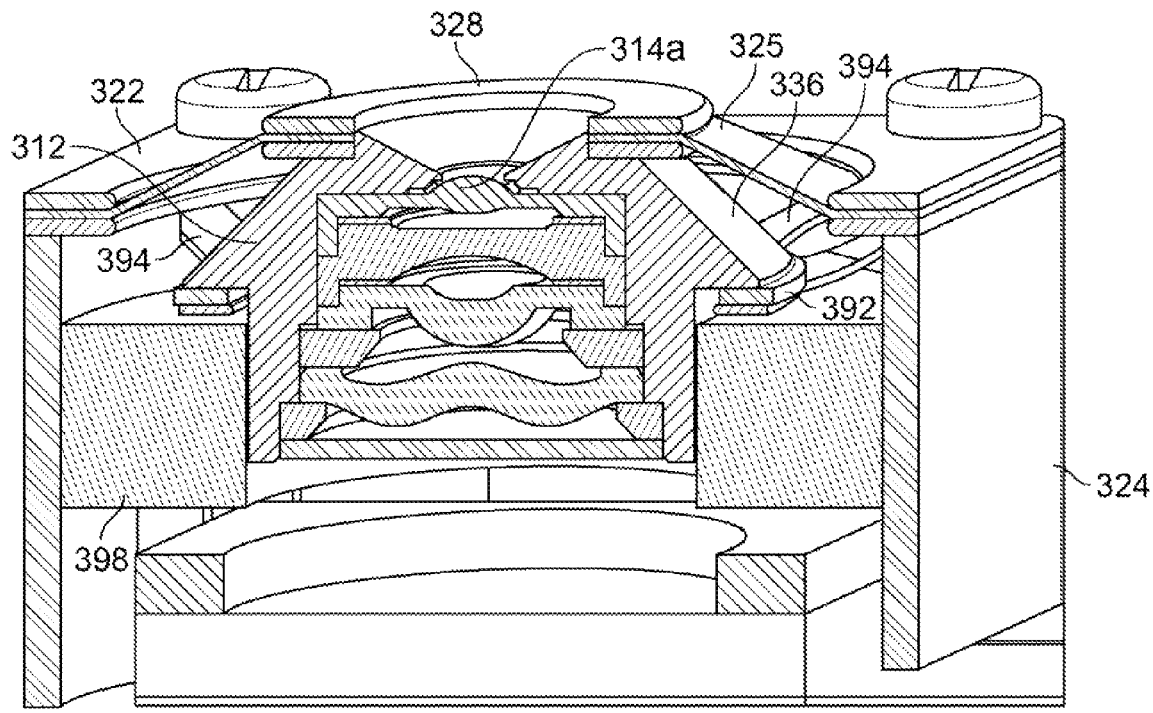
FIGS. 12B and 12C are perspective cross-sectional and top views of an optical lens system of the present invention in which the leaf spring biasing member of FIG. 12A is in operative use.
Figure 12C:
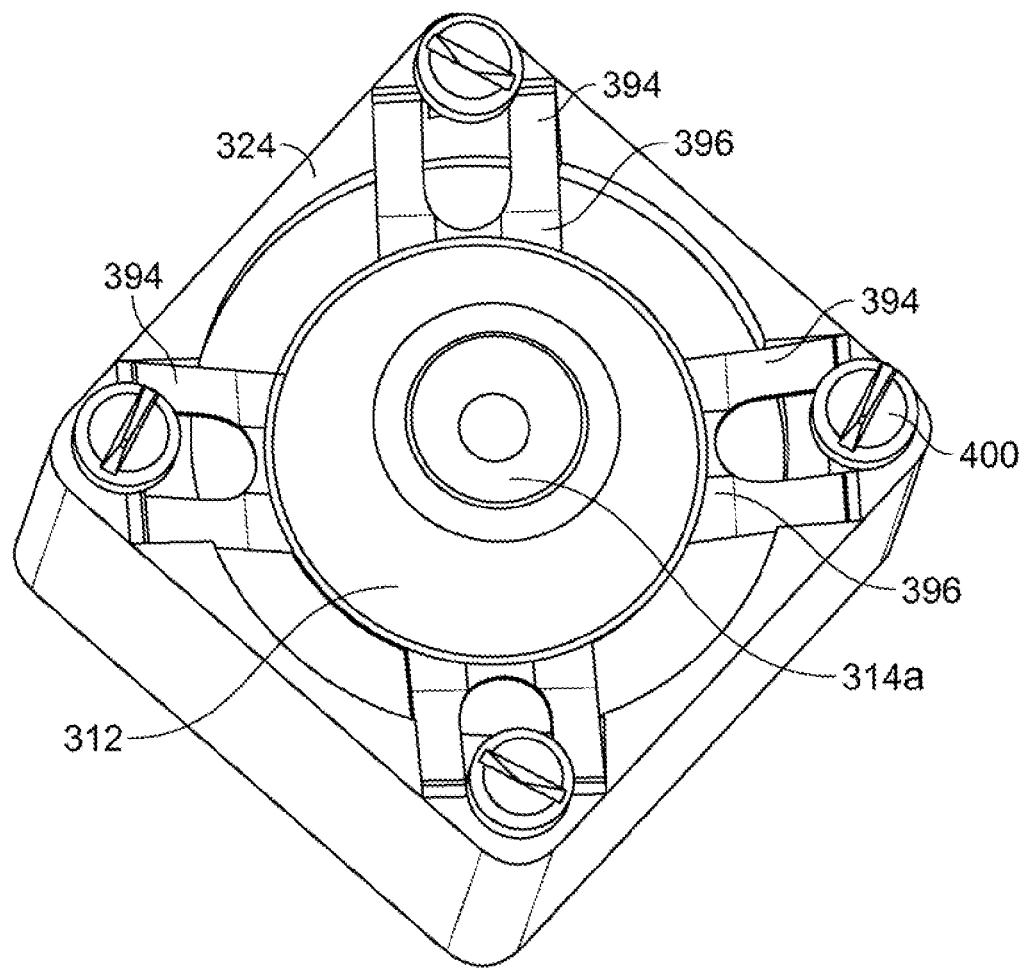

The frustum architecture of the EAP actuator may be provided by other types of biasing members, such as the leaf spring biasing mechanism 390 illustrated in FIG. 12A, which configuration provides a particularly low profile. Biasing mechanism 390 includes an annular base 392 having radially-extending, forked tabs 394 spaced about and angled upward from the circumference of base 392 at flexure points 396. FIGS. 12B and 12C show the leaf spring biasing mechanism 390 operatively employed as a biasing member within an optical lens system having a construct similar to that of system 300 of FIGS. 7A and 7B. The base portion 392 of the leaf spring encircles lens barrel 312 under flange 336 and each of the forked tabs 394 engage the underside of outer frame 322 which acts as a bearing surface. To provide a uniformly balanced, concentric bias, the leaf spring mechanism preferably provides at least three, evenly-spaced tabs 394. Further, to prevent unintentional rotational movement of leaf spring 390, the tines or legs of the forked tabs 394 within slots located at each corner of the housing. An inner housing block 398 acts as a linear bushing or backstop to lens barrel 312 when in the "infinity" (i.e., most proximal) position.

Figure 13:
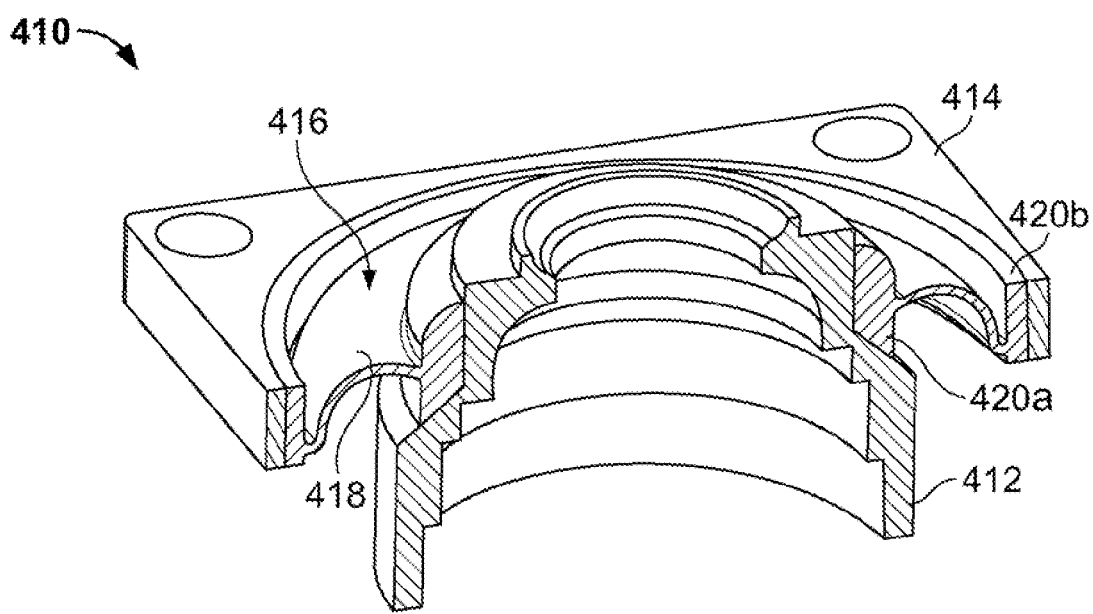
FIG. 13 is a perspective cross-sectional view of another optical lens system of the present invention using an integrated leaf spring biasing member.

The biasing member may also be integrated into the lens barrel and/or housing structure of the optical lens system. FIG. 13 illustrates an example of such where a structural portion 410 of a lens system of the present invention includes a lens barrel 412 concentrically positioned within a housing component 414. A bias member 416 is positioned in between and straddles across the lens barrel and housing, where the biasing member may be formed with these components as a unitary or monolithic structure (e.g., by means of molding) or otherwise be provided as an insert therebetween. The latter configuration is illustrated where an annular diaphragm 418 having a convex configuration (from a top or outside perspective); however, a concave configuration may alternatively be employed. Silicone, polyurethane, EPDM, other elastomers or any low viscosity elastomer is a suitable material for diaphragm 418. The diaphragm extends between inner and outer side walls 420*a*, 420*b* which brace against the outer lens barrel wall and inner housing wall, respectively. The curved diaphragm 418 provides a spring mechanism which has a negative rate bias. Other examples of EAP actuators having a negative rate bias are disclosed in previously referenced U.S. patent application Ser. No. 11/618,577.

Figure 14A:
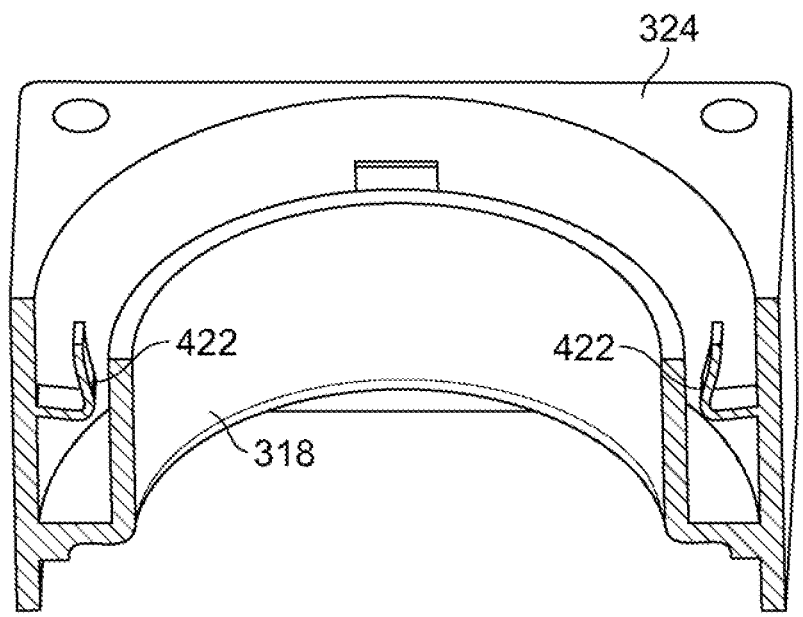
FIGS. 14A and 14B are perspective cross-sectional views of a lens system housing with and without an associated lens barrel, respectively, having another type of integrated spring biasing member.
Figure 14B:
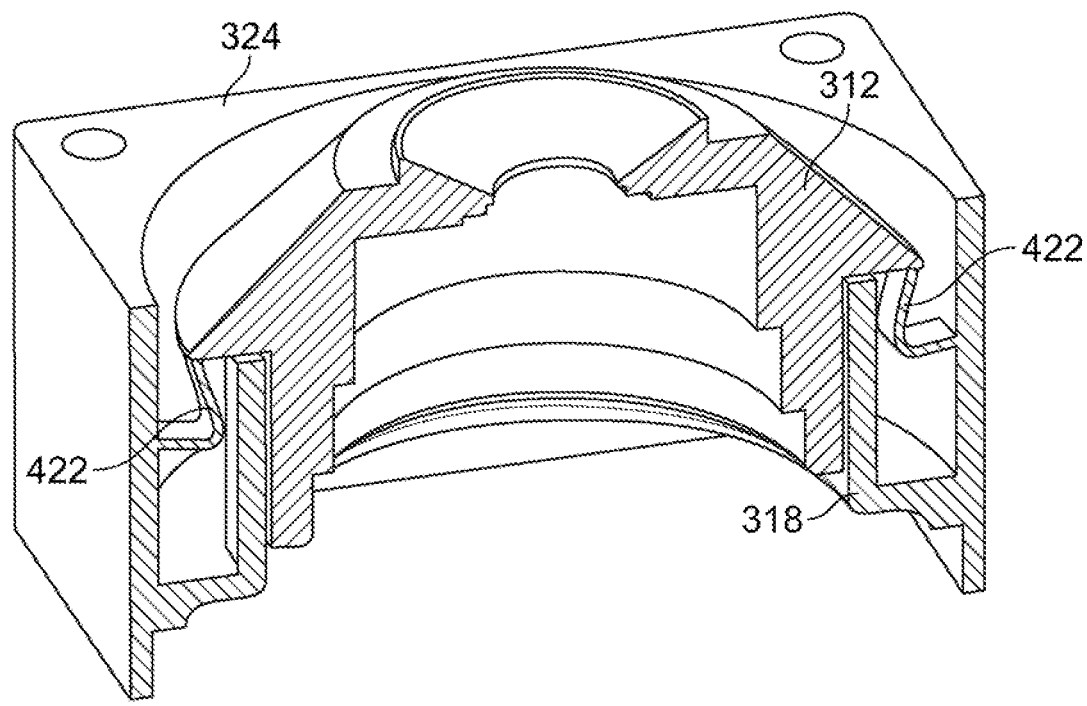

FIGS. 14A and 14B illustrate other ways of integrating the actuator's spring bias into the subject lens systems. In FIG. 14A, the spring bias to be applied to the EAP actuator (not shown) is provided by two or more tabs 422 which are structurally integrated into the bottom housing 324 of, for example, lens system 300 of FIGS. 7A and 7B, and extend radially inward within the concentric gap between the outer wall of housing 324 and bushing wall 318. Tabs 422 are bent or molded in a manner so as to provide a spring bias when a load is applied. The lens barrel 312 may also be integrally formed (such as by molding) with and fixed to tabs 422, as shown in FIG. 14B.

The lens systems of the present invention may be equipped with one or more light filters at any suitable position relative to the lenses. Referring again to system 300 of FIGS. 7A and 7B, top housing 326 has a transparent or translucent cover 330 positioned therein for passing light rays. Alternatively, the entirety of top housing 326 may be molded from the transparent/translucent material. In either case, the cover may function as a filter which prevents infrared wavelengths of about 670 nm and greater from being transmitted through the lens assembly while allowing visible wavelengths to be transmitted generally without loss. Alternatively or additionally, an IR filter 366 may be positioned proximally of the lens assembly.

The lens system of the present invention may also have image stabilization capabilities. With reference again to FIGS. 7A and 7B, positioned proximally of lens module 302 is an exemplary embodiment of an image stabilization module 304, which includes an image sensor 306 for receiving images focused onto it by lens module 302 and associated electronics for processing those images. Image stabilization module 304 also include an EAP actuator 310 which serves to compensate for any movement, i.e., "shake", of image sensor 360 in the x-y plane in order to keep the focused image sharp.

Z-axis correction may also be provided along with a sensor for sensing such motion.

Figure 8:
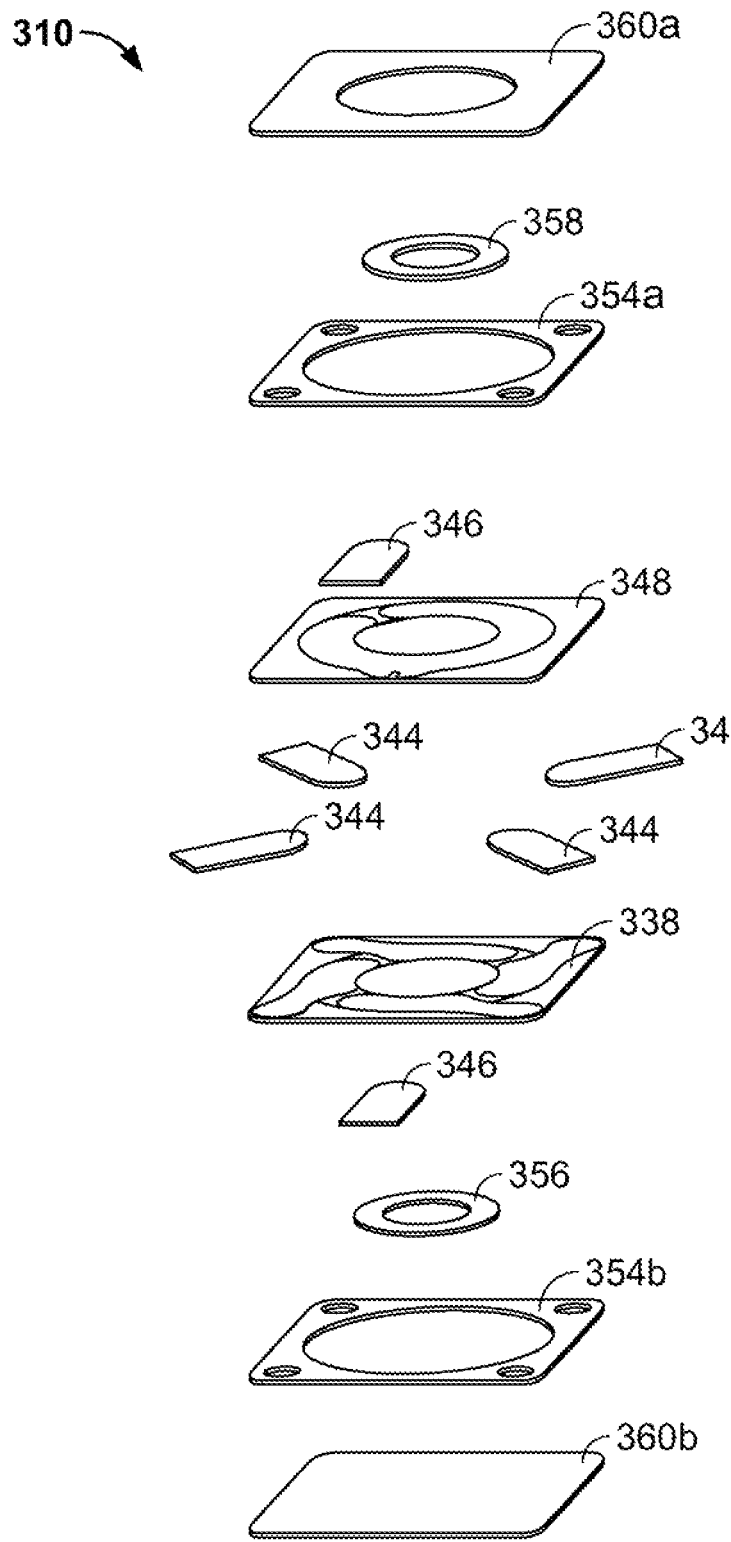
FIG. 8 is an exploded assembly view of the image stabilization cartridge of the lens system of FIGS. 7A and 7B.
Figure 9A:
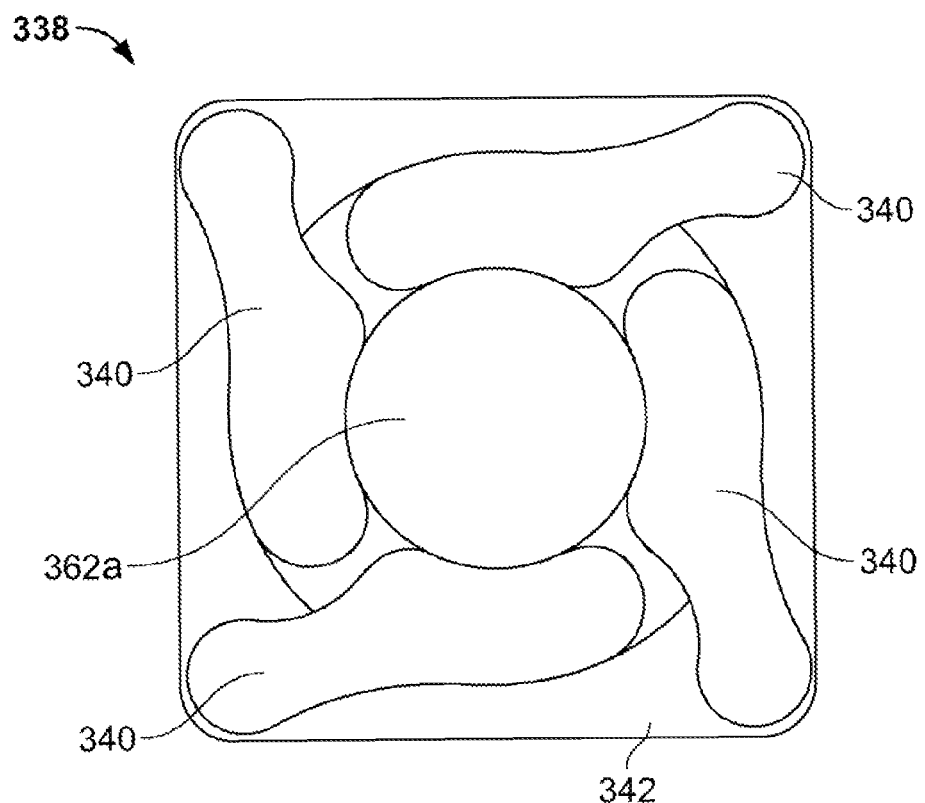
FIGS. 9A and 9B are top and bottom planar views, respectively, of the electrode configuration of the electroactive polymer transducer of the image stabilization cartridge of FIG. 8.
Figure 9B:
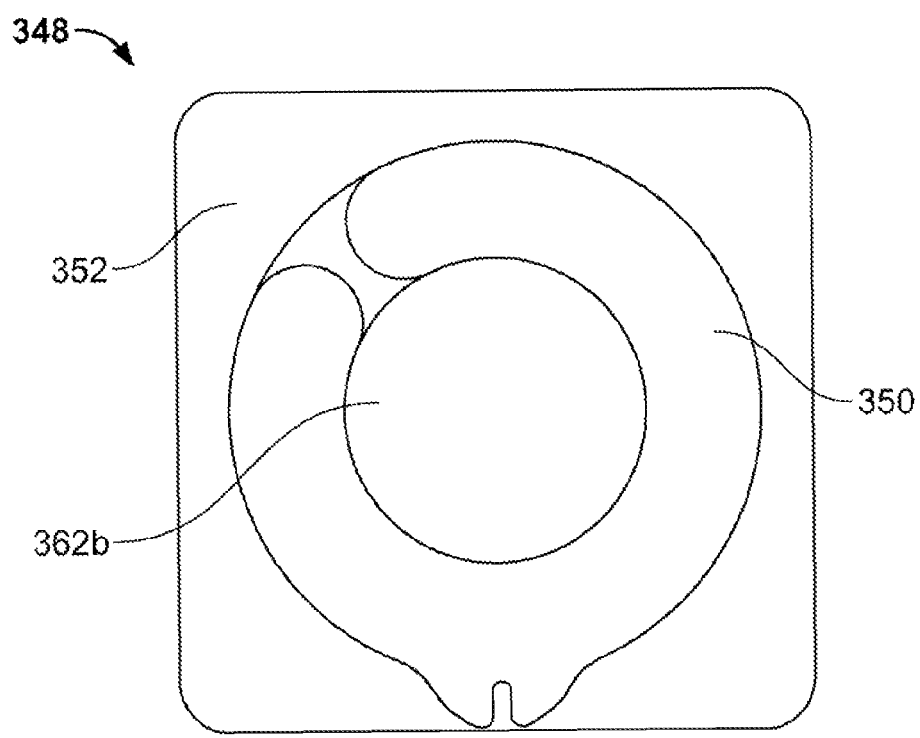
Figure 10A:
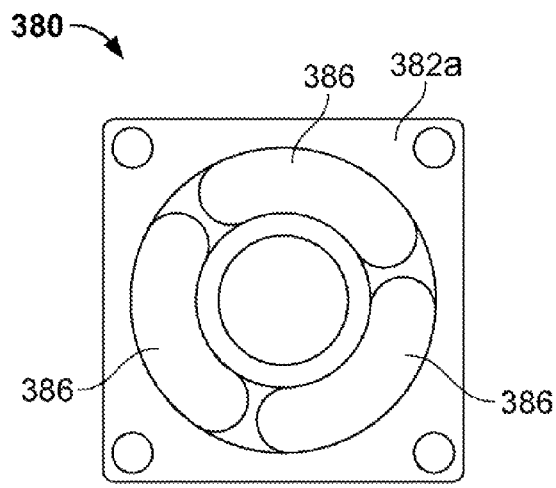
FIGS. 10A and 10B are top and bottom planar views, respectively, of another embodiment of a framed electroactive polymer transducer usable with the image stabilization cartridge of FIG. 8.
Figure 10B:
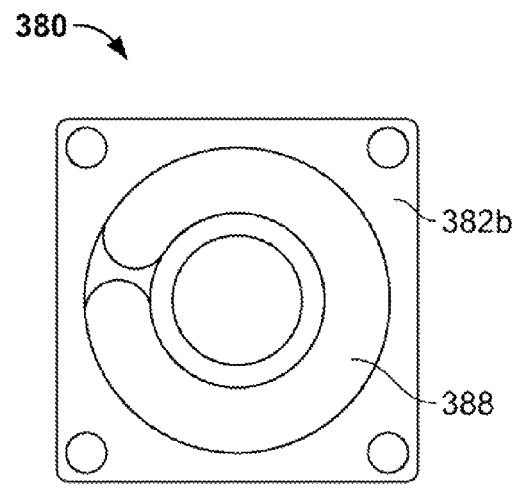
Figure 10C:
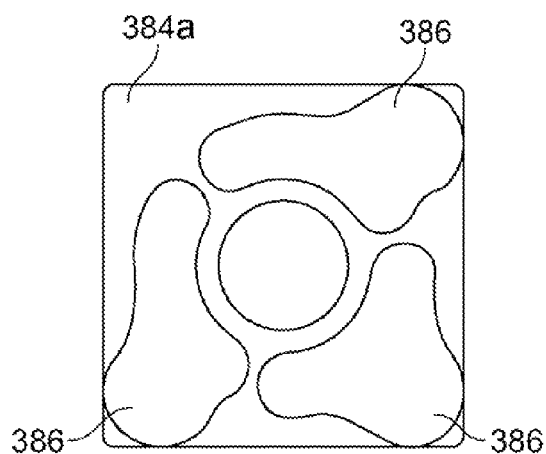
FIGS. 10C and 10D are top and bottom planar views, respectively, of the electroactive films employed in the transducer of FIGS. 10A and 10B.
Figure 10D:
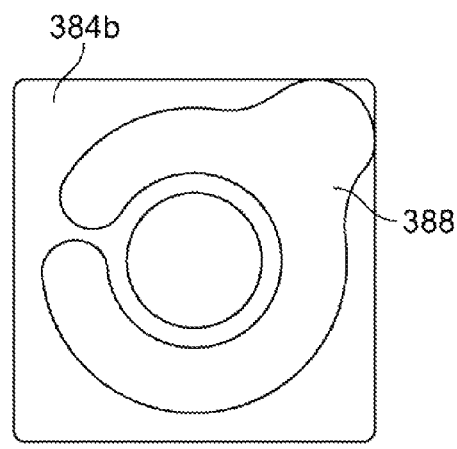

EAP actuator 310 has a planar configuration comprising a two-ply EAP film transducer having "hot" and ground sides 338 and 348, best illustrated in the exploded assembly view of FIG. 8 and the planar views of FIGS. 9A and 9B. EAP film 338 comprises elastomeric layer 342 and electrically isolated electrodes 340 which each extend over a portion of elastomer 342 while leaving a central portion 362*a* of layer 342 free of electrode material. EAP film 348 includes elastomeric layer 352 and a single ground electrode 350. The annular shape of ground electrode 350 enables apposition to each hot electrode 340 and leaves a central portion 362*b* free of electrode material which matches that of portion 362*a* of film 338. Collectively, the two films provide a transducer having four active quadrants (i.e., having four active-ground electrode pairs) to provide a four-phase actuator; however, more or fewer active portions may be employed, as discussed below with respect to FIGS. 10A-10D. Each quadrant is selectively activated, either individually or in tandem with one or more of the other quadrants to provide a range of actuation motion in the x-y plane (i.e., with two degrees of freedom), in response to and to compensate for shake undergone by the system. Sandwiched between the two films are electrical tabs 344, one for each hot electrode. A pair of grounded electrical tabs 346 is provided on opposing outer surfaces of EAP films 338, 348. Tabs 334 and 348 are for coupling the EAP actuator to a power supply and control electronics (not shown). The two-ply transducer film is in turn sandwiched between top and bottom frame members 354*a*, 354*b* which hold the EAP films in stretched and strained conditions.

Actuator 310 also includes two disks 356, 358, one centrally positioned on each side of the composite film structure. The disks serve various functions. Disk 356, provided on the outer side of hot electrode film 338, is held in planar alignment within the annular space or cut-out of frame side 354*b* by backing plate or cover 360*b*. Disk 356 acts as a travel stop—preventing film 338 from contacting the back plate and acts as a supplemental bearing support to the sensor. Disk 358 is provided on the outer side of film 348 and held in planar alignment within the annular space of cut-out of frame side 354*a* by front plate or cover 360*a* which also has a cut-out portion through which disk 358 transfers movement of actuator 310 to image sensor 306. To facilitate transmission of the output actuator motion from disk 358 to image sensor 306, a linear bearing structure/suspension member 308 is provided therebetween. Structure/member 308 is in the form of a planar substrate 362 having a plurality of shock absorbing elements 364, e.g., spring tabs extending from the edges of substrate 362, which function as shock absorbers to optimize the output motion of actuator 310. Substrate 362 may be in the form of a flex circuit with the spring tabs 364 (when made of conductive material) providing electrical contact between image sensor 306 and its associated control electronics to actuator 310.

Collectively, image sensor 306, suspension member 308 and actuator 310 are nested together within a housing 316. Housing 316 is recessed on a distal side 368 to receive lens module 302. On its proximal side 370, housing 316 has notches or recesses 372 for accommodating electrical contact tabs 344, 346 of actuator 310 and/or spring tabs 364 of bearing/suspension member 308.

As mentioned above with respect to discussion of the four-phase actuator 310, the image stabilization actuators of the present invention may have any number of active areas which provide the desired phased actuation. FIGS. 10A-10D illustrate a three-phase EAP actuator 380 suitable for use with the subject optical lens systems of the present invention for at least image stabilization. Actuator 380 has a hot EAP film 384*a* having three electroded areas 386, each of which effects actuation of approximately one-third of the active area of actuator 380. Grounded EAP film 384*b* has a single annular ground electrode 388 which, when packaged with film 384*a* by frame sides 382a and 382b, provides the ground side for each of the three active portions of actuator 380. While this three-phase design is more basic, both mechanically and electrically, than the four-phase design, more complex electronic control algorithms are necessary as a three-phase actuator may not alone provide discrete movement in either the X or Y axes.

Many manufactured hardware components have dimensions which fall within an acceptable tolerance range, whereby fractional dimensional variations amongst like components and between associated components do not affect production yields. However, with devices such as optical lenses, more precision is often necessary. More specifically, it is important that the position of the lens assembly relative to the image sensor be set to optimize the focus of the lens assembly when in the "infinity" position (i.e., when in an "off" state) so as to ensure accurate focusing when in use by the end user. As such, the infinity position is preferably calibrated during the fabrication process.

Figure 15A:
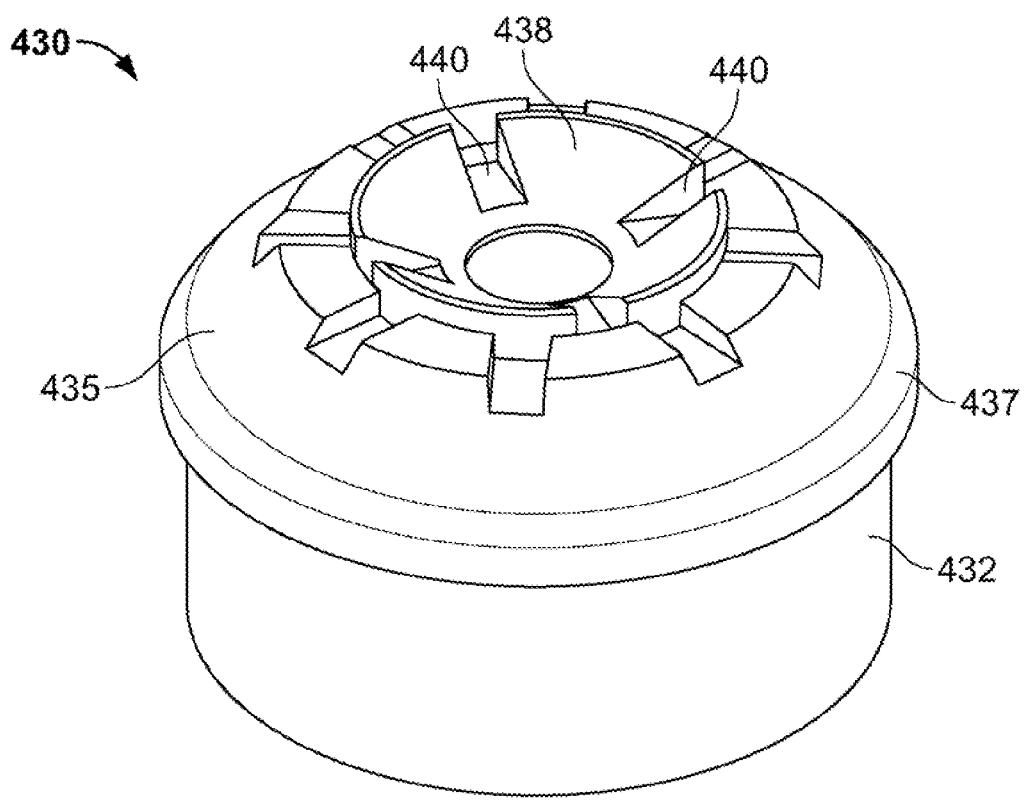
FIGS. 15A and 15B are perspective and cross-sectional views of an assembled lens barrel and flange assembly usable with the lens systems of the present invention where the assembly provides an adjustable barrel design for purposes of focus calibration.
Figure 15B:
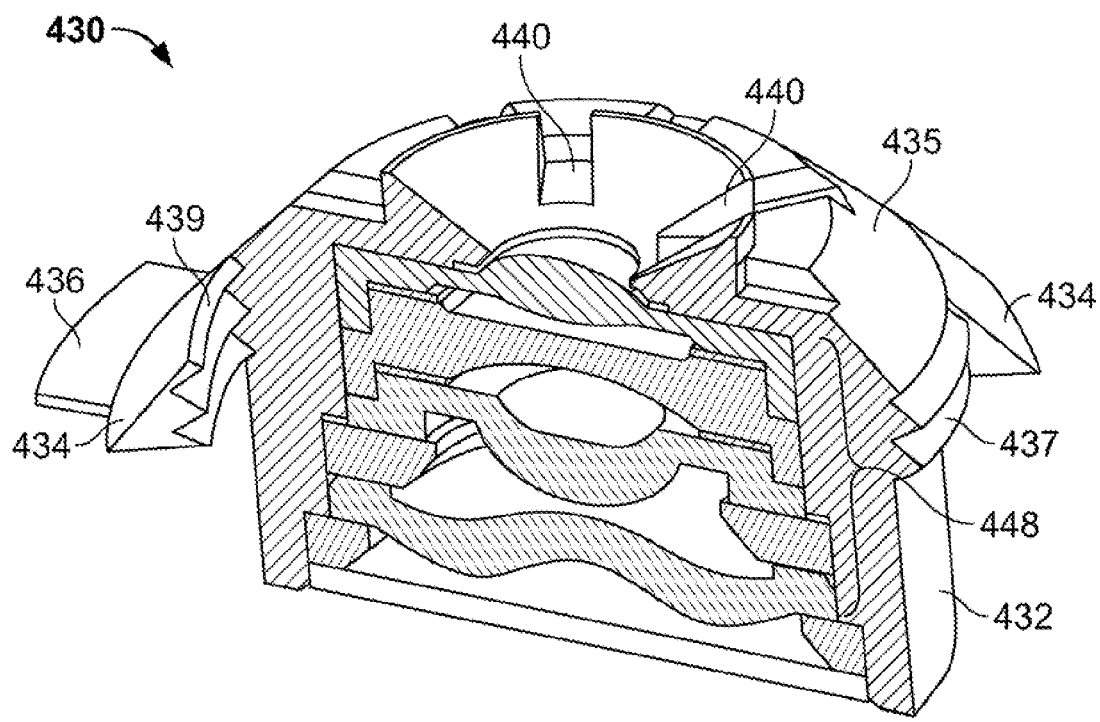
Figure 15C:
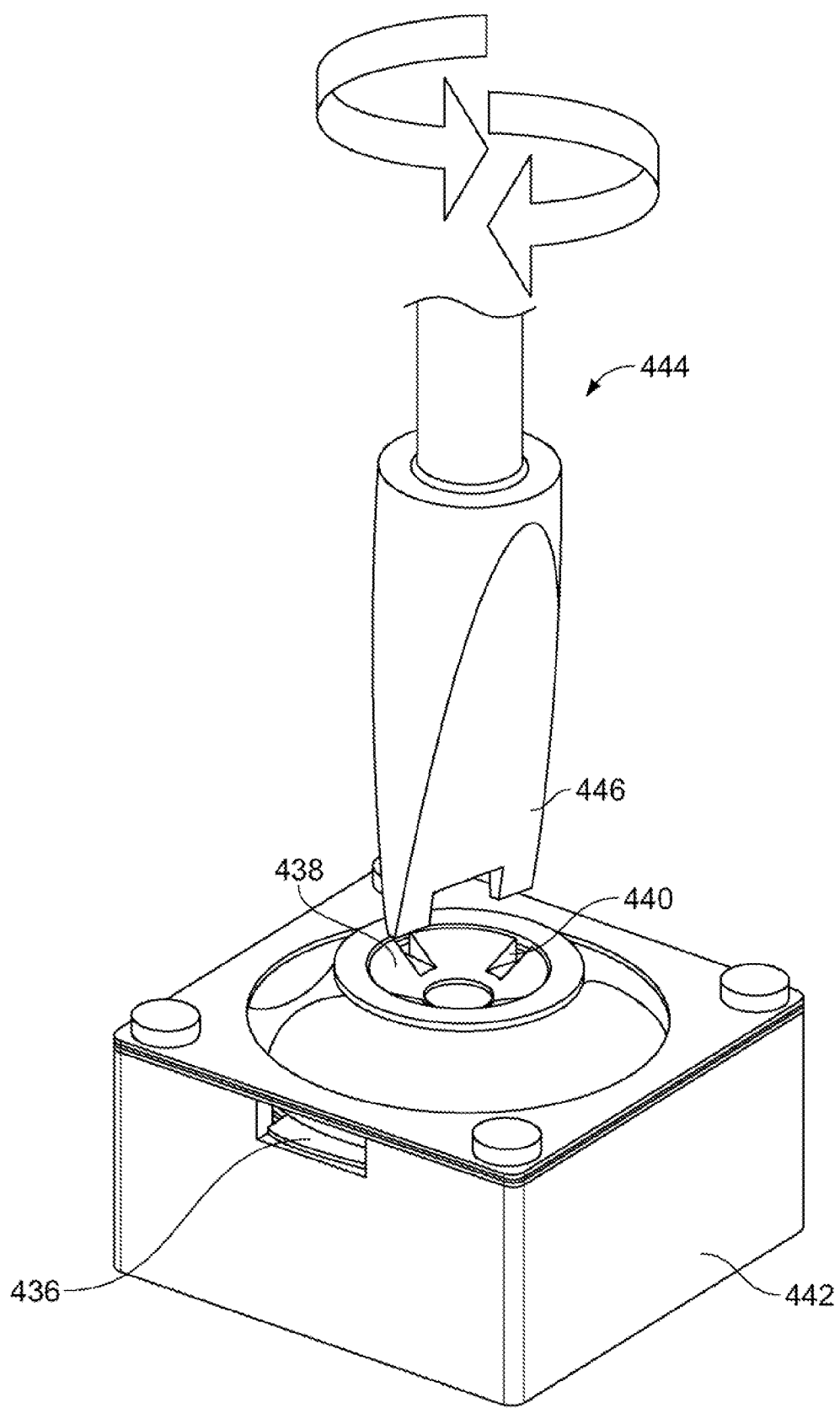
FIG. 15C illustrates use of a tool for calibrating the infinity focus parameter of the lens barrel assembly of FIGS. 15A and 15B.

FIGS. 15A and 15B illustrate an exemplary design configuration for calibrating the infinity position of the lens assembly, i.e., adjusting the distance between the image sensor and the lens assembly to establish an optimally focused infinity position, during the fabrication process. The lens barrel assembly 430 is comprised of lens barrel 432 and a separable flange 434. Flange 434 is internally threaded 439 to rotationally engage with external threads 437 of lens barrel 432. Flange 434 is provided with a radially extending tab 436 which, when placed within the system housing 442, as shown in FIG. 15C, protrudes from a designated opening 436. As such, the rotational position of flange 434 is fixed relative to lens barrel 432. The crest portion 438 of the top cover 435 of the lens barrel 432 is provided with grooves or indentations 440 for receiving the working end 446 of a calibration tool 444, as shown in FIG. 15C. Tool 444 allows access to lens barrel 432 even after enclosed within housing 442, and is used to rotate the lens barrel 432 in either direction relative to the threadedly engaged flange 434, the position of which is fixed within the housing by means of tab 436 and opening 436. This relative rotational movement, in turn, translates the entire lens barrel assembly 430 linear or axially relative (in either direction depending on rotational direction of lens barrel) to the image sensor (not shown) and other fixed components within the lens system. It is the distance between the lens assembly 448 (see FIG. 15B) and the image sensor that defines the infinity position of the system.

Figure 16A:
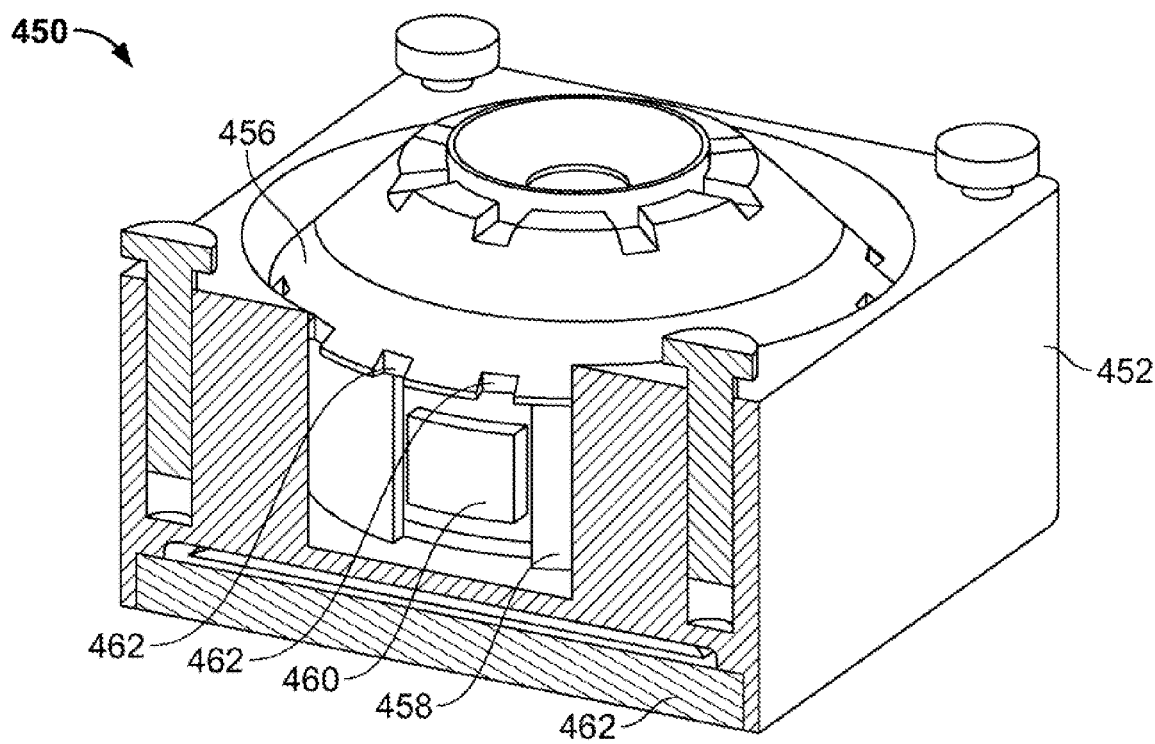
FIGS. 16A and 16B are perspective and cross-sectional views of another lens barrel assembly having an adjustable flange design for purposes of focus calibration.
Figure 16B:
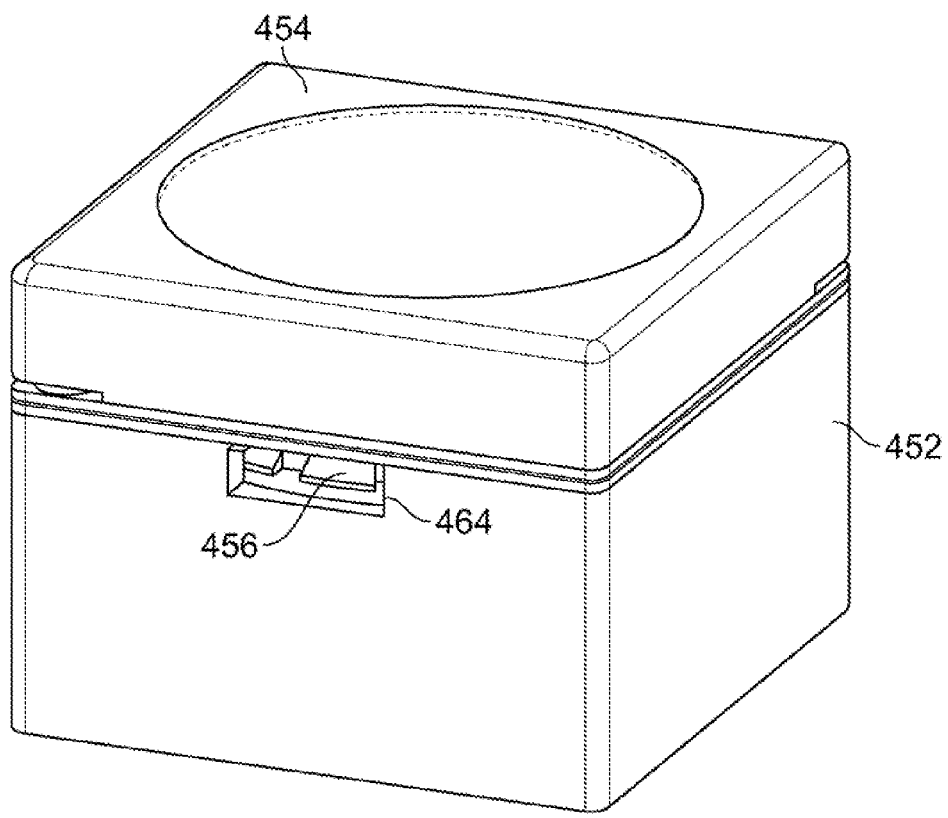

FIGS. 16A and 16B illustrate another lens barrel configuration 450 for purposes (at least in part) of calibrating a lens assembly. The difference with respect to the configuration of FIGS. 15A-15C is that flange 456 is movable relative to the lens barrel which is rotationally fixed when operatively seated within housing 452. This fixation is provided by a bumper or protrusion 460 extending radially from the lens barrel's outer wall. When the lens barrel is seated within the system housing 452, bumper 460 is positioned within an opening or window 458 within the housing wall, which prevents rotational movement of the lens barrel. The outer circumference of flange 456 is provided with indentations 462 which are configured to engage with a calibration tool (not shown). Housing 452 is provided with a window 464 through which the peripheral edge of flange 456 is exposed. By use of calibration a tool (or a finger if possible), flange 456 is rotatable in either direction, as needed. As with the previously described configuration, the relative movement of the flange to the lens barrel linearly/axially translates the entire lens assembly relative to the image sensor (not shown). Both configurations provide a convenient and easy way to calibrate the infinity position of the lens assembly during final assembly of the lens system.

Figure 17A:
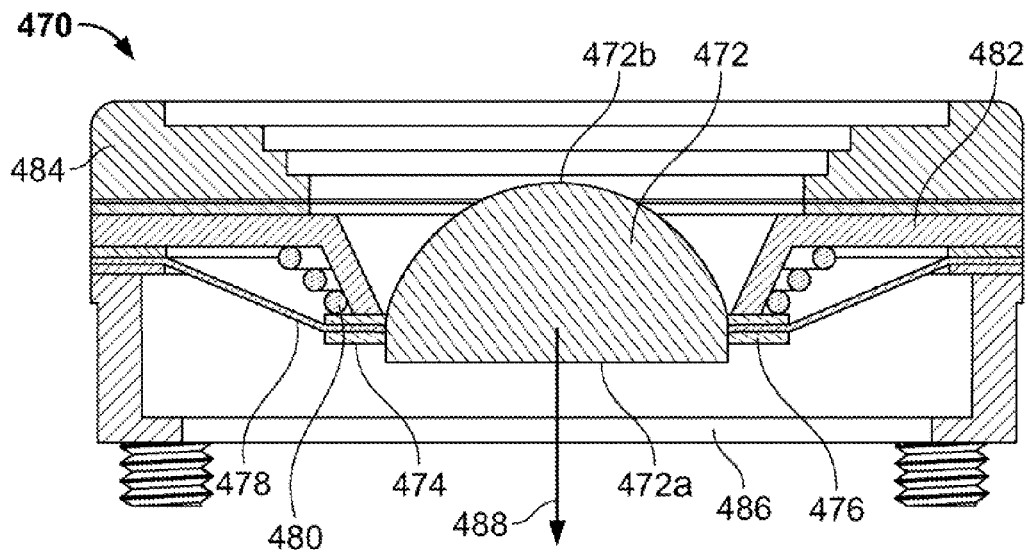
FIGS. 17A and 17B are cross-sectional views of lens systems having single-phase and two-phase actuator configurations, respectively, which provide a very compact, low-profile form factor.
Figure 17B:
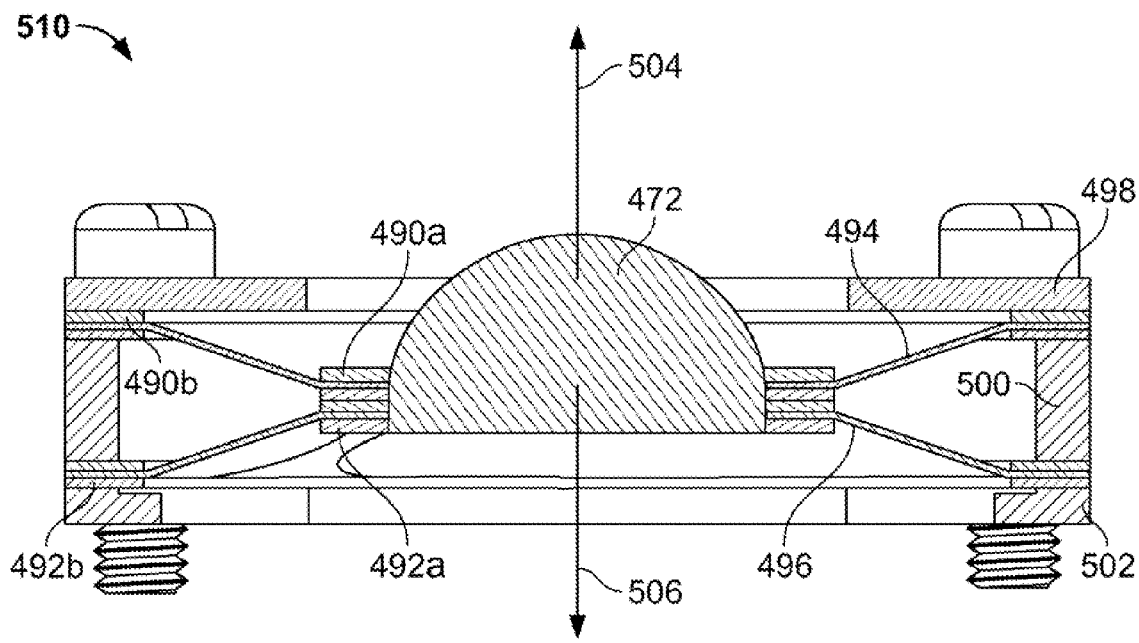

FIGS. 17A and 17B illustrate two other embodiments of lens systems of the present invention having more simplistic and lower profile designs in which a lens 472 (either a single lens or the distal most lens amongst a plurality of lenses) is directly integrated with and selectively positioned by an EAP actuator.

Lens system 470 of FIG. 17A employs a single-phase actuator comprising inner and outer frame members 474, 476, respectively, with an EAP film 478 stretched therebetween. Lens 472 is positioned and fixed concentrically within inner frame 474 such that the output movement by the actuator is directly imposed on lens 472. The single-phase actuator is biased in the direction toward the front side 472a of the lens by a compact coil spring 480 positioned within the frustum space defined between inner frame 476 and a back plate 482. The latter acts as hard stop at a maximum "macro" (near focus) position. When the actuator is in the "off" state, lens 472 is in the macro position and, when activated, the lens moves toward the infinity position in the direction of arrow 488. In lens positioner applications which only operate in the macro position, an initial macro setting improves the reliability of the system by eliminating unnecessary displacement range.

A two-phase lens system 510 having a similar, low-profile construct is illustrated in FIG. 17B. Here, the EAP actuator comprises two layers or diaphragms which act to bias each other. The top or back actuator includes EAP film 494 extending between inner and outer frames 490a, 490b and the bottom or front actuator includes EAP film 496 extending between inner and outer frames 490a, 492b. The inner frames 490a, 492a are coupled together while the respective outer frames 490b, 492b are spaced apart by an intermediate housing member 500 and sandwiched between it and, respectively, top housing member 498 and bottom housing member 502. Lens 472 (having a truncated, low-profile shape) is positioned concentrically within the coupled inner actuator frames. With two active actuators, each provides the bias for the other and allows two-phase or bid-directional movement of lens 472. Specifically, when the bottom actuator is activated while the top actuator is off, the bias by the top actuator moves lens 472 in the direction of arrow 504 and, likewise, when the top actuator is activated while the bottom actuator is off, the bias by the bottom actuator moves lens 472 in the direction of arrow 506. This enables lens 472 to have double (2×) the travel distance as that of the single-phase system 470. This double diaphragm configuration can be made to function as a single-phase actuator by making one or the other of the actuators passive, i.e., always in the off state. In either case, the double diaphragm actuator provides a very low profile form factor for the lens system.

Lens travel/stroke, whether for auto-focusing or zooming, can be increased (as well as decreased) by employing additional structural components which enable lens movement. This movement may involve absolute displacement of a single lens or a stack of lenses and/or relative movement between lenses within an assembly of lenses. The additional components for effecting such movements may include one or more EAP actuators, mechanical linkages or the like, or a combination of both, which are integrated with or coupled to the lens barrel/assembly.

FIGS. 18 and 19 provide perspective view of exemplary lens displacement mechanisms of the present invention in which a number of EAP actuator/transducers are stacked in series to amplify stroke output, illustrated by arrows 525, 535, respectively. As illustrated, the transducers may be coupled or ganged together in a desired configuration to achieve the desired output.

Figure 18B:
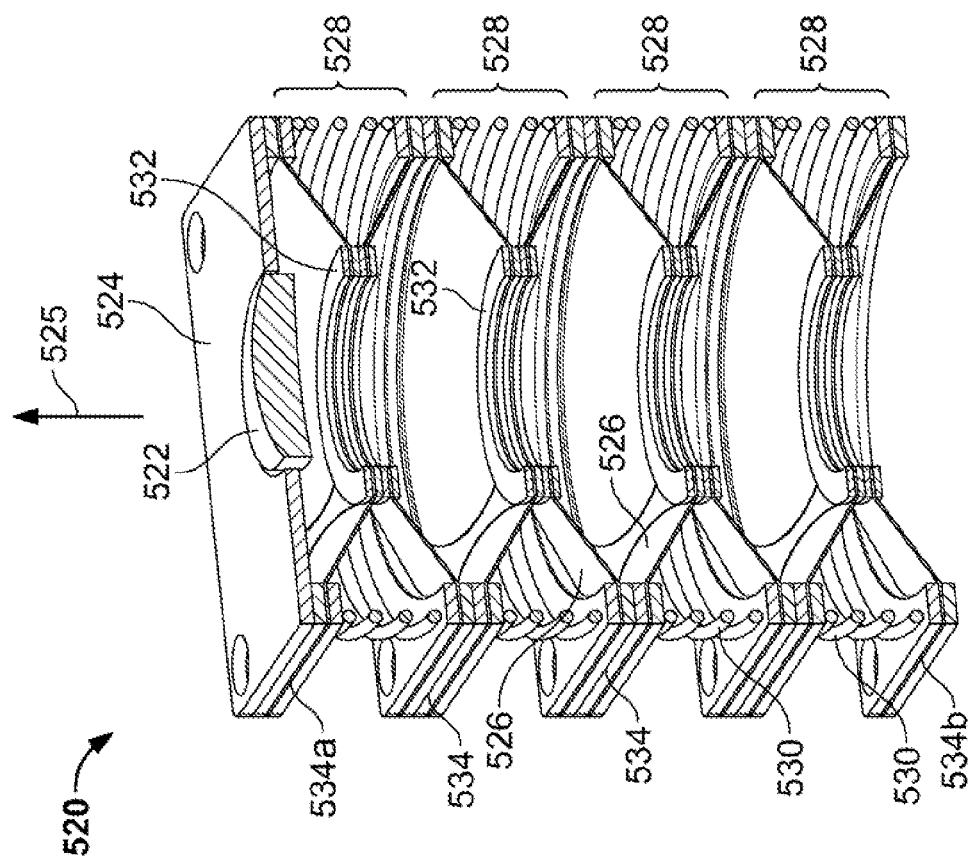
FIGS. 18A and 18B are perspective and cross-sectional views of an exemplary EAP actuator-based lens displacement mechanism of the present invention.
Figure 18A:
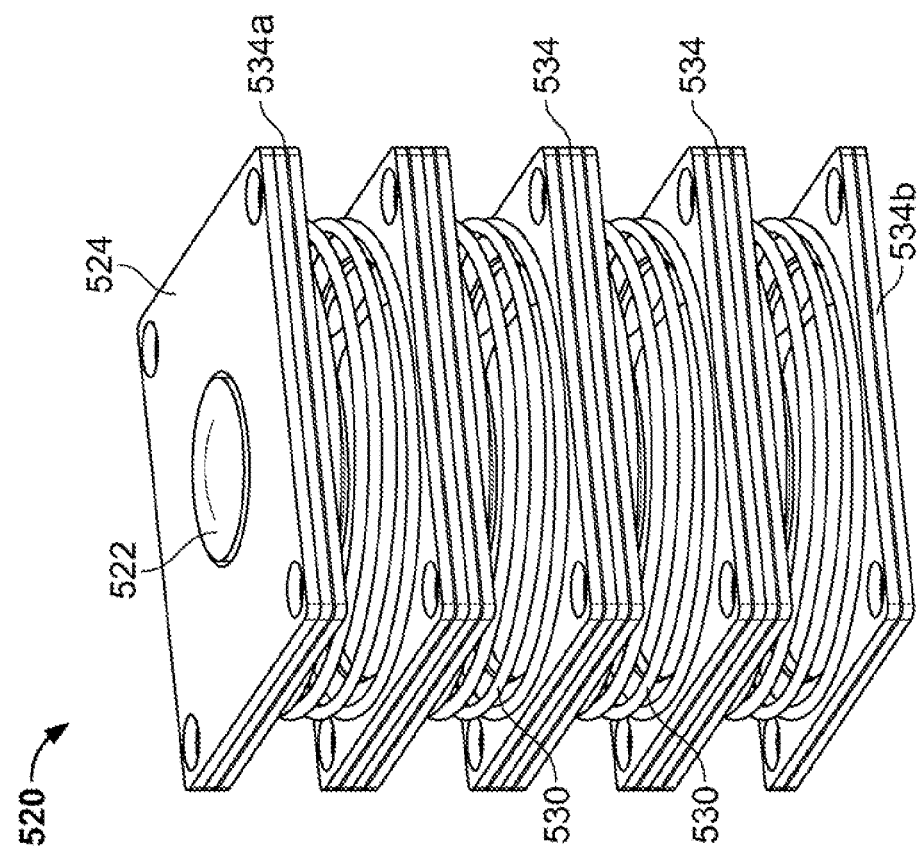

The lens displacement mechanism 520 of FIGS. 18A and 18B provides a number of double-frustum EAP actuator 528 units in which each actuator unit 528 includes two concave-facing transducers diaphragms 526 having their inner frames or caps 532 ganged together. In turn, the outer frames 534 of the actuators are ganged or coupled to an outer frame 534 of an adjacent actuator. The distal most outer frame 534a is mounted to a lens frame 524 having lens 522 positioned therein. The proximal most outer frame 534b is positioned distally of an image sensor module (not shown).

Figure 19B:
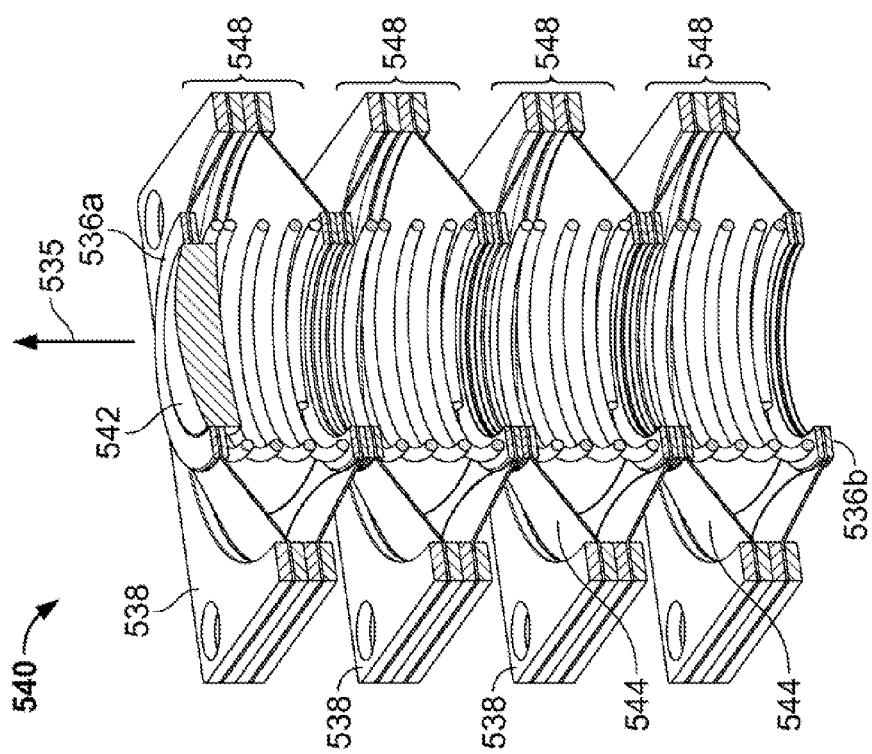
FIGS. 19A and 19B are perspective and cross-sectional views, respectively, of another EAP lens displacement mechanism useable with the present invention.
Figure 19A:
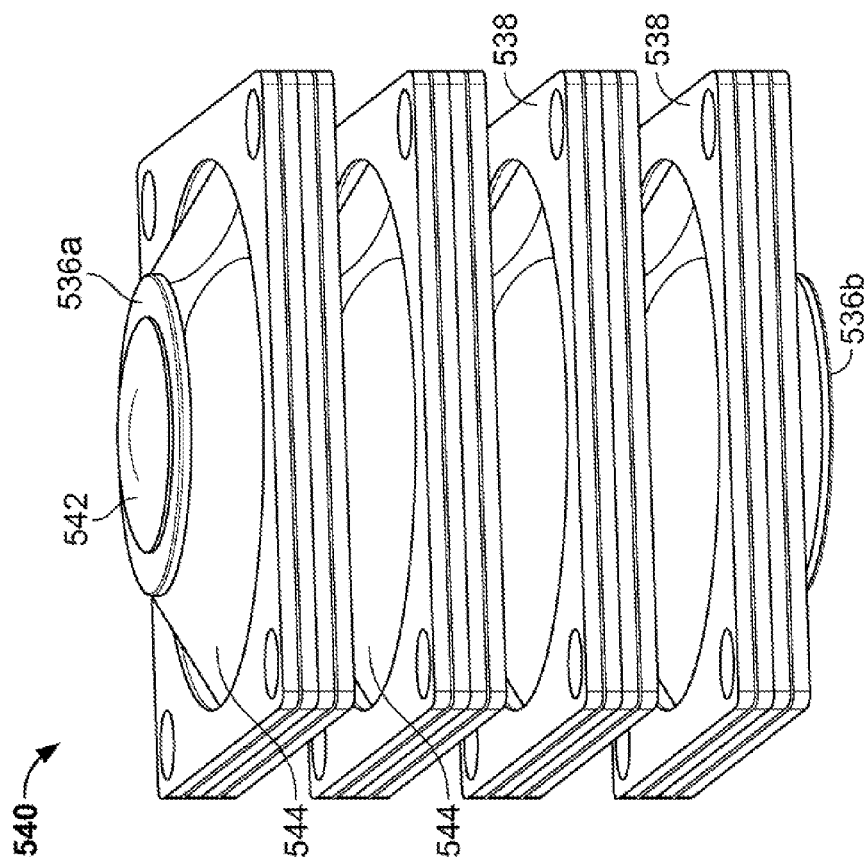

FIGS. 19A and 19B illustrate a similarly functioning lens displacement mechanism 540 where each of the plurality of EAP actuators units 548 have an inverted configuration whereby the transducer diaphragms 544 have their concave sides facing inward with their outer frames 538 ganged together. In turn, the inner frames 536 of the actuators are ganged or coupled to an inner frame 536 of an adjacent actuator. The distal most inner frame 536a serves to hold lens 522 concentrically therein. The proximal most inner frame 536b is positioned distally of an image sensor module (not shown).

With either design, the greater the number of actuator levels, the greater the stroke potential. Further, one or more the actuator levels within the stack may be used for zoom applications where additional lenses may be integrated with the various actuator levels, and collectively operated as an afocal lens assembly. Additionally or alternatively, one or more of the transducer levels nay be setup for sensing—as opposed to actuation—to facilitate active actuator control or operation verification. With any of these operations, any type of feedback approach such as a PI or PID controller may be employed in the system to control actuator position with very high accuracy and/or precision.

Figure 20A:
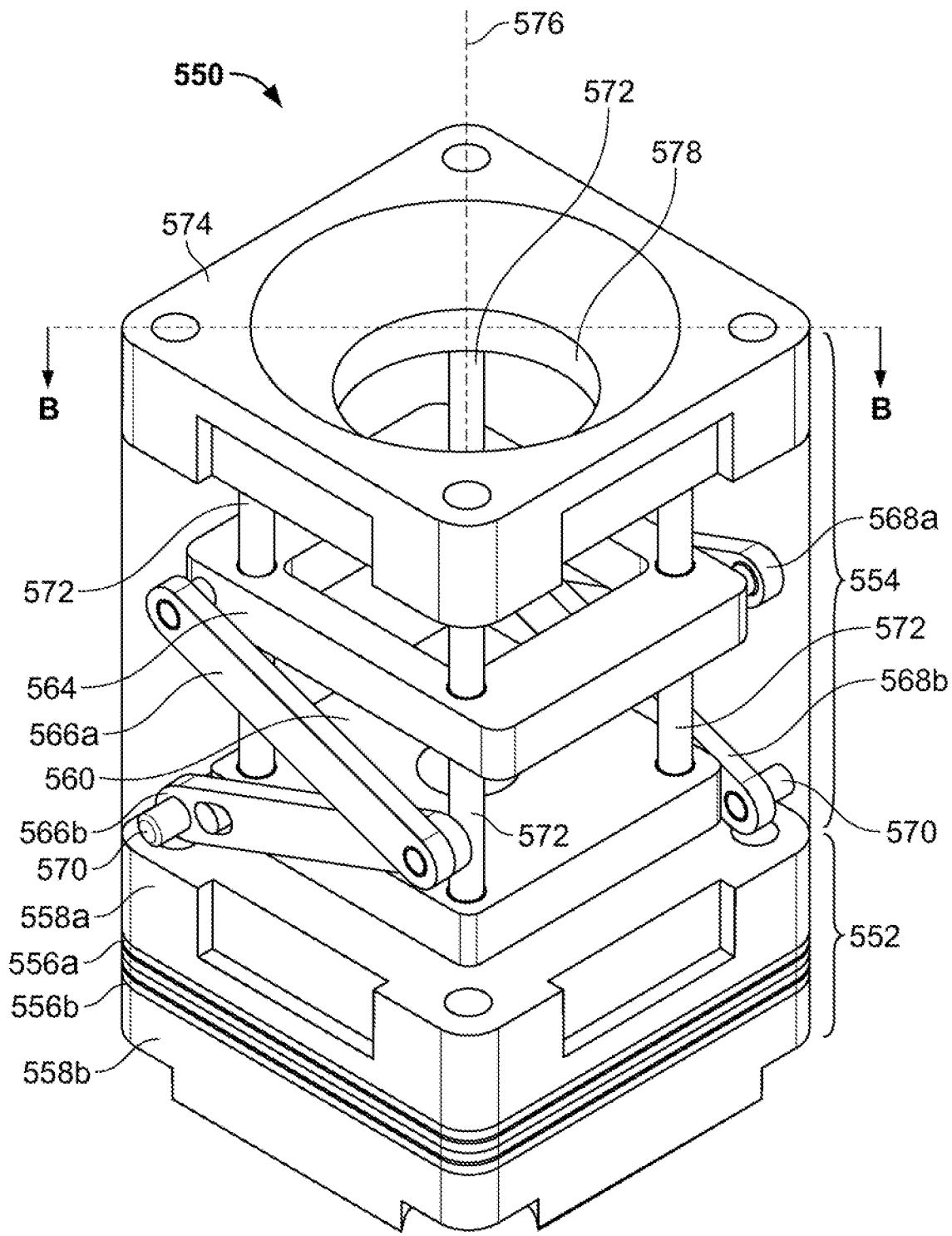
FIGS. 20A and 20B are perspective and cross-sectional views, respectively, of another lens displacement mechanism which employs EAP actuators and mechanical linkages.
Figure 20B:
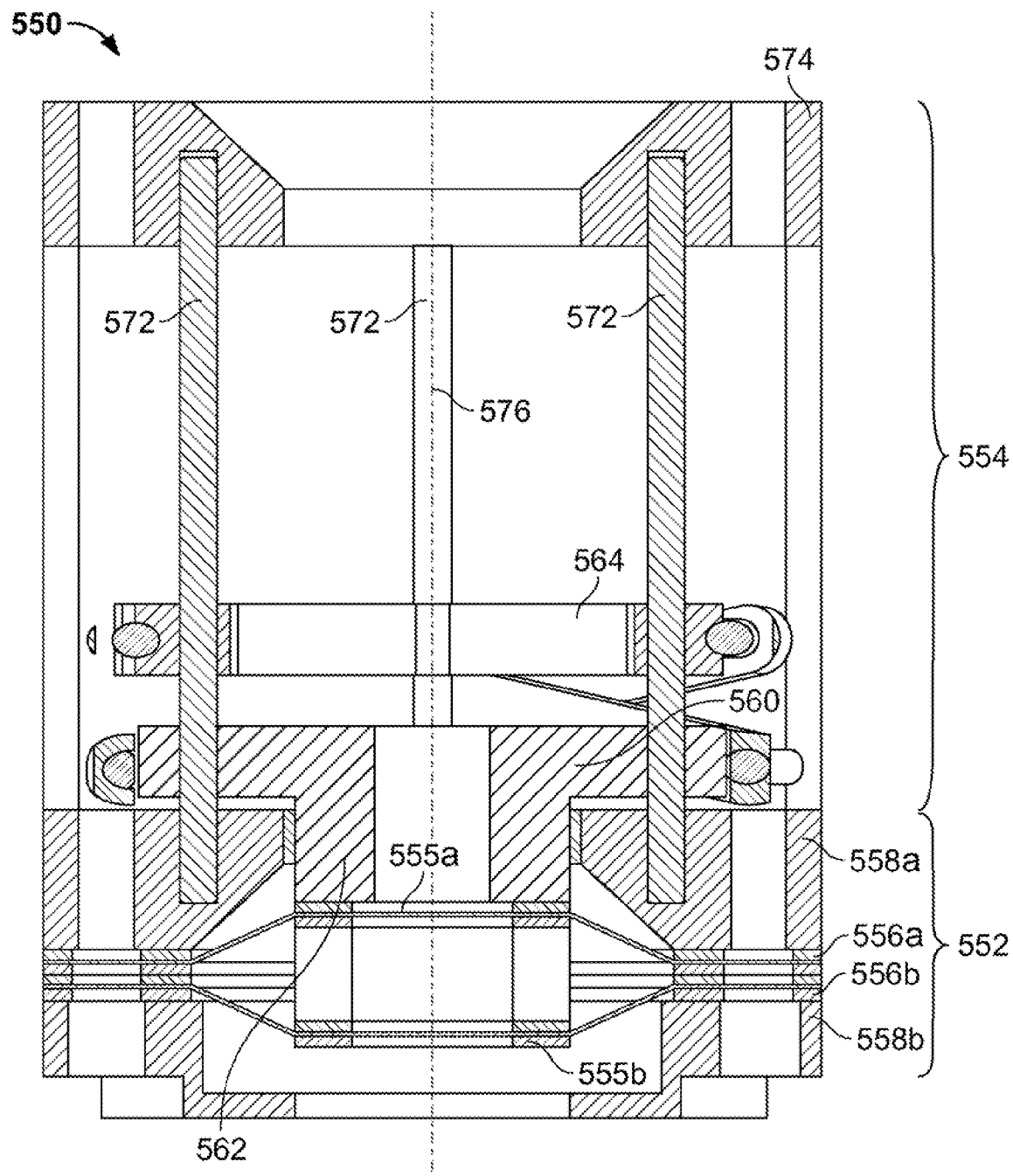

Referring now to FIGS. 20A and 20B, there is illustrated another lens displacement mechanism 550 utilizing EAP-based portion or components 552 in conjunction with a mechanical lens driving portion or components 554, whereby the former is used to drive the latter. EAP portion 552 includes a double-frustum actuator in which the outer frames 556a, 556b are held between bottom housing portions 558a, 558b with inner frames 555a, 555b of the coupled transducers being relatively translatable along the optical axis 576.

As discussed above, the actuator may be configured as either a two-phase actuator which enables active movement in both directions along optical axis 576, or as a single-phase actuator movable in the upward/forward direction along the optical axis.

Mechanical portion 554 of displacement system 550 includes first and second driver plates or platforms 560, 564 interconnected by linkage pairs 566a, 566b and 568a, 568b. Each of the plates has a central opening to hold and carry a lens (not shown) which, collectively, provide an afocal lens assembly which, when moved along the focal axis, adjusts the magnification of the focal lens (not shown), which is centrally-disposed in lens opening 578 within top housing 574. While only two zoom displacement plates are provided, any number of plates and corresponding lenses may be employed.

The linkage pairs provide a scissor jack action to move the second driver plate 564 along the optical axis in response to a force enacted on the first driver plate 560. As understood by those skilled in the art, such a scissor jack action translates the second driver plate 564 at a greater rate than first driver plate 560, where the translation ratio between the first plate and second plate to provide a telescoping effect. Plates 560, 564 are slidably guided along and by linear guide rods 572 which extend between bottom housing portion 558a and top housing 574. Upon activation of actuator portion 552, cap 555a is displaced thereby applying an upward force against the proximal end 562 of driver plate 560. This drives first plate 560 which in turn moves the linkage pairs to drive second plate 564 at a selected greater rate of translation. While scissor jack linkages are illustratively described, other types of linkages or mechanical arrangements maybe used to translate one plate at a proportionately greater translation rate and distance than the other plate.

Figure 21:
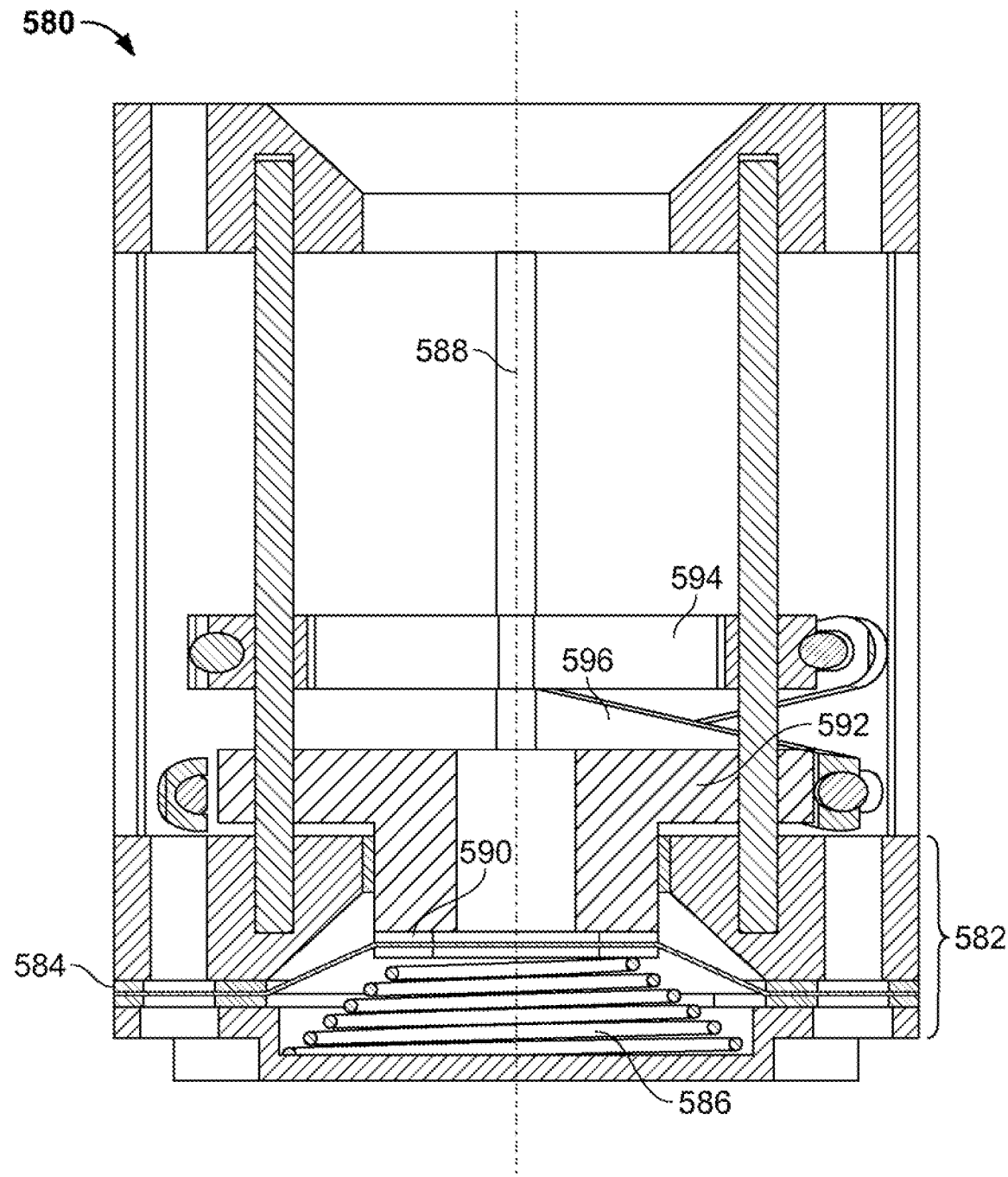
FIG. 21 is a cross-sectional view of another hybrid lens displacement system of the present invention.

FIG. 21 provides a cross-sectional view of another hybrid (actuator-linkage) lens displacement mechanism 580 of the present invention in which the actuator portion 582 includes a single EAP transducer 584 biased upward along the optical axis 588 by a coil spring 586, however, any spring bias means (e.g., leaf spring) may be employed. Upon activation of the actuator, cap 590 moves against first driver plate 592 which drives the linkage mechanism 596 to then move second driver plate 594 upward along optical axis 588.

Referring now to FIGS. 22 and 23, there are illustrated two other lens displacement mechanisms of the present invention which employ a hybrid construct. Both of these mechanisms translate their respective lens assemblies/barrels in an incremental or "inchworm" fashion by use of two types of actuator mechanisms.

Figure 22A:
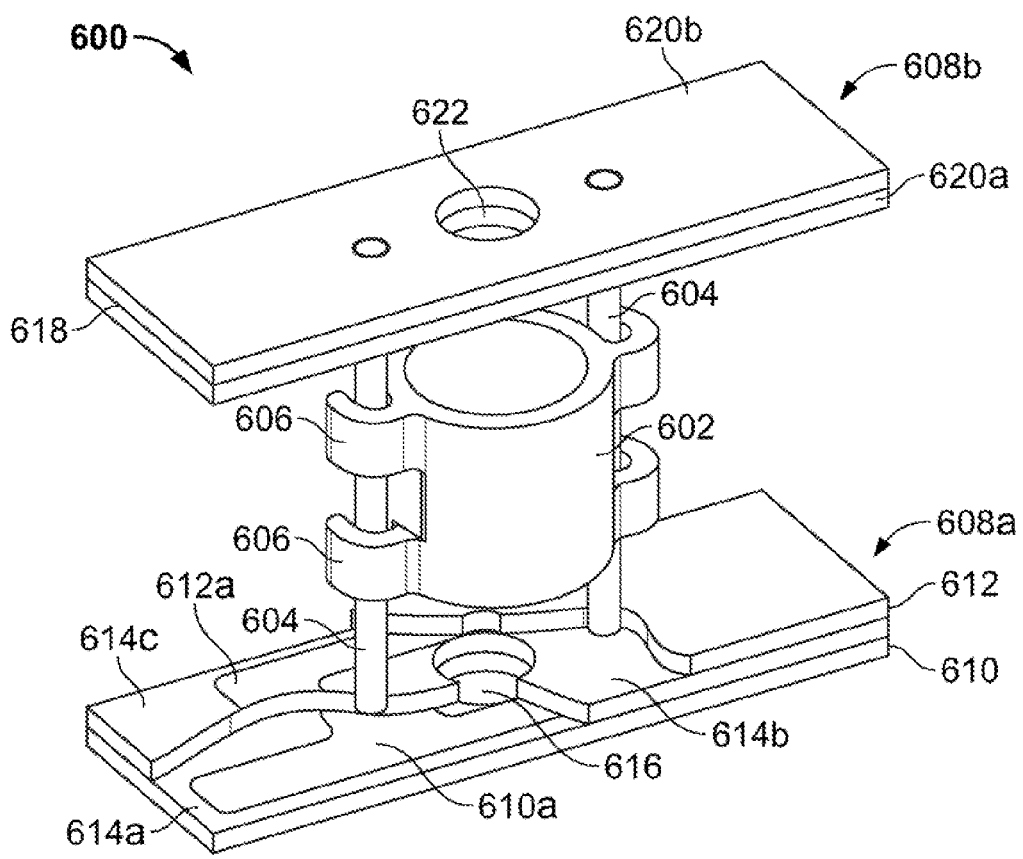
FIGS. 22A and 22B are perspective and cross-sectional views, respectively, of an "inchworm" type of lens displacement mechanism of the present invention.
Figure 22B:
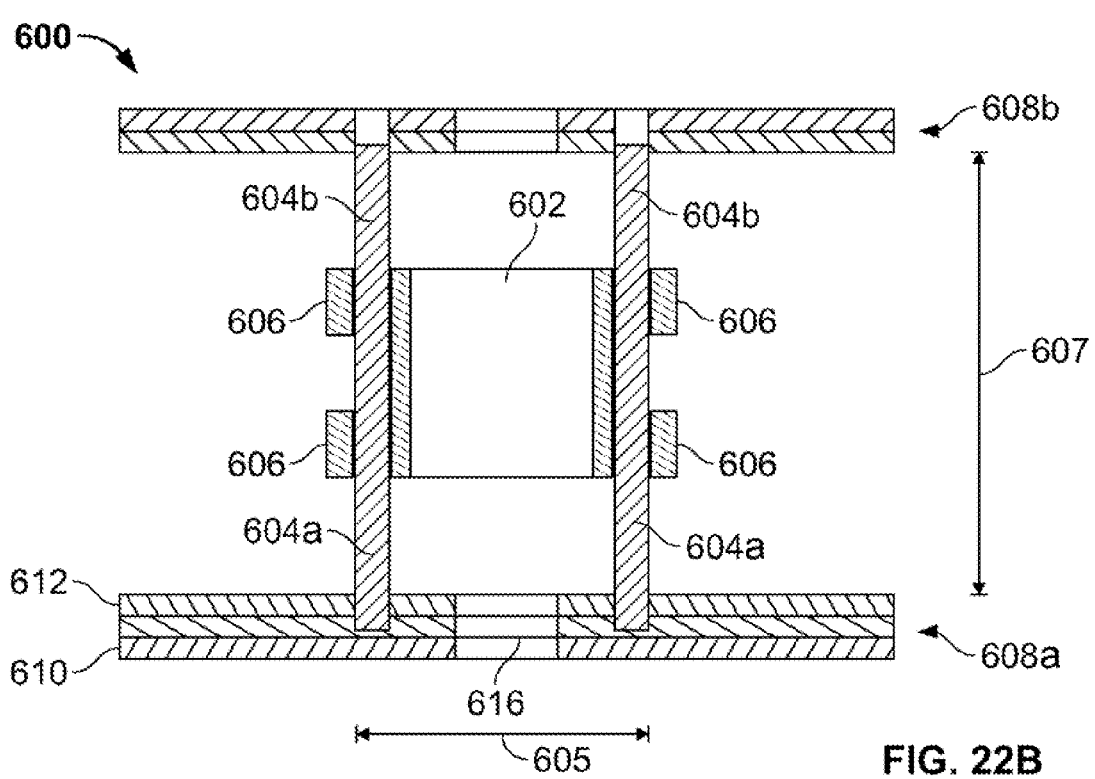

The lens displacement mechanism 600 of FIGS. 22A and 22B employs two types of actuation motion to effect the inchworm displacement of a lens assembly/barrel 602— "thickness mode" actuation and in-plane actuation. The lens barrel 602 holds one or more lenses (not shown) which may form afocal lens assembly for zooming purposes. Barrel 602 has bushings 606 extending laterally from an outer surface. Bushings 606 are frictionally and slidably engaged with guide rails 604 which extend between top and bottom actuation portions 608a, 608b. The actuation components of mechanism 600 include a bottom portion 608a and a top portion 608b. Each actuation portion includes an actuator stack having a thickness mode actuator EAP film 610 and a planar actuator EAP film 612. The films are separated from each other and encapsulated between layers of flexible material 614a-614c, such as a visco-elastic material and preferably with a very low viscosity and durometer rating, to form the actuator stack 608a. FIG. 22A shows the electrode layer patterns 610a and 612a, respectfully, in the cutaway views of actuator stack 608a. A central hole or aperture 616 extends through stack 608a to allow passage of the image focused upon to an image sensor/detector (not shown).

In operation, with the back or bottom ends 604a of the guide rails engaged with film stack 608a (or at least with actuator layers 614b, 614c) at substantially right angles, activation of planar actuator EAP film 612 causes rail ends 604a to move laterally in opposing directions, e.g., apart, from each other in a direction 605 perpendicular to the axial length of guide rails 604. With the front or top ends 604b of the guide rails in a fixed position, this movement causes the guide rails 604 to bear against bearings 606 thereby frictionally securing the position of lens barrel 602 on rails 604. Deactivation of film 612 draws the rails back to their neutral or right angle position with respect to film stack 608a. Thickness mode actuation is then employed to translate guide rails 604 in an axial direction 607 thereby translating lens barrel 602, now frictionally engaged to guide rails 603, in the same direction to adjust the focal length of the lens assembly. More specifically, when EAP film 610 is activated, film stack 608a buckles thereby axially displacing guide rails 604. Upon advancement of lens barrel 602, a frictional bearing surface (not shown) is positioned to engage the outer surface of the barrel whereby this frictional engagement is greater than the frictional engagement imposed by the barrel bushings 606 on rails 604. The frictional engagement of the bearing surface on the walls of the barrel overcomes that of the bushings on the guide rails, such that, when the thickness mode EAP film 610 is deactivated and the guide rails return to the inactive position, the lens barrel is retained in the advanced position. The planar-thickness mode actuation sequence just described may be reversed to translate the lens assembly in the opposite axial direction.

Optionally, a top actuation portion 608b may be employed to adjust the relative position or angle of rails 604 and/or to increase the potential travel distance of lens barrel 602 in either axial direction 607. Actuator 608b, in this example, is constructed to provide planar actuation for adjusting the position of the rails for the purpose of frictionally engaging them against bushings 606. In particular, actuator stack 608a comprises a planar actuation EAP film 618 sandwiched between layers 620a, 620b, which may be made of the same material as layers 614a-614c of bottom actuator 608a. The composite structure has a hole or aperture 622 extending therethrough to allow for the passage of light rays passed through a focusing lens (not shown) to the zoom or afocal lens assembly 602. Preferably, the planar sections of 608a and 608b actuate simultaneously to maintain the guide rods 604 in a parallel relationship with each other.

Top actuator 608b may be employed in lieu of the planar actuation of bottom actuator 608a to provide the angular displacement of the rails as described above, or it may be used in tandem with the planar actuation portion of bottom actuator 608a to laterally displace both ends of the rails. This tandem actuation can be controlled to precisely adjust the angular disposition of the rails or, alternatively, to maintain the rails at right angles with respect to the planar surfaces of the respective actuators (i.e., the rails are maintained parallel to each other) but provide a sufficient lateral displacement (either towards or away from lens barrel 602) to effect frictional bearing against bushings 606. Top actuator 608b may also be equipped with thickness mode actuation capabilities as described above to effect amplified axial movement of the guide rails. While translation of both rails has been described, the present invention also includes variations of lens displacement mechanisms which are configured to move only a single rail or more than two.

Figure 23A:
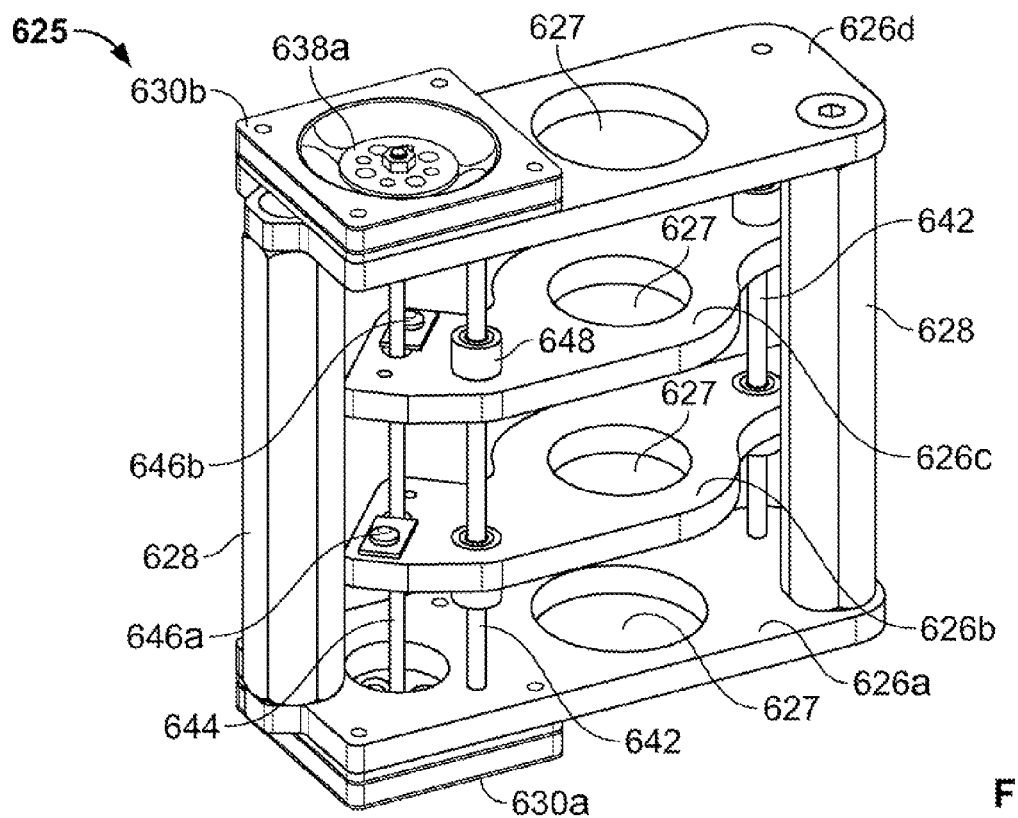
FIGS. 23A and 23B are perspective and cross-sectional views, respectively, of a multi-stage "inchworm" type of lens displacement mechanism of the present invention.
Figure 23B:
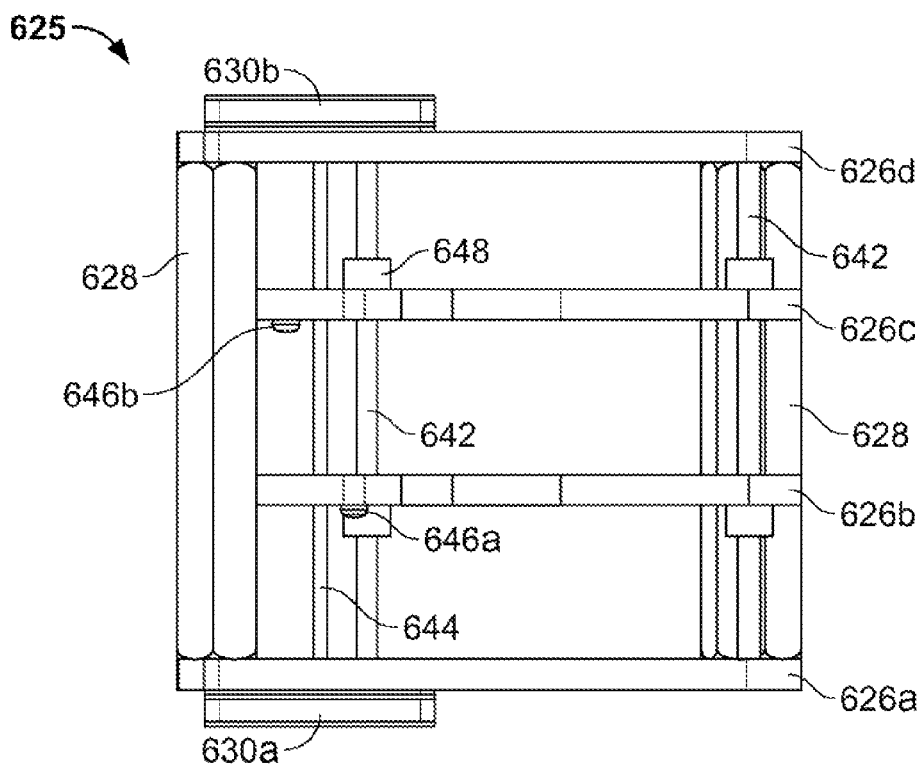

FIGS. 23A and 23B illustrate another lens displacement mechanism 625 that employs an inchworm type of actuation motion. Mechanism 625 houses a lens assembly containing a plurality of lens stages 626a, 626b, 626c, 626d, each having a cutout 627 for retaining a lens (not provided). Those skilled in the art will appreciate that fewer or more stages than the four illustrated may be employed, and that the stages may retain lenses used for focusing, zooming, or merely provide a pass through for light rays. Further, not all stages need to be translatable, and may be fixed to the mechanism housing or struts 628. In the illustrated variation, for example, the first and fourth stages 626a, 626d are fixed, while the second and third stages 626b, 626c are translatable. The four lens stages are held in spaced parallel alignment with each other by linear guide rails 642 which are fixed to and extend between the top to the bottom lens stages 626a, 626d. The movable lens stages 626b, 626c are linearly translatable along the guide rails 642 through bearings 648.

Figures 24A, 24B:
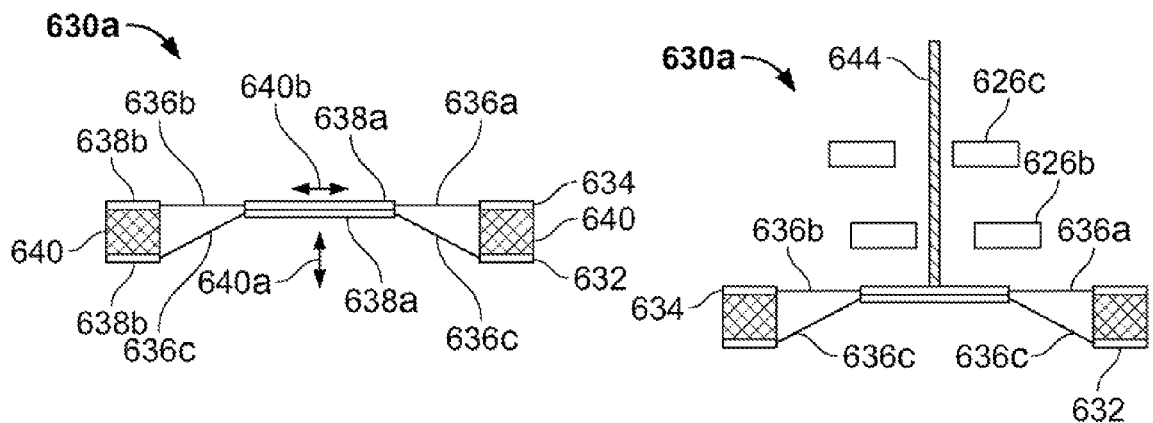
FIG. 24A is a schematic illustration of cross-section of an actuator cartridge of the lens displacement mechanism of FIGS. 23A and 23B.
FIGS. 24B-24F schematically illustrate various positions of the actuator and associated lens guide rail during an actuation cycle.

The actuation portion of the displacement mechanism 625 includes first/top and second/bottom actuator cartridges 630a and 630b. The construct of cartridge 630a is illustrated in FIG. 24A, wherein two actuators are provided—a single-phase linear actuator 632 and two-phase planar actuator 634 stacked in series with each other. Each actuator comprises an EAP film extending between inner and outer members 638a, 638b, whereby the respective inner members 638a are ganged together and the respective outer members 638b are coupled to a spacer 640 positioned therebetween. In the illustrated variation, the EAP film of each planar actuator 634 is divided into at least two separately activateable portions 636a, 636b to provide two-phase (or more) actuation. Each linear actuator 632, in this variation, has a monolithic EAP film 636c which is activateable in whole. The two single-phase linear (from each of the top and bottom cartridges) actuators 632 collectively form a two-phase linear actuator, wherein the bottom linear actuator is biased by the top linear actuator, and visa versa, by means of pushrod 644 which holds the actuators in tension relative to one another. As a result, each planar actuator 634 has no out-of-plane forces applied to it when the corresponding linear actuator 632 is passive. The output motion of inner members 638a (also referred to as actuator output members) of both actuators 632 and 634 may be controlled to exhibit axial motion and/or planar motion, respectively, as indicated by arrows 640a, 640b to provide a desired actuation cycle or sequence. The construct of top cartridge 630b may be identical but oriented to face bottom cartridge 630a such that the concave side of the cartridge faces outward.

A linkage portion in the form of a pushrod 644 extends between the inner facing output members 638a of actuator cartridges 630a, 630b, passing through and slidable within axially-aligned apertures within each of the lens stages. Adjacent the apertures within movable stages 626b and 626c and oppositely or diametrically positioned from each other are clutch or break mechanisms 646a, 646b which are selectively engageable with pushrod 644 to fix the axial position of a respective lens stage. The clutch mechanisms 646a, 646b may have any suitable construct, including but not limited to a frictional bearing surface or a tooth for cooperative engagement with a corresponding groove on pushrod 644.

Figures 24C, 24D:
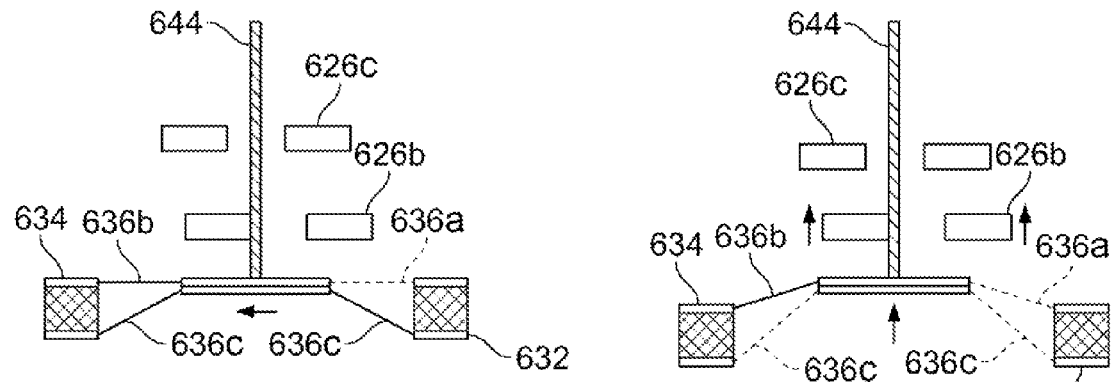
Figures 24E, 24F:
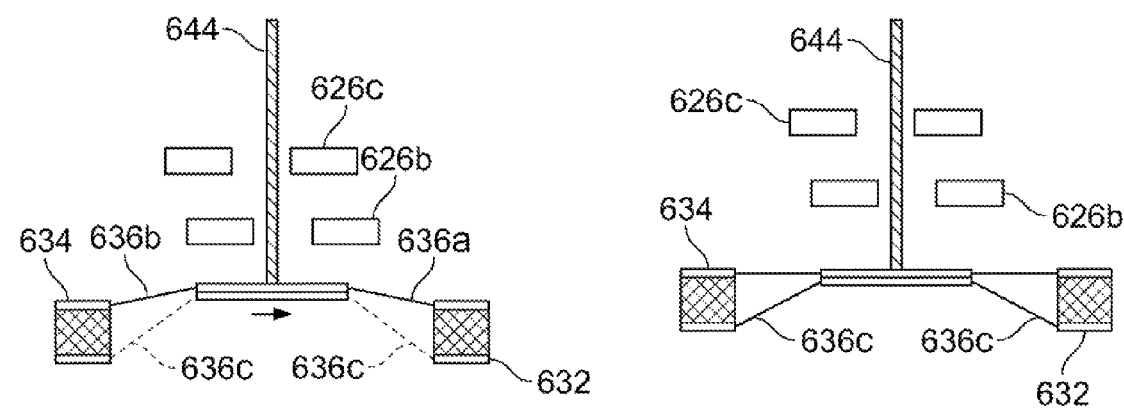

In operation, selective actuation of the linear and planar actuators 632, 634 of the two actuator cartridges 630a, 630b enable the cyclical motion of pushrod 644 to incrementally translate lens stages 626b, 626c. Such incremental or "inchworm" motion is schematically illustrated in FIGS. 24B-24F. FIG. 24B shows guide rail 644 in a neutral position, i.e., not engaged with either lens stage 626b or 636c, when both actuators 632, 634 are inactive. To move lens stage 626b in a forward direction, a first portion 636a of EAP film of each planar actuator 634 (i.e., top and bottom in FIGS. 23A and 23B) is activated, as shown in FIG. 24C, to move pushrod 644 laterally from the neutral position to engage clutch mechanism 646a (not shown in this figure). Next, as illustrated in FIG. 24D, linear actuator 632 is activated while first portion 636a of each planar actuator 634 remains active to move the output members 638a out of plane. This out of plane motion pushes or lifts pushrod 644 and, thus, lens stage 626b in a forward direction. Once moved to the desire axial position, pushrod 644 is disengaged from clutch 646a by deactivating the first EAP portion 636a of each planar actuator 634, as illustrated in FIG. 24E. Finally, each linear actuator 632 is deactivated to retract pushrod 644 to its neutral position, as shown in FIG. 24F. To move lens stage 626c, the process is repeated but with activating the second EAP portion 636b of planar actuator 634 instead of the first EAP portion 636a. Separately activateable phases, i.e., EAP film portions, may be added to each planar actuator 634 along with additional clutch mechanisms to enable the lens displacement mechanism to move both lens stages, or more stages as the case may be, in tandem.

Figure 25A:
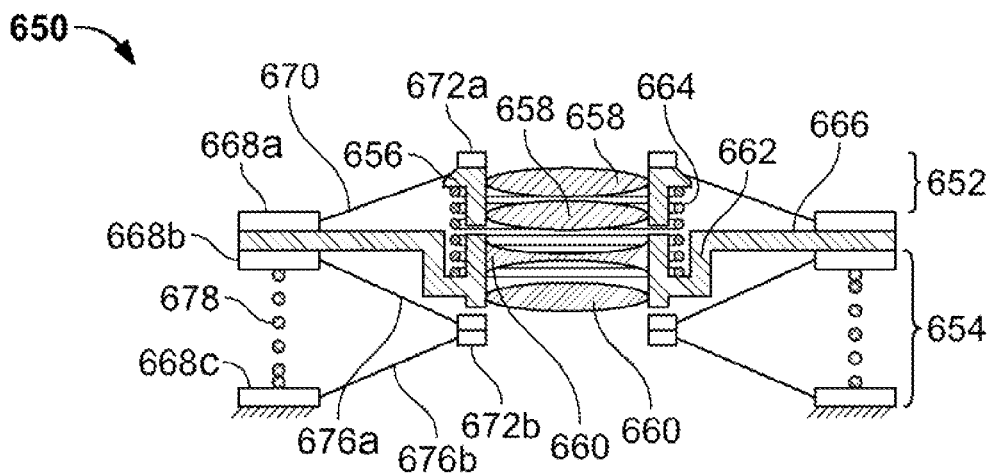
FIGS. 25A-25C are cross-sectional views of a multi-actuator lens displacement system of the present invention.
Figure 25B:
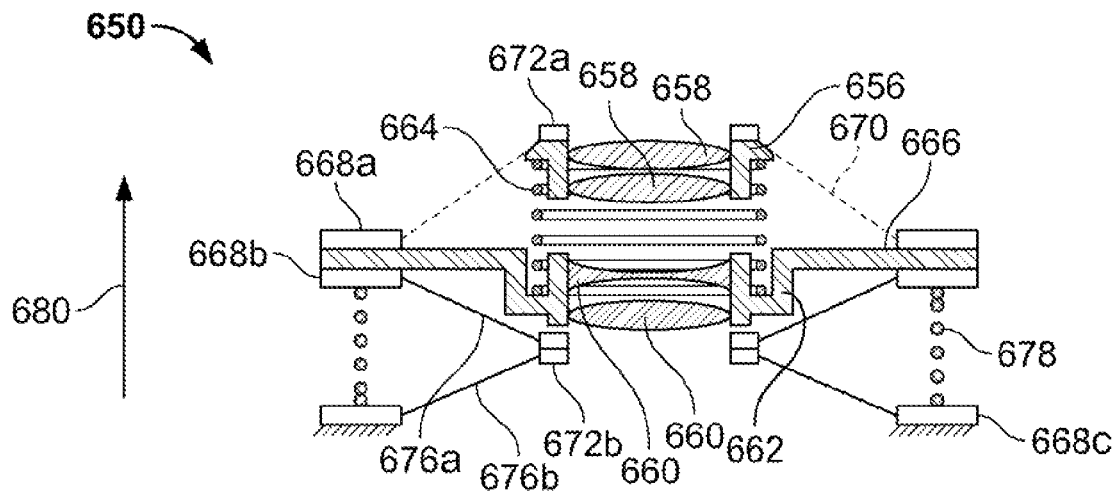
Figure 25C:
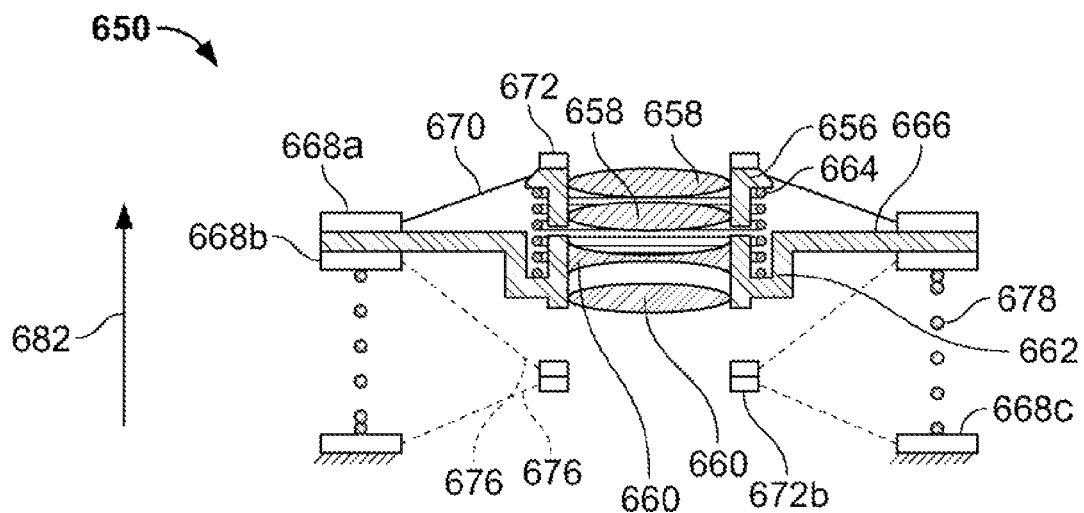

FIGS. 25A-25C illustrate another lens displacement system 650 which has both focusing and zoom capabilities. System 650 includes two integrated single phase, spring biased actuators—one having a single frustum diaphragm configuration 652 and the other a double frustum diaphragm configuration 654. Actuator 652 includes a lens barrel structure 656 housing a focusing lens assembly 658. Proximal to lens assembly 658 along the focal axis of the system is afocal lens assembly 660 housed within a barrel structure 662. The two lens barrels 656, 662 are biased away from each other by coil spring 664. Further integrating the two actuators, is a radially extending lateral structure 666 to which the outer frame or output members 668a, 668b of actuators 652, 654, respectively are coupled. Stretched between outer frame 668a and a corresponding inner frame or output member 672 mounted to the distal end of lens barrel 656 of focusing actuator 652 is EAP film 670. Then, stretched between outer frame 668b and a corresponding inner frame or output member 674 mounted to the proximal end of lens barrel 662 is a first EAP film 676a. A second EAP film 676b is stretched between inner frame 674 and a grounded outer frame or output member 668c to form the double diaphragm structure of zoom actuator 654. A second coil spring 678 biases the coupled outer frames 668a, 668b from grounded outer frame 668c.

As illustrated in FIG. 25A, all phases of the system actuators are passive with focus at the "infinity" position. Focusing the system involves activating EAP film 670 of focus actuator 652, as illustrated in FIG. 25B. The preload placed on lens barrel 656 allows it to advance in the direction of arrow 680 to provide a reduced focal length. The amount of displacement undergone by lens barrel 656 may be controlled by the controlling the amount of voltage applied to actuator 652. Zoom actuation is similar but with the activation of actuator 654, as illustrated in FIG. 25C in which voltage is applied to both EAP films 676a, 676b to advance lens barrel 662 in the direction of arrow 682. As with focusing, the extent of zoom displacement may be controlled by regulating the amount of voltage applied to actuator 654. To obtain magnitudes of greater displacement, additional actuator stages in a series arrangement may be employed. To provide incremental zoom displacement, actuator 654 may be operated in two phases whereby the two diaphragms are activated independently of each other. While the figures show independent operation of the focus (FIG. 25B) and zoom (FIG. 25C) lens assemblies, both may be operated simultaneously or controlled in tandem to provide the desired combination of focus and zoom for a particular lens application.

FIGS. 26A and 26B show another displacement mechanism 690 suitable for lens image stabilization. The actuator mechanism has a multi-phased EAP 696 stretched between an outer frame mount 692 and a central output disc or member 694. The output disc 694 is mounted to a pivot 698 which biases the disc out-of-plane. At rest, as illustrated in FIG. 26A, all phases or portions of multi-phased film are passive and the output disc 694 is horizontal. When a selected portion or portions (out of any number of separately activatable portions) of film 696a is/are activated, the biased film relaxes in the activated area 696a causing asymmetry in the forces on the output platform 694 and causing it to tilt, as shown in FIG. 26B. The various activatable portion can be selectively activated to provide three-dimensional displacement of an image sensor or mirror (not shown but otherwise positioned atop the center disc or output member 694) in response to system shake.

The displacement mechanism of FIGS. 26A and 26B can be further modified to compensate for undesirable z-direction movement undergone by an image sensor. Such a displacement mechanism 700 is illustrated in FIGS. 27A-27C, where instead of pivotally mounting the actuator's output member 704 to ground, a spring biasing mechanism 708 is employed. Also using a multi-phased film 706, when one 706a, or less than all phases are activated, as illustrated in FIG. 27b, the actuator output disc 694 under goes asymmetric tilting and axial translation. Where all of the film portions 706 are activated simultaneously or where some are activated to provide a symmetrical response, output member 704 undergoes a purely linear displacement in the axial direction, as illustrated in FIG. 2C. The magnitude of this linear displacement may be controlled by regulating the voltage applied to all phases or selecting the relative number of film portions that are activated at the same time.

Figures 28, 28A:
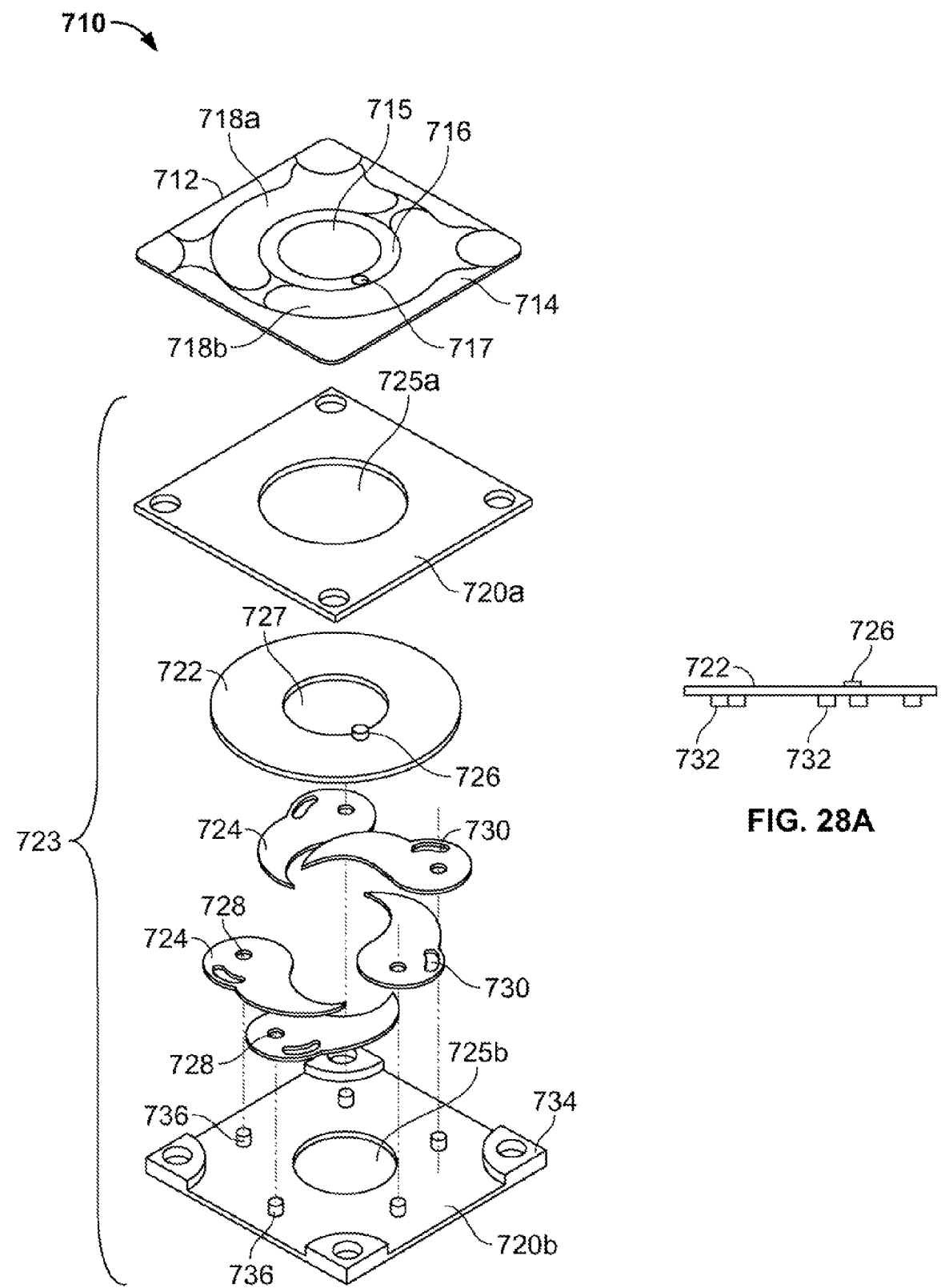
FIG. 28 is an exploded view of an aperture/shutter mechanism of the present invention which is suitable for use with the subject lens systems as well as other known lens systems.
FIG. 28A is a side view of the rotating collar of the shutter/aperture mechanism of FIG. 28.

The present invention also provides shutter/aperture mechanisms for use with imaging/optical systems, such as those disclosed herein, where it is necessary or desirable to close a lens aperture (shutter function) and/or to control the amount of light passing to an optical element or component (aperture function). FIG. 28 illustrates one such shutter/aperture system 710 of the present invention which employs an EAP actuator 712 to actuate a plurality of cooperating plates or blades 724 to adjust the passage of light through imaging pathway. Actuator 712 has a planar configuration having a two-phase EAP film 718a, 718b extending between outer and inner frame members 714, 716, where the inner frame member has an annular opening 715 for passing light. While only two film portions 718a, 718b are employed in the illustrated embodiment, a multiphase film may also be used. The mechanical/moving components of the shutter/aperture are housed within a cartridge 723 having top and bottom plates 720a, 720b, each having respective openings 725a, 725b for passing light therethrough.

Figure 29A:
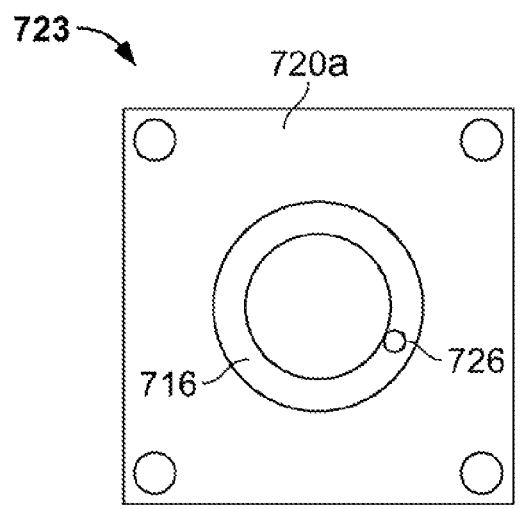
FIGS. 29A-29C show the aperture/shutter mechanism of FIG. 28 in fully opened, partially open and fully closed states respectively.
Figure 29B:
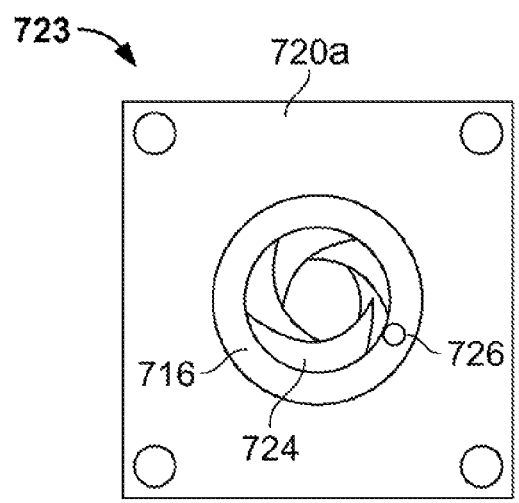
Figure 29C:
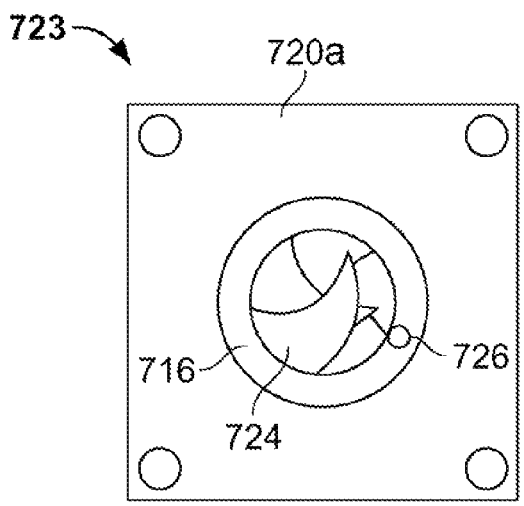

Aperture blades 724 have curved or arched teardrop shapes whereby their annular alignment is held in an overlapping planar arrangement. The blades are pivotally mounted to bottom plate 720 by means of upwardly extending cam pins 736 which correspondingly mate with respective holes extending through the broader ends of blades 724, thereby defining a pivot or fulcrum point about which the blades operatively pivot. The tapered ends of the blades point in the same direction, with their concave edge defining the lens aperture, the opening size of which is variable by selective pivoting of blades 724. Blades 724 each have a cam follower slot 730 through which another set of cam pins 732 extend from the bottom side of a rotating collar 722 positioned on the opposing side of blades 724 (as illustrated in FIG. 28A). Cam follower slots 730 are curved to provide the desired arched travel path by cam pins 732 as collar 722 is rotated, which in turn, pivots curved blades 724 about their fulcrums. A pin 726 extending from the top or actuator-facing side of collar 722 protrudes through opening 725a of top cartridge plate 720a mates with a hole 717 within inner frame member 716 of actuator 712. Selective activation of the actuators two-phase film 718 causes inner actuator frame 716 to move laterally in-plane in opposing directions. The actuator's output motion, through the pulling/pushing of collar pin 726, rotates collar 727 and, thus, cam pins 732 within cam slots 730 within the respective aperture blades 724. This in turn pivots the blades, thereby moving the tapered ends of the blades closer together or farther apart to provide a variable aperture opening, which is best illustrated in top view of cartridge 723 in FIG. 29B. The size of the aperture opening may be varied between fully open (FIG. 29A) and fully closed (FIG. 29C) to operate as a lens shutter.

FIGS. 36A-36D illustrate another aperture/shutter mechanism 840 of the present invention. Mechanism 840 includes a planar base 842 on which an aperture/shutter blade 844 is pivotally mounted at one end to a pivot point 845. Pivotal movement of blade 844 moves its free end in a plane back and forth over light-passing image aperture 854. Movement of blade 844 is accomplished by pivotal movement of a lever arm 846 having a free end movably received within a notch 856 within the interior edge of blade 844. Lever arm 846 is pivotally mounted to base 842 at a pivot point 852a. A flexure 848 integrally coupled or formed as a monolithic piece with lever arm 846 extends between first pivot point 852a and second pivot point 852b. A tab 850 extends from a central point on flexure 848 inward toward aperture 854. The blade, lever arm, and flexure may be adapted to provide aperture 854 in a normally open state or normally closed state.

Figure 36A:
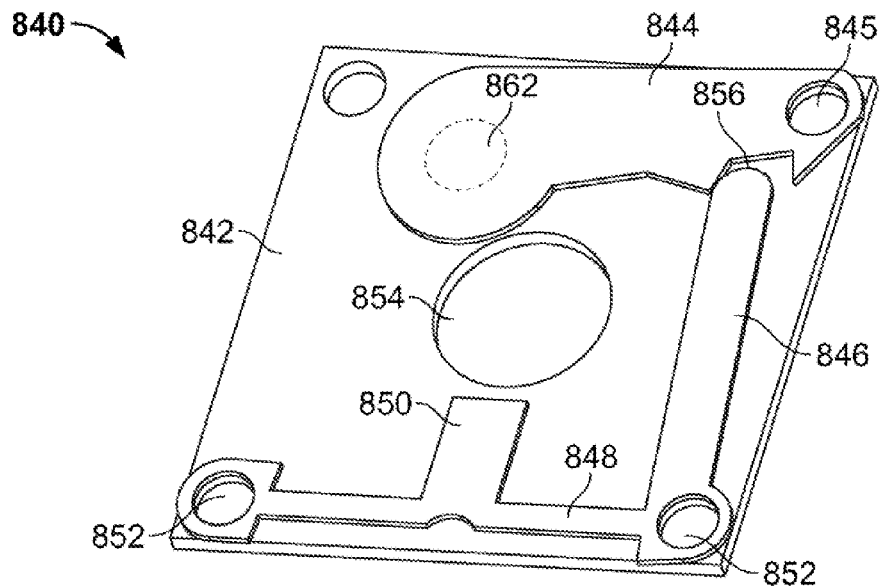
FIG. 36A is a perspective view of another variation the mechanical componentry of a shutter/aperture mechanism of the present invention.
Figure 36B:
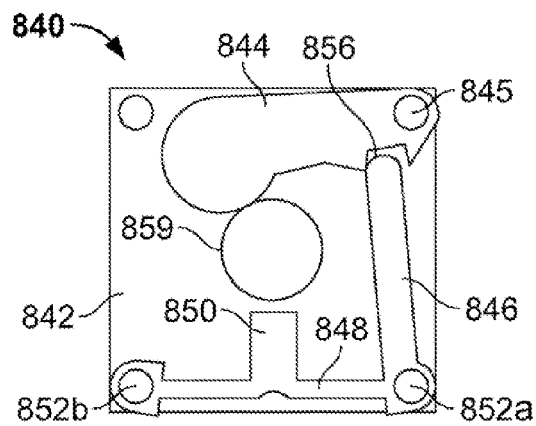
FIGS. 36B and 36C illustrate the shutter/aperture of FIG. 36A in fully open and fully closed states, respectively.
Figure 36C:
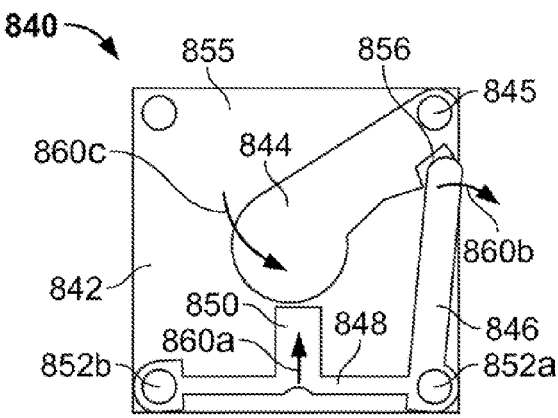
Figure 36D:
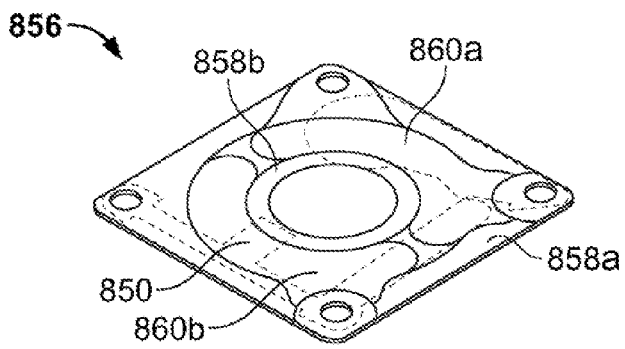
FIG. 36D is a perspective view of the mechanism of FIG. 36A operatively coupled with an EAP actuator of the present invention.

Movement of tab 850 toward aperture 850 in the direction of arrow 860a deflects flexure 848 in the same direction, as illustrated in FIG. 36C. This action, in turn, rotationally pivots lever arm 846 in the direction of arrow 860b, causing the free end of the lever arm to move within notch 856 toward pivot point 845, which in turn causes blade 844 to pivotally rotate in the direction of arrow 860c thereby covering aperture 854. Such actuation is caused by activation of actuator 856 which is mounted or stacked on top of the moving components of mechanism 840, as illustrated in FIG. 36D. Actuator 856 comprises a two-phase EAP film 860a, 860b configuration, similar to that actuator 710 of FIG. 28, extending between outer and inner frame members 858a, 858b, respectively. The free end of tab 850 is mechanically coupled to inner frame member 858b. Based on the orientation of actuator 856 relative to shutter mechanism 840 illustrated in FIG. 36D, activation of EAP section 860a alone pushes tab 850 outward, while activation of EAP section 860b alone pulls tab 850 inward.

As illustrated, mechanism 840 functions primarily as a shutter, with aperture 854 being either open or closed. Providing a hole 862 (shown in phantom in FIG. 36A) within blade 844 which aligns with aperture 854 when blade 844 is in the closed position, and which has a diameter which is smaller than that of aperture 854, enables the mechanism to function as an aperture mechanism with two settings—one with the blade in an open position, thereby letting more light pass through aperture 854 to a lens module, and another with the blade closed over aperture 854, thereby passing light through smaller hole 862.

Figure 30A:
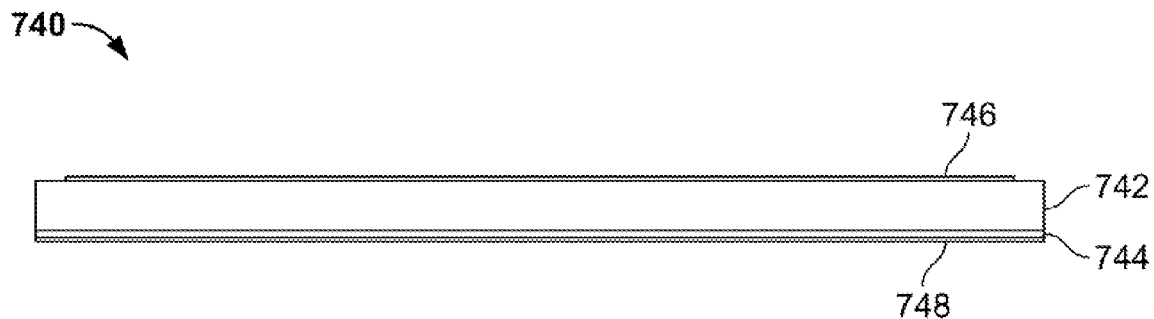
FIGS. 30A and 30B are cross-sectional views of a unimorph actuator film for use in the lens displacement mechanisms of the present invention.
Figure 30B:
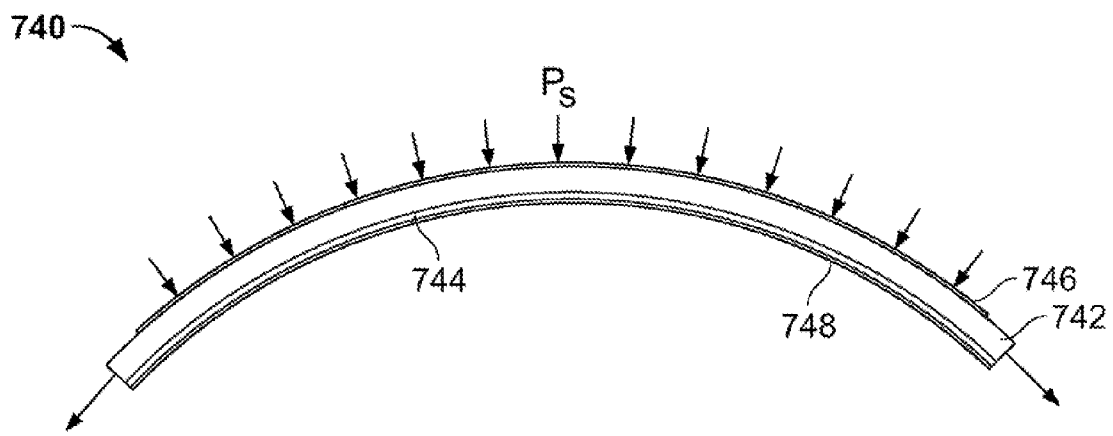

Other lens displacement mechanisms may impart movement to a lens or lens stack by use of an actuator employing a "unimorph" film structure or composite. FIGS. 30A and 30B show a cross-section of a segment of such a film structure 740. Film structure comprises an elastomeric dielectric film 742 bonded to a film backing or substrate 744 which is relatively stiffer, i.e., has a higher elastic modulus, than dielectric film 742. These layers are sandwiched between a flexible electrode 746 on the exposed side of dielectric film 742 and a stiffer electrode 748 either on the inner or exposed side of stiff film backing 744. As such, the composite structure 740 is "biased" to deflect in only one direction. In particular, when the film structure 740 is activated, as illustrated in FIG. 30B, dielectric film 742 is compressed and displaced laterally, causing the structure to bow or arch in a direction away from substrate 744. The biasing imposed on the structure may be effected in any known manner, including those generally described in International Publication No. WO98/35529. Several lens displacement mechanisms of the present invention employing such a unimorph type EAP actuator are now described.

Figure 31A:
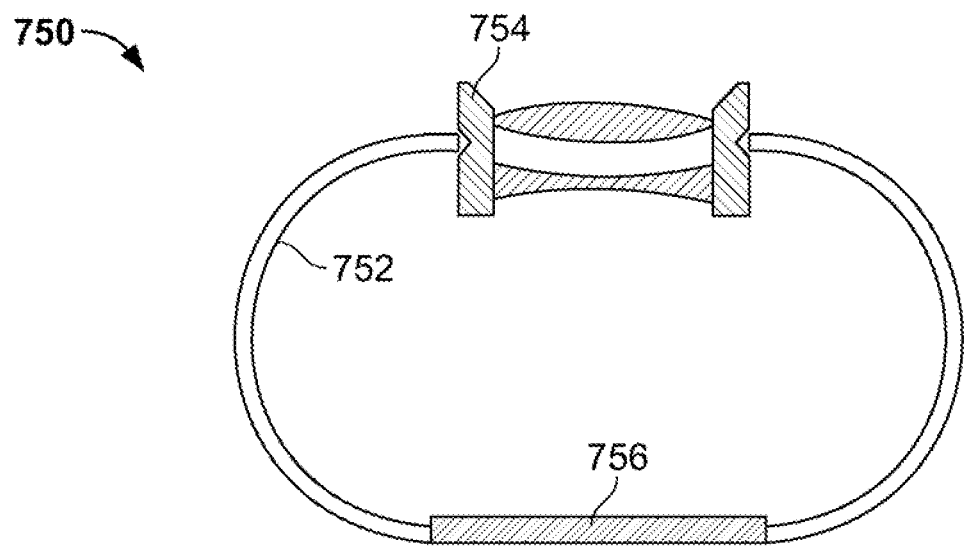
FIGS. 31A and 31B illustrate side views of another lens displacement mechanism of the present invention in inactive and active states, respectively, employing the unimorph actuator film of FIGS. 30A and 30B.
Figure 31B:
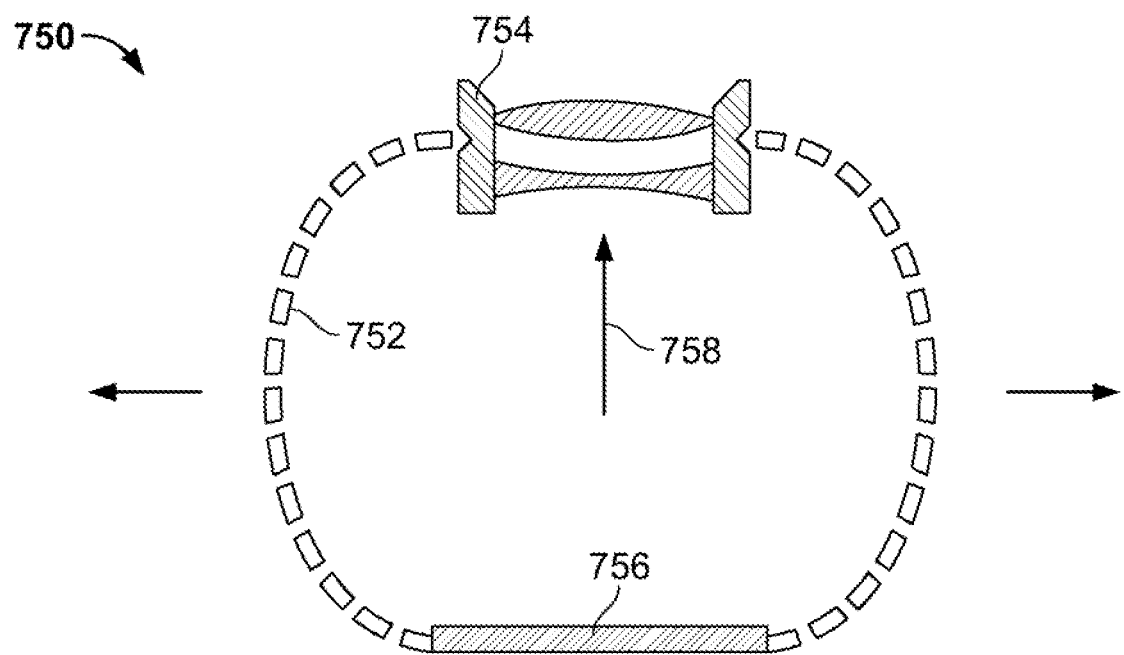

Lens displacement system 750 of FIGS. 31A and 31B includes a lens barrel or assembly 754 coupled to an actuator mechanism which utilizes a unimorph EAP film structure 752. A selected area or length of the film structure 752 extends between the lens barrel 754 and a fixed base member 756. The film structure may be a monolithic piece which surrounds the lens barrel like a skirt, which may comprise a single phase structure or multiple addressable areas to provide multi-phase action. Alternatively, the actuator may comprise multiple discrete segments of film which may be configured to be collectively or independently addressable. In either variation, the stiffer film side or layer (i.e., substrate side) faces inward such that the film is biased outward. Upon activation of the film, as illustrated in FIG. 31B, the film expands in the biased direction causing the film to extend away from its fixed side, i.e., away from base member 756, thereby moving lens barrel 754 in the direction of arrow 758. Various parameters of the film composite, e.g., film area/length, variance elasticity between EAP layer and substrate layer, etc., may be adjusted to provide the desired amount of displacement to effect auto focus and/or zoom operation of the lens system.

Figure 32A:
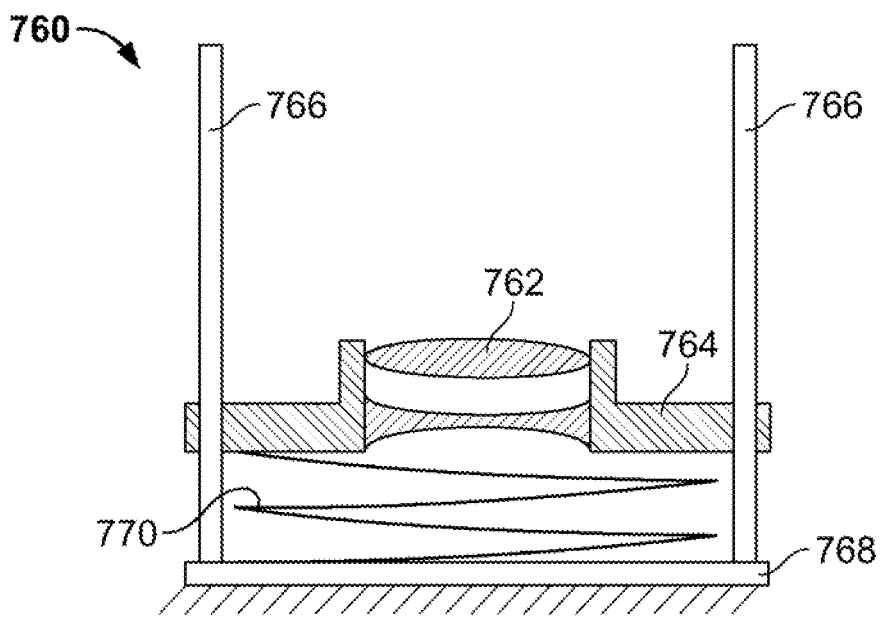
FIGS. 32A and 32B illustrate side views of another lens displacement mechanism of the present invention which employs a unimorph actuator.
Figure 32B:
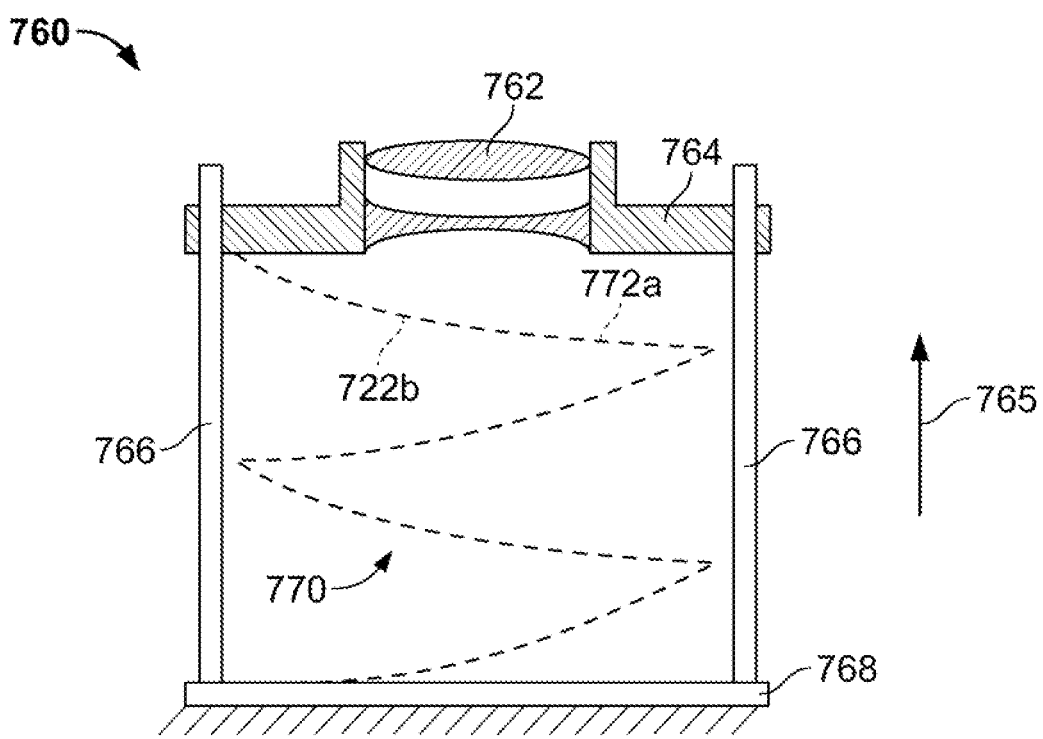

Lens displacement mechanism 760 of FIGS. 32A and 32B also employs a unimorph film actuator. System 760 includes a lens barrel or assembly 762 mounted to lens carriage 764 which rides on guide rails 766. Actuator 770 comprises folded or stacked unimorph film sheets coupled together in series fashion. In the illustrated embodiment, each unimorph sheet is constructed with the more flexible side 772a facing the lens barrel and the stiffer side 772b facing away from the lens barrel, but the reverse orientation may be employed as well. When all of the actuator sheets are inactive, the stack is at its most compressed to position, i.e., lens barrel 762 is in the most proximal position, as illustrated in FIG. 32A. In the context of a focusing lens assembly, this position provides the greatest focal length whereas, in the context of an afocal lens assembly, the zoom lens is in the macro position. Activation of one or more sheets 772, either collectively or independently, displaces lens barrel 762 in the direction of arrow 765 to adjust the focus and/or magnification of the lens system.

Under certain environmental conditions, such as in high humidity and extreme temperature environments, the performance of an EAP actuator may be affected. The present invention addresses such ambient conditions with the incorporation of a feature which may be integrated into the EAP actuator itself or otherwise constructed within the system without increasing the system's space requirements. In certain variations, the EAP actuators are configured with a heating element to generate heat as necessary to maintain or control the humidity and/or temperature of the EAP actuator and/or the immediately surrounding ambient environment. The heating element(s) are resistive, having a conductor either integrated into or adjacent to the EAP film, where the voltage across the conductor is lower than that required for activation of the actuator. Employing the same EAP actuator used for lens displacement and/or image stabilization to control ambient parameters of the system further reduces the number of components in the system and its overall mass and weight.

Figure 33A:
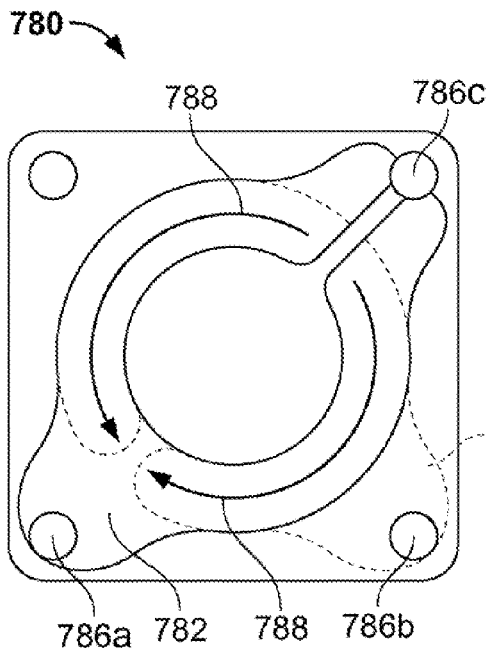
FIGS. 33A and 33B illustrate the use of EAP actuator having features which function to address certain conditions, e.g., humidity, of the ambient environment in which the lens system is operated in order to optimize performance.

FIG. 33A illustrates an exemplary EAP actuator 780 usable with the lens/optical systems of the present invention employing a series electrode arrangement for the heating function. The view shows the ground side of the actuator with ground electrode pattern 782 and the high voltage electrode pattern 784 on the other side of actuator 780 shown in phantom. Lugs 786a and 786b establish electrical connections, respectively, to the ground and high voltage inputs from the system's power supply (not shown) for operating the actuator. A third lug or connector 786c provides connection to a low voltage input from the power supply for the series resistive heater current path. Arrows 788 show the annular current path provided by the electrode arrangement which uses the entire ground electrode 782 as a resistive heating element.

Figure 33B:
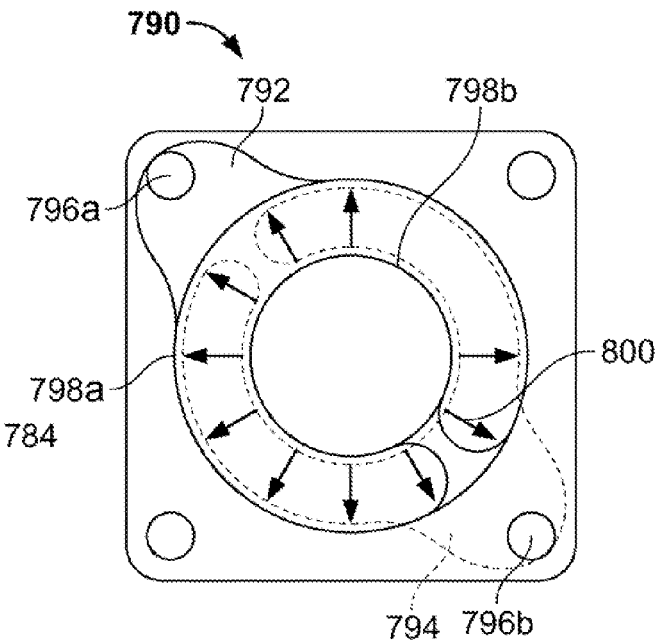

FIG. 33B illustrates another EAP actuator 790 which employs a parallel electrode arrangement for the heating function. This view shows the ground side of the actuator with ground electrode pattern 792 with the high voltage electrode pattern 784 shown in phantom from the other side of actuator 790. Lugs 796a and 796b establish electrical connections, respectively, to the ground and high voltage inputs from the system's power supply (not shown) for operating the actuator. Parallel bus bars 798a, 798b are provided on the ground side of actuator 790 for connection to the ground and low voltage inputs, respectively, from the power supply (not shown). Arrows 800 illustrate the radial path of the current established by the parallel electrode arrangement. Using the electrode in a parallel as opposed to series fashion allows for the use of a lower voltage to achieve the current flow necessary to induce heating of the film.

Figure 34:
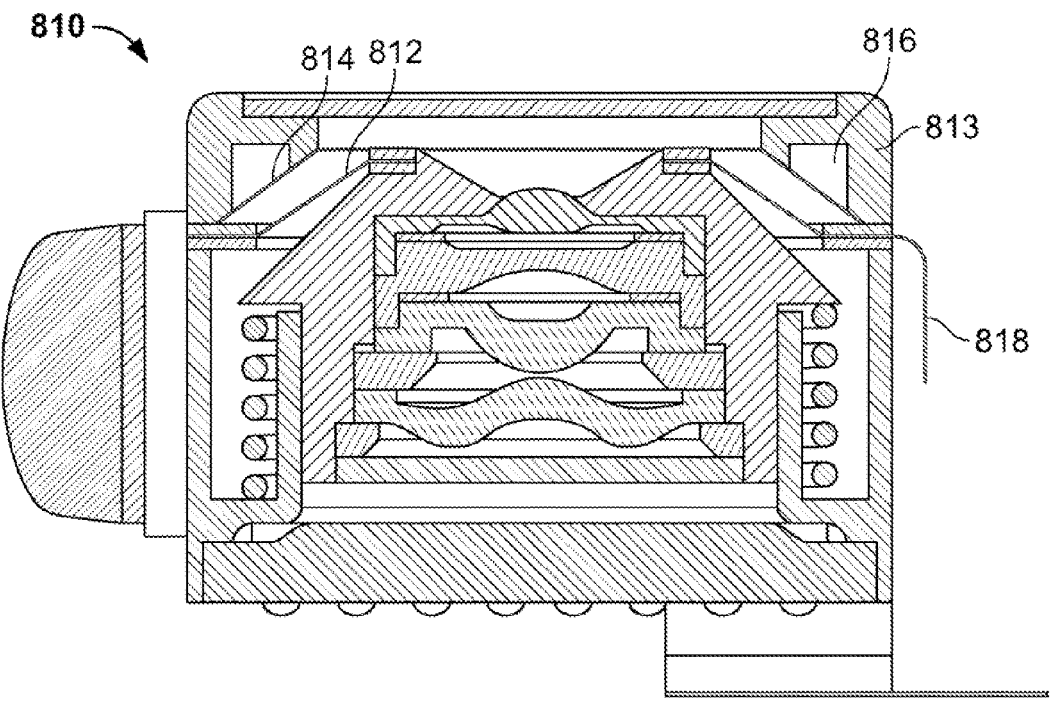
FIG. 34 shows a cross-sectional view of a lens displacement system of the present invention employing another configuration for addressing ambient conditions.
Figures 34A, 34B:
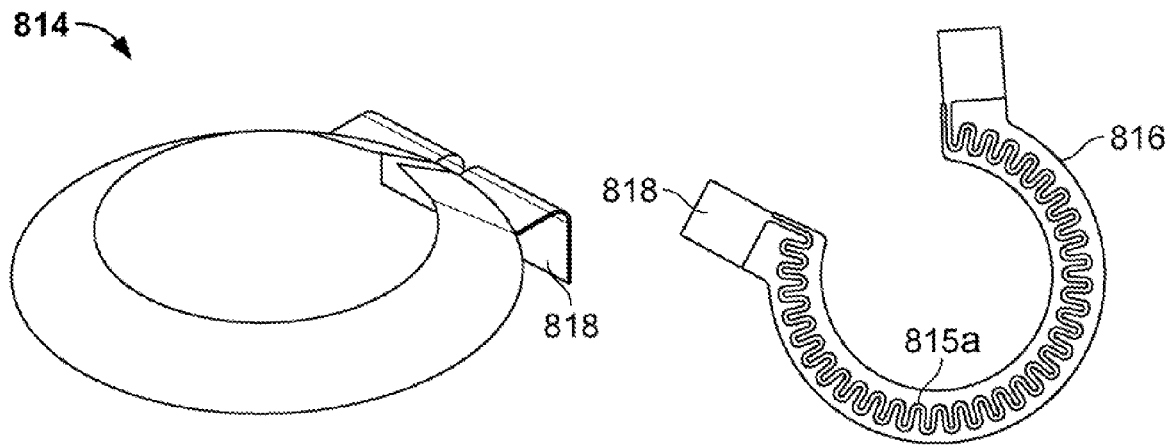
FIGS. 34A and 34B are perspective and top views of a the ambient condition control mechanism of the system of FIG. 34.

As mentioned above, another approach to system humidity and temperature control is the use of a resistive heating element positioned adjacent the EAP actuator. FIG. 34 illustrates a lens displacement mechanism 810 employing EAP actuator having EAP film 812. The spacing 816 defined between the top housing/cover 813 and EAP film 812 provides sufficient space in which to position a heating element 814. Preferably, the heating element has a profile and size that matches that of the EAP film—in this case, a frustum shape as illustrated in FIG. 34A, in order to minimize spacing requirements of the system and to maximize heat transfer between the heating element 814 and EAP film 812. The heating element includes a resistive trace 815a on an insulating substrate 815b and electrical contacts 818 to electrically couple the heating element to the system's power and sensing electronics.

Figure 35:
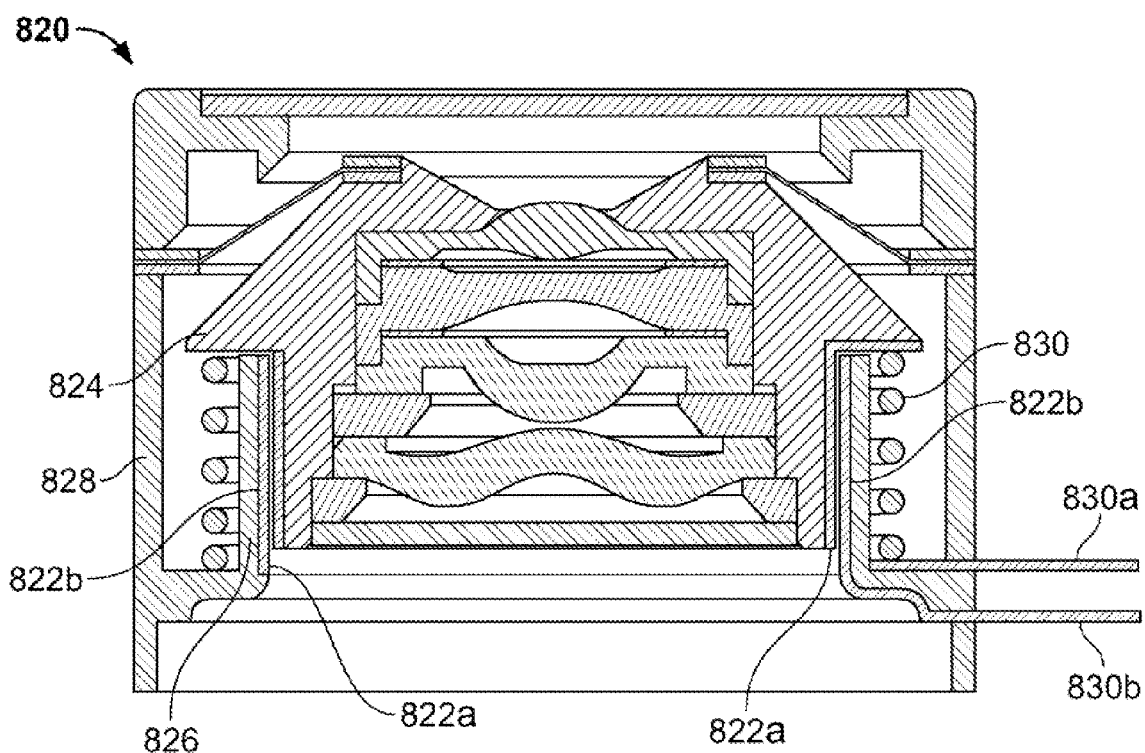
FIG. 35 shows a cross-sectional view of another lens displacement system of the present invention having a lens position sensor.

Another optional feature of the lens displacement systems of the present invention is the provision of a sensor to sense the position of a lens or lens assembly which provides closed loop control of the lens displacement. FIG. 35 illustrates an exemplary embodiment of such a position sensing arrangement incorporated into the lens displacement systems 820, having a similar construct to the lens displacement system of FIG. 7A. The sensing arrangement comprises a nested electrode pair having cylindrical configurations. One electrode 822a, e.g., the ground side electrode, encircles an exterior portion of lens barrel 824. Ground electrode 822a is electrically coupled to ground lead 830a through actuator biasing spring 830. The other electrode 822b, e.g., the active or power/sensing electrode 822b, encircles the interior surface of a bushing wall 826 extends upwards from the back end of housing 828 and is seated between actuator biasing spring 830 and the outer surface of lens barrel 824. Electrode 822b is electrically coupled to power/sensing lead 830b. An insulating material adhered to the active electrode 822b may be provided in the gap defined between the two electrodes to provide a capacitive structure. With the position of the lens barrel as illustrated, the capacitance across the electrodes is at its greatest. As lens barrel 824 is displaced in the distal direction, the overlapping surface areas of the electrodes decreases, in turn reducing the capacitive charge between them. This change in capacitance is fed back to the system's control electronics (not shown) for closed loop control of the lens position.

By use of the EAP actuators for auto-focusing, zoom, image stabilization and/or shutter control, the subject optical lens systems have minimized space and power requirements and, as such, are ideal for use in highly compact optical systems such as cell phone cameras.

Methods of the present invention associated with the subject optical systems, devices, components and elements are contemplated. For example, such methods may include selectively focusing a lens on an image, selectively magnifying an image using a lens assembly, and/or selectively moving an image sensor to compensate for unwanted shake undergone by a lens or lens assembly. The methods may comprise the act of providing a suitable device or system in which the subject inventions are employed, which provision may be performed by the end user. In other words, the "providing" (e.g., a lens, actuator, etc.) merely requires the end user obtain, access, approach, position, set-up, activate, power-up or otherwise act to provide the requisite device in the subject method. The subject methods may include each of the mechanical activities associated with use of the devices described as well as electrical activity. As such, methodology implicit to the use of the devices described forms part of the invention. Further, electrical hardware and/or software control and power supplies adapted to effect the methods form part of the present invention.

Yet another aspect of the invention includes kits having any combination of devices described herein—whether provided in packaged combination or assembled by a technician for operating use, instructions for use, etc. A kit may include any number of optical systems according to the present invention. A kit may include various other components for use with the optical systems including mechanical or electrical connectors, power supplies, etc. The subject kits may also include written instructions for use of the devices or their assembly. Such instructions may be printed on a substrate, such as paper or plastic, etc. As such, the instructions may be present in the kits as a package insert, in the labeling of the container of the kit or components thereof (i.e., associated with the packaging or sub-packaging) etc. In other embodiments, the instructions are present as an electronic storage data file present on a suitable computer readable storage medium, e.g., CD-ROM, diskette, etc. In yet other embodiments, the actual instructions are not present in the kit, but means for obtaining the instructions from a remote source, e.g. via the Internet, are provided. An example of this embodiment is a kit that includes a web address where the instructions can be viewed and/or from which the instructions can be downloaded. As with the instructions, this means for obtaining the instructions is recorded on suitable media.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth n the claims. Stated otherwise, unless specifically defined herein, all technical and scientific terms used herein are to be given as broad a commonly understood meaning as possible while maintaining claim validity.

In all, the breadth of the present invention is not to be limited by the examples provided. That being said, we claim:

1. A device for use with an optical system, the device comprising:

at least one pivotally mounted aperture blade; and an electroactive polymer actuator having a frame member that is configured to move at least laterally in-plane and in opposing directions, the actuator positioned adjacent the aperture blade, wherein activation of the actuator moves the frame member causing movement of the aperture blades to adjust the passage of light through a lens aperture.

2. The device of claim 1, comprising a plurality of cooperating aperture blades provided in a planar arrangement.

3. The device of claim 2, wherein each aperture blade has a curved teardrop shape, and wherein the blades are annularly aligned with adjacent blades having at least a portion which overlap each other.

4. The device of claim 3, wherein the actuator comprises a two-phase planar film extending between outer and inner frame members wherein the inner frame member has an annular opening for passing light to the lens aperture, and further wherein activation of one phase pivotally moves the blades in one direction and activation of the other phase pivotally moves the blades in the opposite direction.

5. The device of claim 1, further comprising a flexure mechanism cooperating with a pivot end of the aperture blade wherein, upon activation, the electroactive polymer actuator deflects a portion of the flexure mechanism which pivotally rotates the aperture blade.

6. The device of claim 1, wherein a free end of the aperture blade has a light-passing hole therethrough.

* * * * *